(12) United States Patent  
Kodama et al.

(10) Patent No.: US 7,907,801 B2  
(45) Date of Patent: Mar. 15, 2011

(54) OPTICAL ELEMENT, PACKAGE SUBSTRATE AND DEVICE FOR OPTICAL COMMUNICATION

(75) Inventors: Hiroaki Kodama, Ibi-gun (JP); Motoo Asai, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 132 days.

(21) Appl. No.: 11/623,923

(22) Filed: Jan. 17, 2007

(65) Prior Publication Data

US 2008/0170819 A1    Jul. 17, 2008

(51) Int. Cl.  
*G02B 6/12* (2006.01)

(52) U.S. Cl. ............ 385/14; 382/129; 382/131; 382/132

(58) Field of Classification Search .................. None  
See application file for complete search history.

(56) References Cited

U.S. PATENT DOCUMENTS

| | | | |
|---|---|---|---|
| 4,194,807 A * | 3/1980 | Gliemeroth | 385/124 |
| 4,733,127 A * | 3/1988 | Takasu et al. | 313/500 |
| 5,125,946 A * | 6/1992 | Bhagavatula | 65/106 |
| 5,925,898 A * | 7/1999 | Spath | 257/98 |
| 6,091,874 A * | 7/2000 | Higashi et al. | 385/130 |
| 6,343,171 B1 * | 1/2002 | Yoshimura et al. | 385/50 |
| 6,477,284 B1 * | 11/2002 | Oda et al. | 385/14 |
| 6,516,104 B1 * | 2/2003 | Furuyama | 385/14 |
| 7,070,207 B2 | 7/2006 | Asai | |
| 7,103,249 B2 * | 9/2006 | Miyamae | 385/49 |
| 7,406,244 B2 * | 7/2008 | DeLuca | 385/140 |
| 2004/0212030 A1 * | 10/2004 | Asai | 257/432 |
| 2005/0063635 A1 * | 3/2005 | Yamada et al. | 385/14 |
| 2005/0118740 A1 * | 6/2005 | Ishikawa | 438/31 |
| 2005/0185880 A1 | 8/2005 | Asai | |
| 2006/0012967 A1 | 1/2006 | Asai et al. | |
| 2006/0263003 A1 | 11/2006 | Asai et al. | |

FOREIGN PATENT DOCUMENTS

| | | |
|---|---|---|
| JP | 2001-15794 | 1/2001 |
| JP | 2002-344002 | 11/2002 |
| JP | 2004-4427 | 1/2004 |
| JP | 2006-19526 | 1/2006 |

OTHER PUBLICATIONS

U.S. Appl. No. 11/696,436, filed Apr. 4, 2007, Kodama, et al.  
U.S. Appl. No. 11/693,188, filed Mar. 29, 2007, Kodama, et al.  
U.S. Appl. No. 11/696,434, filed Apr. 4, 2007, Kodama, et al.  
U.S. Appl. No. 11/733,361, filed Apr. 10, 2007, Asai, et al.  
U.S. Appl. No. 11/737,792, filed Apr. 20, 2007, Asai, et al.  
U.S. Appl. No. 11/750,625, filed May 18, 2007, Yamada, et al.  
U.S. Appl. No. 11/763,670, filed Jun. 15, 2007, Kodama, et al.

* cited by examiner

*Primary Examiner* — Uyen-Chau N Le  
*Assistant Examiner* — Chad H Smith  
(74) *Attorney, Agent, or Firm* — Oblon, Spivak, McClelland, Maier & Neustadt, L.L.P.

(57) ABSTRACT

An optical element of the present invention comprises: one or a plurality of unit elements having a plurality of external electrodes formed on one main surface thereof, wherein upon taking the one main surface of the unit elements in a plan view, the plurality of external electrodes are locally formed in a first region of two regions of a planar shape of the main surface, the two region formed by equally dividing the planar shape with a center line.

33 Claims, 21 Drawing Sheets

OPTICAL ELEMENT, PACKAGE SUBSTRATE AND DEVICE FOR OPTICAL COMMUNICATION

BACKGROUND OF THE INVENTION

1. Field of the Invention

The present invention relates to an optical element, a package substrate and a device for optical communication.

2. Discussion of the Background

In recent years, optical fibers have been drawing attention mainly in the telecommunications field. In particular, in the field of IT (information technology), communication technology using optical fibers has been necessary for the development of high-speed Internet networks.

Then, it has been proposed for such network communication, including the Internet, that optical communication using optical fibers be used for communication between a basic network and terminal devices (personal computers, mobile devices, games and the like) and communication between terminal devices, in addition to communication in a basic network.

As a device for optical communication usable in a terminal devices for an optical transmitter and receiver system of this kind, the present inventors have previously proposed a device for optical communication comprising a package substrate in which an optical path for transmitting an optical signal is formed and an optical element is mounted on one side thereof, and a multilayer printed circuit board having at least an optical waveguide formed thereon (for example, see JP-A 2004-004427).

As an optical element mounted on the device for optical communication of this kind, a light receiving element and a light emitting element have been used.

With regard to the light receiving element, as shown in FIG. 1, a light receiving element 1, in which a light entering portion 2 is provided in the vicinity of the center of one of the main surfaces having a rectangular shape, an n-side electrode 3 is formed at the neighborhood of one side of the main surface, and at the neighborhood of a side on the opposite of the side where the n-side electrode is formed, a connection pad 5 for connection to a p-side electrode 4 is formed, has been disclosed (for example, see JP-A 2002-344002).

That is, in the light receiving element 1, upon taking the one main surface in a plan view, two external electrodes, i.e. an n-side electrode and a p-side electrode are formed in such a manner that the n-side electrode is formed in a first region of two regions formed by equally dividing the planar surface with a center line X, and two of the p-side electrodes are formed in a second region on the other side.

The contents of JP-A 2004-004427 and JP-A 2002-344002 are incorporated herein by reference in their entirety.

SUMMARY OF THE INVENTION

An optical element of the present invention comprises one or a plurality of unit elements each having a plurality of external electrodes formed on one main surface thereof, and in this structure, upon taking the one main surface of the unit elements in a plan view, the plurality of external electrodes are locally formed in a first region of two regions of a planar shape of the main surface, the two regions formed by equally dividing the planar shape with a center line.

The optical element is desirably a multi-channel optical element comprising a plurality of unit elements.

In the optical element, desirably, a level maintaining member is formed in a second region of the two regions divided by the center line from the first region having the external electrodes formed thereon.

Here, the level maintaining member is desirably a spacer which has been processed into a sheet or desirably an adhesive agent.

In the optical element, desirably, dummy electrodes are formed in a second region of the two regions divided by the center line from the first region having the external electrodes formed thereon.

Here, bumps of the same height are desirably formed on each of the external electrodes and the dummy electrodes, and the bumps are desirably Au stud bumps, solder bumps, or metal bumps comprising Au, Ni or Cu.

Moreover, desirably, a plurality of dummy electrodes are formed in the second region, and the external electrodes and the dummy electrodes are formed at positions symmetrical to each other with respect to the center line.

Furthermore, desirably, the external electrodes and the dummy electrodes have the same size and the same shape, and are formed by using the same materials.

In the optical element, the diameter of each of the external electrodes is desirably at least about 50 µm and at most about 100 µm.

Moreover, in the optical element, desirably a light receiving portion or a light emitting portion is formed in the vicinity of the center in a plan view of the one main surface of the unit elements.

Furthermore, in the optical element, in each of the unit elements, the first region of the two regions equally divided by the center line is desirably a region on the side adjacent to a plurality of connection portions to be connected to the plurality of external electrodes through conductor circuits, the connection portions mounted on an other electronic part.

A package substrate of the present invention comprises: a substrate having conductor circuits formed on both sides thereof; and one or a plurality of optical elements and one or a plurality of optical element driving parts, each of which is mounted on the substrate, and in this structure, each of the optical elements and each of the optical element driving parts are connected to one another through a plurality of conductor circuits each having almost the same length.

In the package substrate, desirably, each of the optical elements comprises one or a plurality of unit elements each having a plurality of external electrodes formed on one main surface thereof, and upon taking the one main surface of the unit elements in a plan view, the plurality of external electrodes are locally formed in a first region of two regions of a planar shape of the main surface, the two regions formed by equally dividing the planar shape with a center line.

Here, each of the optical elements is desirably a multi-channel optical element comprising a plurality of unit elements.

In the package substrate, in the optical element, desirably, a level maintaining member is formed in a second region of the two regions divided by the center line from the first region having the external electrodes formed thereon.

Here, the level maintaining member is desirably a spacer which has been processed into a sheet or desirably an adhesive agent.

In the package substrate, in the optical element, desirably, dummy electrodes are formed in a second region of the two regions divided by the center line from the first region having the external electrodes formed thereon.

Here, bumps of the same height are desirably formed on each of the external electrodes and the dummy electrodes, and the bumps are desirably Au stud bumps, solder bumps, or metal bumps comprising Au, Ni or Cu.

Moreover, desirably, a plurality of dummy electrodes are formed in the second region, and the external electrodes and the dummy electrodes are formed at positions symmetrical to each other with respect to the center line.

Furthermore, each of the external electrodes and the dummy electrodes have the same size and the same shape, and are formed by using the same materials.

In the package substrate, in the optical element, the diameter of each of the external electrodes is desirably set to at least about 50 μm and at most about 100 μm.

Moreover, in the package substrate, in the optical element, desirably a light receiving portion or a light emitting portion is formed in the vicinity of the center in a plan view of the one main surface of the unit elements.

Furthermore, in the package substrate, in each of the unit elements, the first region of the two regions equally divided by the center line is a region on the side adjacent to a plurality of connection portions to be connected to the plurality of external electrodes through the conductor circuits, the connection portions mounted on the optical element driving parts.

Additionally, in the package substrate, each of the optical elements is desirably mounted via the external electrodes by flip chip bonding, wire bonding, or by using a lead frame.

A package substrate of the present invention comprises: a substrate having conductor circuits formed on both sides thereof; and one or a plurality of optical elements and one or a plurality of optical element driving parts each of which is mounted on the substrate, and in this structure, an optical path for transmitting an optical signal is formed on the substrate, and each of the optical elements and each of the optical element driving parts are connected to one another through a plurality of conductor circuits each having almost the same length.

Here, each of the optical elements is desirably a multi-channel optical element comprising a plurality of unit elements.

In the package substrate, the optical path for transmitting an optical signal desirably has a collective through hole structure, an individual through hole structure, or a recess shape (cavity shape).

Moreover, in the package substrate, the optical path for transmitting an optical signal is desirably formed of an opening, or desirably, a portion or the entirety of the optical path for transmitting an optical signal is formed of a resin composite.

Furthermore, in the package substrate, the optical path for transmitting an optical signal desirably has a transmittance for light having a wavelength for communication of about 70%/mm or more.

In the package substrate, when the optical path for transmitting an optical signal has a collective through hole structure, a planar shape of the optical path for transmitting an optical signal is desirably an almost rectangle or an almost ellipse, the planar shape having a size of at least about 100 μm and at most about 5 mm with respect to each of the length and width thereof.

Moreover, in the package substrate, when the optical path for transmitting an optical signal has an individual through hole structure, a planar shape of the optical path for transmitting an optical signal is desirably an almost circle with a diameter of at least about 100 μm and at most about 500 μm.

In the package substrate, desirably, each of the optical elements is a multi-channel optical element having a pitch between respective channels of 250 μm, and the optical path for transmitting an optical signal has an individual through hole structure, and the diameter of the optical path for transmitting an optical signal is desirably at least about 150 μm and at most about 200 μm.

Moreover, in the package substrate, desirably, each of the optical elements is a multi-channel optical element having a pitch between respective channels of 500 μm, the optical path for transmitting an optical signal has an individual through hole structure, and the diameter of the optical path for transmitting an optical signal is at least about 150 μm and at most about 450 μm.

The package substrate can be desirably connected to a substrate for a motherboard through a solder.

A package substrate of the present invention comprises: a substrate having conductor circuits formed on both sides thereof; and one or a plurality of optical elements and one or a plurality of optical element driving parts, each of which is mounted on the substrate, and in this structure, a gap adjacent to each of the optical elements on the substrate side is filled in with an underfill, and each of the optical elements and each of the optical element driving parts are connected to one another through a plurality of conductor circuits each having almost the same length.

Here, each of the optical elements is desirably a multi-channel optical element comprising a plurality of unit elements.

In the package substrate, desirably, an optical path for transmitting an optical signal is formed on the substrate, and desirably, the optical path for transmitting an optical signal has a transmittance for light having a wavelength for communication of about 70%/mm or more.

In the package substrate, the underfill desirably has a transmittance for light having a wavelength for communication of about 70%/mm or more, and desirably has a refractive index of at least about 1.4 and at most about 1.6.

A package substrate of the present invention comprises: a substrate having conductor circuits formed on both sides thereof; and one or a plurality of optical elements and one or a plurality of optical element driving parts each of which is mounted on the substrate, and in this structure, an optical path for transmitting an optical signal is formed on the substrate, a microlens is provided to the optical path for transmitting an optical signal at the side opposite to the side on which each of the optical elements is mounted, and each of the optical elements and each of the optical element driving parts are connected to one another through a plurality of conductor circuits each having almost the same length.

In the package substrate, the microlens desirably has a transmittance for light having a wavelength for communication of about 70%/mm or more.

Moreover, in the package substrate, a gap adjacent to each of the optical elements on the substrate side is desirably filled in with an underfill, and desirably, the microlens has a refractive index higher than the refractive index of the underfill.

Further, in the package substrate, the microlens is desirably provided to the optical path directly or by interposing an optical adhesive layer.

In the package substrate, when the optical element is a multi-channel optical element having a pitch between respective channels of 250 μm, and the optical path for transmitting an optical signal has a collective through hole structure, then the diameter of the microlens is desirably at least about 100 μm and at most about 240 μm.

Also, in the package substrate, when the optical element is a multi-channel optical element having a pitch between respective channels of 500 μm, and the optical path for transmitting an optical signal has a collective through hole structure, then the diameter of the microlens is desirably at least about 100 μm and at most about 490 μm.

In the package substrate, when the optical element is a multi-channel optical element having a pitch between respective channels of 250 μm, and the optical path for transmitting an optical signal has an individual through hole structure, then the diameter of the microlens is desirably at least about 100 μm and at most about 190 μm.

Moreover, in the package substrate, when the optical element is a multi-channel optical element having a pitch between respective channels of 500 μm, and the optical path for transmitting an optical signal has an individual through hole structure, then the diameter of the microlens is desirably at least about 100 μm and at most about 490 μm.

A device for optical communication according to the present invention comprises: a substrate for a motherboard comprising a substrate having a conductor circuit formed on at least one side thereof, and an optical waveguide also formed on the substrate; and one or a plurality of optical elements and one or a plurality of optical element driving parts which are either collectively mounted on a package substrate or directly mounted on the substrate for a motherboard, the package substrate mounted on the substrate for a motherboard, and in this structure, each of the optical elements and each of the optical element driving parts are connected to one another through a plurality of conductor circuits each having almost the same length.

In the device for optical communication, desirably, each of the optical elements comprises one or a plurality of unit elements each having a plurality of external electrodes formed on one main surface thereof, and upon taking the one main surface of the unit elements in a plan view, the plurality of external electrodes are locally formed in a first region of two regions of a planar shape of the main surface, the two regions formed by equally dividing the planar shape with a center line.

Here, each of the optical elements is desirably a multi-channel optical element comprising a plurality of unit elements.

In the device for optical communication, in the optical element, desirably, a level maintaining member is formed in a second region of the two regions divided by the center line from the first region having the external electrodes formed thereon.

Here, the level maintaining member is desirably a spacer which has been processed into a sheet or desirably an adhesive agent.

In the device for optical communication, in the optical element, desirably, dummy electrodes are formed in a second region of the two regions divided by the center line from the first region having the external electrodes formed thereon.

Here, bumps of the same height are desirably formed on each of the external electrodes and the dummy electrodes, and the each of the external electrodes and the dummy electrodes are desirably have the same size and the same shape, and are formed by using the same materials. The bumps are desirably Au stud bumps, solder bumps, or metal bumps comprising Au, Ni or Cu.

Moreover, a plurality of dummy electrodes are desirably formed in the second region, and the external electrodes and the dummy electrodes are desirably formed at positions symmetrical to each other with respect to the center line.

Here, desirably, each of the external electrodes and the dummy electrodes have the same size and the same shape, and are formed by using the same materials.

In the device for optical communication, in the optical element, the diameter of each of the external electrodes is desirably set to at least about 50 μm and at most about 100 μm.

Moreover, in the optical element, desirably a light receiving portion or a light emitting portion is formed in the vicinity of the center in a plan view of the one main surface of the unit elements.

Furthermore, in the device for optical communication, in each of the unit elements, the first region of the two regions equally divided by the center line is a region on the side adjacent to a plurality of connection portions to be connected to the plurality of external electrodes through the conductor circuits, the connection portions mounted on the optical element driving parts.

Additionally, in the device for optical communication, the optical element is desirably mounted via the external electrodes by flip chip bonding, by wire bonding, or by using a lead frame.

A device for optical communication according to the present invention comprises: a substrate for a motherboard comprising a substrate having a conductor circuit formed on at least one side thereof, and an optical waveguide formed on the substrate; and one or a plurality of optical elements and one or a plurality of optical element driving parts which are either collectively mounted on a package substrate or directly mounted on the substrate for a motherboard, the package substrate mounted on the substrate for a motherboard; and an optical path for transmitting an optical signal formed on the substrate for a motherboard, and in this structure, each of the optical elements and each of the optical element driving parts are connected to one another through a plurality of conductor circuits each having almost the same length.

In the device for optical communication, the optical path for transmitting an optical signal desirably has a collective through hole structure or an individual through hole structure.

Moreover, in the device for optical communication, the optical path for transmitting an optical signal is desirably formed of an opening, or desirably, a portion or the entirety of the optical path for transmitting an optical signal is formed of a resin composite.

Furthermore, in the device for optical communication, the optical path for transmitting an optical signal desirably has a transmittance for light having a wavelength for communication of about 70%/mm or more.

In the device for optical communication, the package substrate is desirably mounted on the substrate for a motherboard, and an optical path for transmitting an optical signal is desirably formed on the package substrate.

Here, the optical path for transmitting an optical signal formed on the package substrate desirably has a collective through hole structure, an individual through hole structure, or a recess shape.

A device for optical communication according to the present invention comprises: a substrate for a motherboard comprising a substrate having a conductor circuit formed on at least one side thereof, and an optical waveguide formed on the substrate; and one or a plurality of optical elements and one or a plurality of optical element driving parts which are either collectively mounted on a package substrate or directly mounted on the substrate for a motherboard, the package substrate mounted on the substrate for a motherboard, and in this structure, a gap between the package substrate or each of the optical elements mounted on the substrate for a motherboard and the substrate for a motherboard is filled in with an underfill, and each of the optical elements and each of the optical element driving parts are connected to one another through a plurality of conductor circuits each having almost the same length.

Here, each of the optical elements is desirably a multi-channel optical element.

In the device for optical communication, desirably, the substrate for a motherboard further comprises an optical path for transmitting an optical signal.

Also, in the device for optical communication, the underfill desirably has a transmittance for light having a wavelength for communication of about 70%/mm or more, and the underfill desirably has an refractive index of at least about 1.4 and at most about 1.6.

A device for optical communication according to the present invention comprises: a substrate for a motherboard comprising a substrate having a conductor circuit formed on at least one side thereof, and an optical waveguide formed on the substrate; one or a plurality of optical elements and one or a plurality of optical element driving parts which are either collectively mounted on a package substrate or directly mounted on the substrate for a motherboard, the package substrate mounted on the substrate for a motherboard; an optical path for transmitting an optical signal formed on the substrate for a motherboard; and a microlens provided to the optical path for transmitting an optical signal at the side opposite to the side on which each of the optical elements is mounted, and in this structure, each of the optical elements and each of the optical element driving parts are connected to one another through a plurality of conductor circuits each having almost the same length.

Here, the microlens desirably has a transmittance for light having a wavelength for communication of about 70%/mm or more.

In the device for optical communication, desirably, a gap between the package substrate or each of the optical elements mounted on the substrate for a motherboard and the substrate for a motherboard is filled in with an underfill, and the microlens has a refractive index higher than the refractive index of the underfill.

Moreover, in the device for optical communication, the microlens is desirably provided to the optical path directly or by interposing an optical adhesive layer.

A device for optical communication according to the present invention comprises: a substrate for a motherboard comprising a substrate having a conductor circuit formed on at least one side thereof, and an optical waveguide formed on the substrate; and one or a plurality of optical elements and one or a plurality of optical element driving parts which are either collectively mounted on a package substrate or directly mounted on the substrate for a motherboard, the package substrate mounted on the substrate for a motherboard, and in this structure, the optical waveguide is an organic-based optical waveguide comprising a polymer material, and each of the optical elements and each of the optical element driving parts are connected to one another through a plurality of conductor circuits each having almost the same length.

Here, the optical waveguide is desirably a multimode optical waveguide, of which material is an acryl resin, an epoxy resin or a UV (ultraviolet) curing resin.

In the device for optical communication, the optical waveguide is desirably a multimode optical waveguide constituted by a core portion and a clad portion, and the thickness and the width of the core portion are desirably set to at least about 20 µm and at most about 80 µm.

Moreover, in the device for optical communication, a particle is desirably mixed in the optical waveguide, and the particle desirably comprises silica, titania, or alumina.

The particle diameter of the particle is desirably at least about 0.01 µm and at most about 0.8 µm.

Also, the amount of the mixed particles is desirably at least about 10% by weight and at most about 80% by weight.

In the device for optical communication, the optical waveguide is desirably constituted by a core portion and a clad portion, and desirably, a particle is mixed only in the clad portion.

Also, an optical path conversion mirror is desirably formed in the optical waveguide.

Moreover, in the device for optical communication, a plurality of interlayer resin insulating layers are laminated on the substrate of the substrate for a motherboard, and the optical waveguide is desirably formed on the substrate, between the interlayer resin insulating layers, or on an outermost layer of the laminated interlayer resin insulating layers.

DESCRIPTION OF THE EMBODIMENTS

Figure 1:
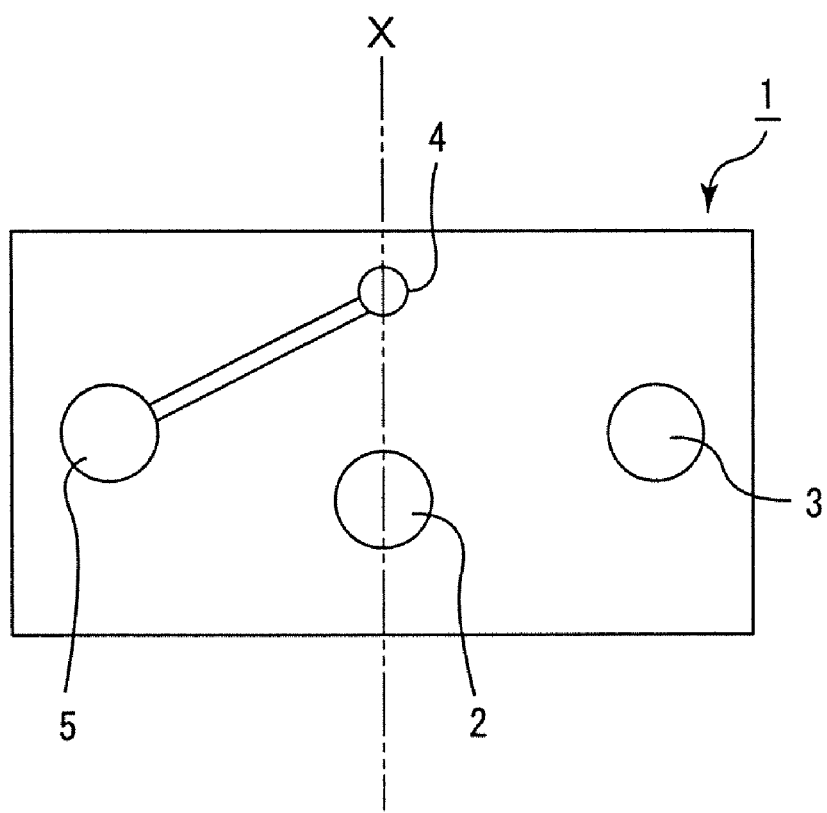
FIG. 1 is a plan view that schematically shows a conventional optical element.

An optical element according to the embodiments of the present invention comprises one or a plurality of unit elements each having a plurality of external electrodes formed on one main surface thereof, and upon taking the one main surface of the unit element in a plan view, the plurality of external electrodes are locally formed in a first region of two regions formed by equally dividing the planar shape with a center line.

With respect to the optical element according to the embodiments of the present invention, upon taking the surface where external electrodes are formed in a plan view, the external electrodes are locally formed in a first region of two regions formed by equally dividing the planar shape with a center line, and therefore, it may become possible to connect the external electrodes to the other electronic parts such as a driving IC or an amplifier IC through linear conductor circuits each having the same length.

In the case of transmitting or receiving of optical signals by using the optical element according to the embodiments of the present invention, even in transmission of high frequency signals (high speed signals), generation and absorption of radiated noise may be reduced, and thus it becomes possible to carry out a highly reliable optical communication.

Moreover, when the optical element is a multi-channel optical element, it becomes possible to reduce skew (signal deviation) within each channel and between each channels.

The package substrate according to the embodiments of the present invention is a package substrate comprising: a substrate having conductor circuits formed on both sides thereof; and one or a plurality of optical elements and one or a plurality of optical element driving parts, each of which is mounted on the substrate, and in this structure, each of the optical elements and each of the optical element driving parts are connected to one another through a plurality of conductor circuits each having almost the same length.

In this specification, optical element driving parts are the parts required for normally activating an optical element (light emitting element, light receiving element), such as a driving IC, an amplifier IC and the like, In the package substrate according to the embodiments of the present invention, optical elements and optical element driving parts are mounted, and both members are connected to each other through a plurality of conductor circuits each having almost the same length. As a result, even in transmission of a high frequency signal (high speed signal), generation and absorption of radiated noise may be able to be reduced, and thus it may become possible to carry out a highly reliable optical communication.

Moreover, since the conductor circuits which connect the optical elements and the optical element driving parts are not necessarily wired in the package substrate, the package substrate according to the embodiments of the present invention has a superior degree of freedom in design, whereby mounting positions for the optical elements and optical element driving parts are less likely to be limited.

Furthermore, in the package substrate according to the embodiments of the present invention, when an optical path for transmitting an optical signal is formed, the position thereof is not likely to be limited.

A device for optical communication according to the embodiments of the present invention comprises: a substrate for a motherboard comprising a substrate having a conductor circuit formed on at least one side thereof, and an optical waveguide formed on the substrate; and one or a plurality of optical elements and one or a plurality of optical element driving parts which are either collectively mounted on a package substrate or directly mounted on the substrate for a motherboard, the package substrate mounted on the substrate for a motherboard, and in this structure, each of the optical elements and each of the optical element driving parts are connected to one another through a plurality of conductor circuits each having almost the same length.

In the device for optical communication according to the embodiments of the present invention, the package substrate according to the embodiments of the present invention is mounted, for example, on a substrate for a motherboard. In such a configuration, the package substrate according to the embodiments of the present invention exerts the above-mentioned advantages, and thus even in transmission of high frequency signals (high speed signals), generation and absorption of radiated noise may be reduced in the device for optical communication according to the embodiments of the present invention, and accordingly it may become possible to carry out a highly reliable optical communication.

Moreover, in the device for optical communication according to the embodiments of the present invention, when an optical element and an optical element driving part are directly mounted on the substrate for a motherboard, and further the optical element and the optical element driving part are connected to each other through a plurality of conductor circuits each having the same length, even in transmission of high frequency signals (high speed signals), it also becomes possible to reduce generation and absorption of radiated noise, and accordingly it may become possible to carry out a highly reliable optical communication.

Furthermore, when the optical element and the optical element driving part are directly mounted on the substrate for a motherboard, since the conductor circuits connecting both members do not need to be wired in the substrate for a motherboard, the freedom in design is excellent and the mounting positions of the optical elements and the optical element driving parts are not likely limited.

In addition, in the device for optical communication according to embodiments of the present invention, when an optical path for transmitting an optical signal is formed on the substrate for a motherboard, the position for forming thereof is also not likely limited.

First, an optical element according to the embodiments of the present invention will be described.

An optical element according to the embodiments of the present invention comprises one or a plurality of unit elements. In other words, it is a single-channel optical element or a multi-channel optical element.

The optical element is not particularly limited as long as external electrodes are formed in each of the unit elements at predetermined positions, and concrete examples thereof include a light receiving element, a light emitting element and the like.

Examples of the light receiving element include a PD (photodiode), an APD (avalanche photodiode) and the like.

Examples of materials for the light receiving element include Si, Ge, InGaAs and the like.

An LD (semiconductor laser), a DFB-LD (distributed-feedback semiconductor laser), an LED (light emitting diode), an infrastructure-type or oxide-narrowing type VCSEL (surface-emitting semiconductor laser) and the like can be cited as examples of the light emitting element.

As for the material of the above-described light emitting element, a compound of gallium, arsenic and phosphorous (GaAsP), a compound of gallium, aluminum and arsenic (GaAlAs), a compound of gallium and arsenic (GaAs), a compound of indium, gallium and arsenic (InGaAs), a compound of indium, gallium, arsenic and phosphorous (InGaAsP) or the like can be cited.

These may be used in different applications, taking the wavelength for communication into consideration, and in the case where the wavelength for communication is, for example, a band of 0.85 μm, it becomes possible to use GaAlAs, and in the case where the wavelength for communication is a band of 1.3 μm or a band of 1.55 μm, it becomes possible to use InGaAs.

The optical element according to the embodiments of the present invention such as a light receiving element or a light emitting element may be a multi-channel optical element, and the number of channels thereof is not particularly limited.

Moreover, the optical element may be mounted on a circuit board and the like by flip chip by interposing an external electrode or may be mounted on a circuit board and the like by wire bonding. Further, the optical element may be mounted on a circuit board and the like by using a lead frame.

This is because, it may become possible to freely select a mounting structure (embodiment) of the optical element, and the mounting structure (embodiment) may be more easily adjusted depending on the purposes such as miniaturization, removability and the like.

In the optical element according to the embodiments of the present invention, upon taking the surface where external electrodes are formed (hereinafter, also referred to as external electrode formed surface) in a plan view, the external electrodes are locally formed in a first region of two regions of a planar shape, the two regions formed by equally dividing the planar shape with a center line.

The planar shape of the external electrode formed surface is not particularly limited, and may be any shape including square, rectangle, circle, ellipse and the like.

Also, in the external electrode formed surface, desirably, a level maintaining member is formed in a second region of the two regions divided by the center line from the first region having the external electrodes formed thereon.

In particular, in the case where the optical element is a kind that is mounted by face-down mounting by flip chip, it is desirable for level maintaining members to be formed. This is because, since the external electrodes are locally present in the optical element, the optical element may incline at the time of mounting in the case where the level maintaining member or the like are not formed, and thus sometimes it becomes difficult to carry out transmission of an optical signal.

In the external electrode formed surface, desirably, dummy electrodes are formed in a second region of the two regions divided by the center line from the first region having the external electrodes formed thereon.

Here, the dummy electrodes have the same configuration as the above-described external electrodes, except that no current flows through them as a result of the design of the optical element.

This is because, when the dummy electrodes are formed, an optical element may be more easily mounted on an external substrate such as a package substrate and a substrate for a motherboard by using a normal high accuracy flip chip bonder and the like without special step, while the mounting position accuracy and the parallelism are maintained.

There is no limitation on the positions for forming the dummy electrodes as long as the positions are in a second region of the two regions divided by the center line from the first region having the external electrodes formed thereon, but desirably the dummy electrodes are formed at the positions symmetrical to the external electrodes with respect to the center line. This is because the positions are appropriate for mounting the optical elements horizontally. Moreover, the shape and size of the dummy electrodes are desirably identical to the shape and size of the external electrodes.

Furthermore, bumps of the same height are desirably formed on each of the external electrodes and the dummy electrodes. This is because, when the optical element is mounted by using a flip chip bonder, mounting positions with excellent accuracy and parallelism may be able to be achieved.

In addition, when bumps are formed on each of the external electrodes and the dummy electrodes, the material and the amount of those bumps are desirably the same.

The following description explains the optical element according to the above-mentioned embodiments in reference to the drawings.

Each of FIGS. 2A to 2F is a plan view that schematically shows the planar shape of a surface where external electrodes are formed, or a surface where a light receiving portion is formed, of the optical element according to the embodiments of the present invention. Here, the optical element according to the embodiments of the present invention is described referring to a light receiving element as an example; however, there is no difference in the shape of the external electrode whether it is a light receiving element or a light emitting element.

Moreover, the optical element described here is an optical element comprising one unit element, i.e., a single-channel optical element; however, as described above, the optical element according to embodiments of the present invention may be a multi-channel optical element comprising a plurality of the unit elements. Furthermore, in the case of multi-channel optical element, number of the channel is not limited.

Figure 2A:
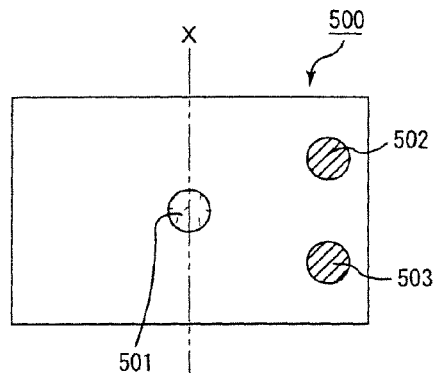
FIGS. 2A to 2F each is a plan view that schematically shows a planar shape of a surface on which an external electrode of an optical element according to one embodiment of the present invention is formed.

The external electrode formed surface of a light receiving element 500 shown in FIG. 2A has a rectangular planar shape, and external electrodes 502 and 503 are formed on a first region (the region at the right side of FIG. 2A) of the two regions formed by equally dividing the planar shape with a center line X. Also, a light receiving portion 501 is formed in the vicinity of the center of the external electrode formed surface.

Here, with regard to the external electrodes 502 and 503, one of them is a p-side electrode, and the other is an n-side electrode.

Figure 2B:
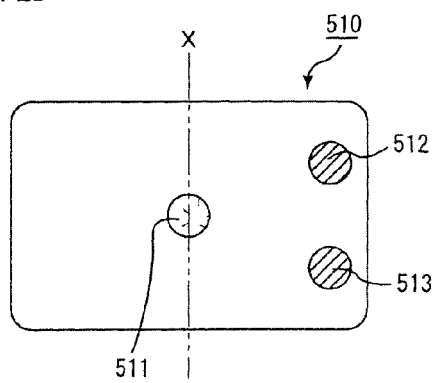

With respect to the external electrode formed surface of a light receiving element 510 shown in FIG. 2B, a planar shape thereof is constituted by straight lines and circular arcs, i.e., the planar shape of the light receiving element is a rectangle with rounded corners, and external electrodes 512 and 513 are formed on a first region (the region at the right side of FIG. 2B) of the two regions formed by equally dividing the planar shape with a center line X. Also, a light receiving portion 511 is formed in the vicinity of the center of the external electrode formed surface.

Figure 2C:
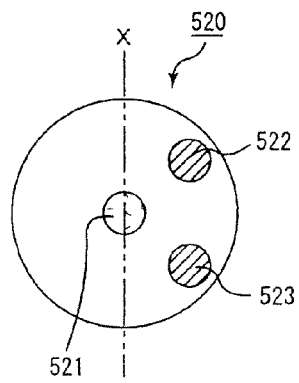

The external electrode formed surface of a light receiving element 520 shown in FIG. 2C has a circular planar shape, and external electrodes 522 and 523 are formed on a first region (the region at the right side of FIG. 2C) of the two regions formed by equally dividing the planar shape with a center line X. Also, a light receiving portion 521 is formed in the vicinity of the center of the external electrode formed surface.

Figure 2D:
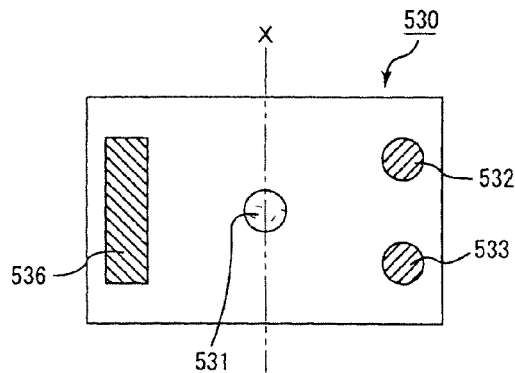

A light receiving element 530 shown in FIG. 2D has the same structure as the light receiving element 500 shown in FIG. 2A, except that a level maintaining member 536 is further formed therein. In other words, in an external electrode formed surface of the light receiving element 530, the level maintaining member 536 is formed in a second region (the region at the left side of FIG. 2D) of the two regions equally divided by the center line X from the first region having the external electrodes 532 and 533 formed thereon.

Figure 2E:
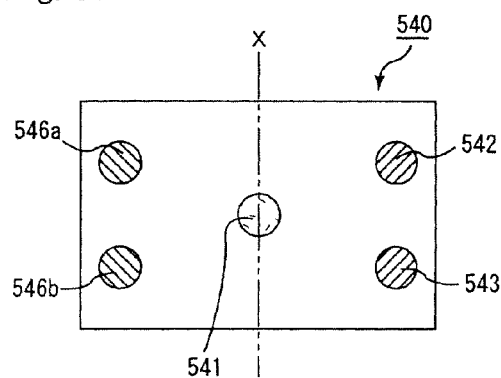

A light receiving element 540 shown in FIG. 2E has the same structure as the light receiving element 500 shown in FIG. 2A, except that dummy electrodes 546a and 546b are formed therein as level maintaining member. In other words, in an external electrode formed surface of the light receiving element 540, the dummy electrodes 546a and 546b are formed in a second region (the region at the left side of FIG. 2E) of the two regions of the planar shape formed by equally dividing with the center line X from the first region having the external electrodes 542 and 543 formed thereon. Here, the dummy electrodes 546a and 546b are formed at the positions symmetrical to the external electrodes with respect to the center line X.

In the optical element according to the embodiments of the present invention, the external electrodes and a light receiving portion or a light emitting portion are not necessarily formed on the same plain surface as shown in FIGS. 2A to 2E.

Figure 2F:
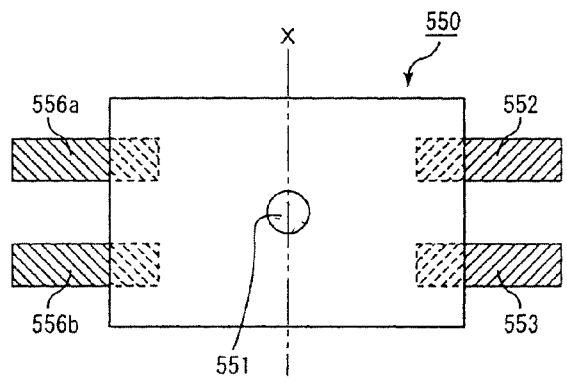

A light receiving element 550 shown in FIG. 2F is one example of a kind of light receiving element which is to be mounted by using a lead frame. Upon taking a light receiving portion formed surface of the light receiving element 550 in a plan view, external electrodes 552 and 553 of a lead frame type protrude from a first region of two regions formed by equally dividing the planar shape of the light receiving portion formed surface with the center line X, and dummy electrodes 556a and 556b, which have almost the same shape as the lead frame type external electrodes 552 and 553, protrude from the second region (the region at the left side of FIG. 2F) of the two regions divided by the center line X from the first region. Here, the dummy electrodes 556a and 556b are formed at the positions symmetrical to the external electrodes 552 and 553 with respect to the center line X. Moreover, a light receiving portion 551 is formed in the vicinity of the center of the external electrode formed surface. Here, with regard to the external electrodes 552 and 553, one of them is a p-side electrode, and the other is an n-side electrode.

The optical element according to the embodiments of the present invention may be a multi-channel array element (multi-channel optical element) as described above. In the case, in particular, of the multi-channel optical element, when this multi-channel optical element is mounted on a circuit board and the like to be connected to other electronic parts such as a driving IC and an amplifier IC, it is not necessary to wire circuits (conductor circuits) and thus the effects of the present invention may be able to be significantly enjoyed.

In the above-described optical element according to the above-mentioned embodiments, with respect to each unit element, one of the two regions equally divided by the center line is desirably a region on the side adjacent to the plurality of connection portions formed in the other electronic parts, which are to be connected to the plurality of external electrodes through a conductor circuit. In the case where the external electrodes are formed at the above-described positions, it becomes possible to connect those external electrodes to other electronic parts (optical element driving parts such as a driving IC and an amplifier IC), through linear conductor circuit each having the same length, and also to shorten the absolute length of the conductor circuits; thus adjustment to high frequency signals (high speed signals) may become easier.

Moreover, in the optical element according to embodiments of the present invention, desirably, the light receiving portion or the light emitting portion is formed in the vicinity of the center in a plan view of the one main surface of the unit element, as shown in FIGS. 2A to 2F.

Figure 3:
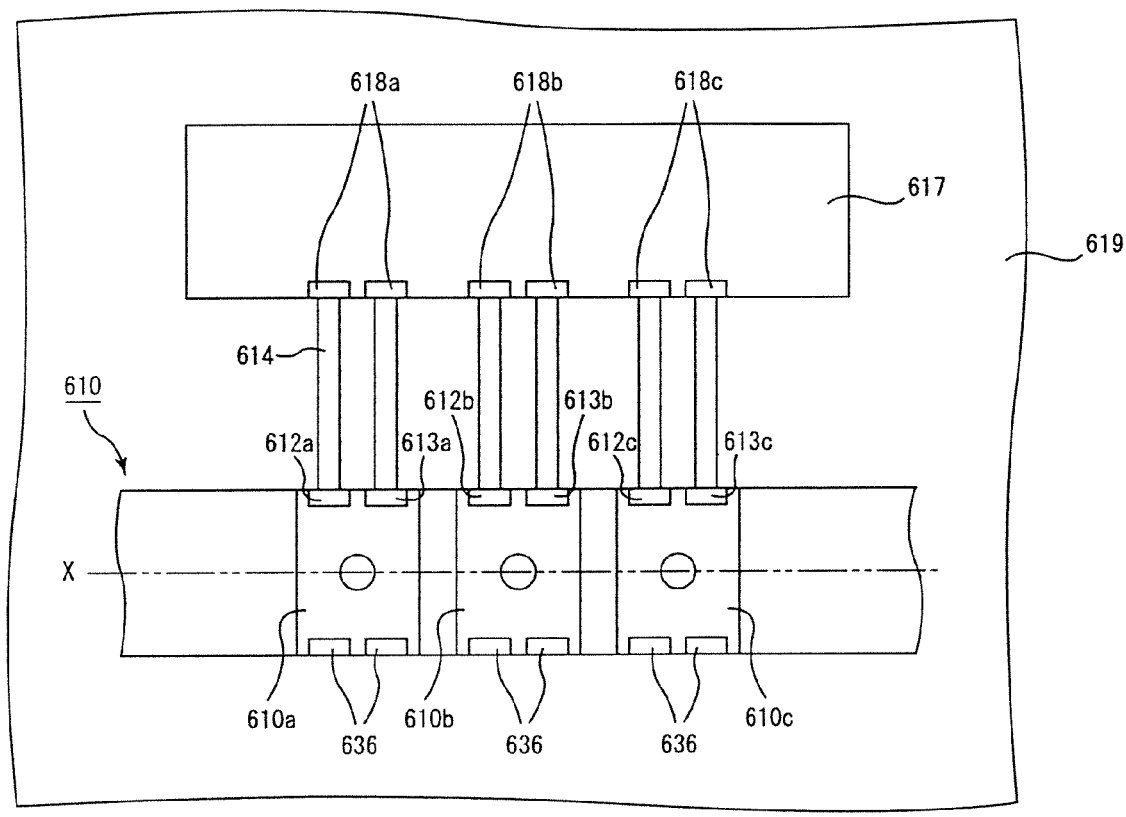
FIG. 3 is a plan view that schematically shows one form of connection between an optical element (multi-channel optical element) according to one embodiment of the present invention and an IC chip.

FIG. 3 is a plan view that schematically shows one form of connection between an optical element (multi-channel optical element) according to one embodiment of the present invention and an IC chip.

As shown in FIG. 3, in the case where a multi-channel optical element 610 is mounted on a circuit board 619 and connected to connection portions 618a to 618c of an IC chip 617, p-side electrodes 612a to 612c as well as n-side electrodes 613a to 613c formed on each of the respective unit elements 610a to 610c of the multi-channel optical element 610 are connected to the connection portions 618a to 618c through conductor circuits 614. Here, the p-side electrodes 612a to 612c and the n-side electrodes 613a to 613c are all formed in a first region of the two regions equally divided by a center line X, and which is a region on the side adjacent to the connection portions 618a to 618c formed in the IC chip 617.

As a result of this, the conductor circuits 614 connecting the electrodes and the connection portions to one another may be formed into linear lines having the same length. Moreover, it may also become possible to reduce the difference in length of conductor circuits 614 among the unit elements 610a to 610c. Therefore, the optical element according to the embodiments of the present invention is highly reliable even in the case where a high frequency signal (high speed signal) is to be transmitted.

In FIG. 3, reference numerals 636 indicate dummy electrodes.

Figure 4:
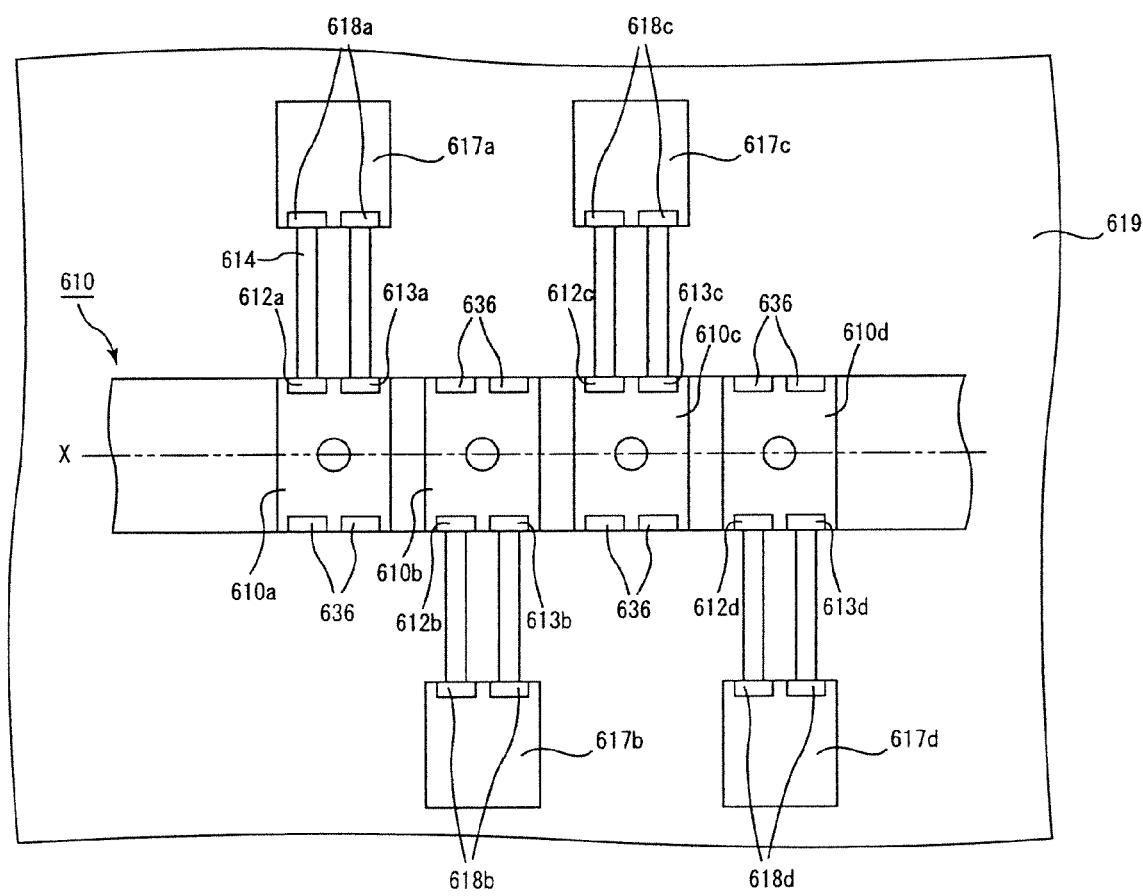
FIG. 4 is a plan view that schematically shows another form of connection between an optical element (multi-channel optical element) according to one embodiment of the present invention and an IC chip.

The form of connection between an optical element (multi-channel optical element) according to one embodiment of the present invention and an IC chip is not limited to the configuration shown in FIG. 3, and may be, for example, the configuration shown in FIG. 4.

FIG. 4 is a plan view that schematically shows another form of connection between an optical element (multi-channel optical element) according to one embodiment of the present invention and an IC chip.

As shown in FIG. 4, in the case where the multi-channel optical element 610 is mounted on the circuit board 619 and connected to connection portions 618a to 618d in respective IC chips 617a to 617d, p-side electrodes 612a to 612d as well as n-side electrodes 613a to 613d formed on each of the respective unit elements 610a to 610d of the multi-channel optical element 610 are connected to the respective connection portions 618a to 618c through the conductor circuits 614. Here, with regard to the p-side electrodes 612a to 612d and the n-side electrodes 613a to 613d, in each of the unit elements, the external electrodes (p-side electrodes or n-side electrodes) are locally formed in a first region of two regions formed by equally dividing the planar shape of a surface of the unit element with a center line X. In each of the unit elements, the side of the first region in which the external electrodes are locally formed differs from one another; in the unit elements 610a and 610c, the external electrodes are locally formed at one side (the upper side in FIG. 4) of the two regions divided by the center line, whereas in the unit elements 610b and 610d, the external electrodes are locally formed at the other side (the lower side in FIG. 4) of the two regions divided by the center line.

Moreover, each of the unit elements is connected to the respective IC chips 617a to 617d, and each of the IC chips is mounted on the same side where the external electrodes are locally formed in each unit element.

As a result of this, the conductor circuits 614 connecting the unit elements and the IC chips may be formed into linear lines having the same length. Moreover, it may also become possible to reduce the difference in length of the conductor circuits 614 between the unit elements 610a to 610d. Therefore, the optical element in accordance with the embodiments of the present invention is highly reliable even in the case where a high frequency signal (high speed signal) is transmitted.

In FIG. 4, reference numerals 636 indicate dummy electrodes.

As described above in reference to FIG. 3 and FIG. 4, when the optical element according to embodiments of the present invention is a multi-channel optical element which is connected to a driving part such as an IC chip, the driving part may be one driving part capable of driving the multi-channel optical element, or each optical element may be provided with one driving part.

It goes without saying that, in the case where external electrodes are formed in one side with respect to the center line in all unit elements as shown in FIG. 3, each unit element may be connected to one driving part.

Moreover, upon using a driving part capable of driving the multi-channel optical element, the number of channels one driving part can drive is not necessarily equal to the number of channels of the multi-channel optical element, and for example, in order to drive a four-channel optical element, two driving parts capable of driving two channels, or a combination of one driving part capable of driving two channels and two driving parts capable of driving one channel, or a combination of one driving part capable of driving three channels and one driving part capable of driving one channel, may be used.

The following description will briefly describe operations of optical elements by optical element driving parts.

When the optical element is a light emitting element, and the optical element driving part is a driving IC (driver IC), electric current is provided from n-side electrodes of the driving IC, and the electric current flows in the order of n-side electrodes of the light emitting element, p-side electrodes of the light emitting element and p-side electrodes of the driving IC, so that light emitting surfaces of the light emitting element emit light.

On the other hand, when the optical element is a light receiving element, and the optical element driving part is an amplifier IC, light received by the light receiving surfaces of the light receiving element is converted to electricity, and electric current is provided from the n-side electrodes of the light receiving element, and then the electric current flows in the order of n-side electrodes of the amplifier IC, p-side electrodes of the amplifier IC and p-side electrodes of the light emitting element. Here, the electric signals are adjusted at the amplifier IC.

As for the material of an external electrode constituting the optical element, nickel, palladium, gold, silver, platinum, or a combination thereof, and the like can be cited as an example, although not particularly limited thereto.

The above external electrodes may be formed by a method including, for example, plating, vapor deposition, electrolytic deposition, and the like.

The diameter of each of the external electrodes is desirably at least about 50 μm and at most about 100 μm. This is because, this size does not deteriorate freedom in design of the multilayer circuit board when the external electrodes are mounted on the multilayer circuit board and the like, and also with this size, it becomes possible to surely connect the external electrodes to conductor circuits and the like.

Here, the diameter of the external electrode refers to a diameter of the circle when the planar shape of the external electrode is a circle and to the length of the longest side when the planar shape of the external electrode is a rectangle.

The level maintaining member may be a spacer which has been processed into a sheet and the like in advance, or may be an adhesive agent. When the level maintaining member is an adhesive agent, it becomes possible for the level maintaining member to exert functions as a level maintaining member, i.e. the function to maintain the optical element in a horizontal state (state parallel to a package substrate, a substrate for a motherboard and the like), by curing the adhesive agent after mounting the optical element on a package substrate, a substrate for a motherboard and the like, as will be described later.

Here, when the level maintaining member is a spacer which has been processed into a sheet, formation thereof becomes easier, and the degree of freedom in design of the material and the like tends to become high. Also, the level maintaining member may be more easily manufactured to have a constant thickness, and the optical element may be more easily mounted in a state parallel to the package substrate and the like, and as a result, optical transmission loss may be more easily reduced.

In the case where the level maintaining member is a spacer, examples of the material thereof include a resin material such as epoxy resin, acryl resin, silicon resin, BT resin and polyimide, an inorganic material such as glass, ceramics and silicon, a metal material such as Al, Ni, SUS, Cu, and the like.

Upon mounting the spacer as a level maintaining member, the spacer may be mounted at the predetermined positions on an optical element by interposing an adhesive agent or a solder. The spacer may be mounted on dummy electrodes.

On the other hand, in the case where the level maintaining member is an adhesive agent, examples of the material thereof include a thermosetting resin, a UV (ultraviolet) curing resin, a combination of a thermosetting resin and a UV (ultraviolet) curing resin and the like. Specifically, for example, epoxy resin, acryl resin, silicon resin and the like may be cited.

Among those examples, a thermosetting resin is desirable. By using this, it may become possible to mount an optical element and fix the position thereof at the same time by curing the thermosetting resin so that it becomes possible to avoid displacement of position of the optical element after mounting.

When a UV (ultraviolet) curing resin or a combination of a thermosetting resin and a UV (ultraviolet) curing resin is used, it becomes possible to surely fix the optical element to the predetermined positions by, for example, curing the adhesive agent prior to filling a transparent underfill beneath the optical element and further curing the underfill.

The applied amount of the adhesive agent is desirably the amount that makes it possible to surely bond the package substrate and the like and the optical element to each other.

Moreover, in the case where the level maintaining member is an adhesive agent, mounting of the optical element is desirably carried out by a heat tool method using a high accuracy flip chip bonder as will be described later.

In the heat tool method, positioning of optical elements is carried out while the optical elements are sucked, and the height of the optical elements is aligned while a substrate for mounting IC chip and the like is fixed on the stage; therefore, it becomes possible to mount optical elements while keeping the positioning accuracy and parallelism of the optical elements.

The following description will describe concrete embodiments of the optical element in more detail.

In the case where the optical element is, for example, a kind of an optical element that is to be flip chip mounted by face-down mounting, Au stud bumps, solder bumps, or metal bumps comprising Au, Ni, Cu and the like, are formed on the external electrodes (p-electrode, n-electrode), and then the optical element is flip chip mounted on a package substrate or a substrate for a motherboard. Here, when Au stud bumps are formed, Ni/Au pads or Ni/Pd/Au pads are formed on the substrate side, and when solder bumps or metal bumps are formed, solder bumps are formed on the substrate side.

When the Au stud bumps, the solder bumps, or the metal bumps comprising Au, Ni, Cu and the like of this kind are formed, it becomes possible to surely mount the optical element by face-down mounting.

The Au stud bumps may be able to be formed by, for example, Au-bonding an Au wire onto an external electrode (pad) by using a stud bumper, and then cutting the Au wire.

The solder bumps may be able to be formed by a solder paste printing method, a ball mounting method, a plating and the like.

The metal bumps may be able to be formed by plating and the like.

Also, when dummy electrodes are formed on the optical element, and bumps are formed on the dummy electrodes, the bumps may be able to be formed in the same manner as the above-described method for forming bumps on external electrodes.

In the case where the optical element having the Au stud bumps formed thereon is mounted on a package substrate and the like, for example, by using a high accuracy flip chip bonder (for example, mounting accuracy: about 10 μm or less), first a substrate is heated on a stage to a temperature of at least about 50° C. and at most about 150° C., and optical elements are sucked by a sucking head (heat tool), and then position adjustment is carried out by recognizing alignment marks for the package substrate or the like and the optical elements, followed by heating of the sucking head, so that a metal bonding (Au—Au bonding) is performed. At the time of the metal bonding, ultrasonic may be used concomitantly.

In the case where an optical element is mounted via solder bumps formed on a package substrate and the like, examples of mounting methods include: a method using a high accuracy flip chip bonder (for example, mounting accuracy: about 10 μm or less), in such a manner that a substrate is heated on a stage to a temperature of at least about 50° C. and at most about 150° C., a flux is applied thereto, optical elements are sucked by a sucking head (heat tool), position adjustment is carried out by recognizing alignment marks for the package substrate or the like and the optical elements, the sucking head is heated to melt the solder bumps and carry out solder bonding, and lastly a flux washing is performed; and a method using a normal flip chip bonder (for example, mounting accuracy: about 20 μm), in such a manner that a flux is applied to solder bumps (desirably those having flattened tops) formed on the package substrate or the like, position adjustment is carried out by recognizing alignment marks for the optical element and a package substrate or the like, and then the solder is melted in a reflow furnace, and finally flux washing is performed. In the latter method, position is set by the self-alignment effect.

In the case where an optical element is mounted by using solder bumps formed at the package substrate side, the mounting may be carried out by methods such as (1) a method in which solder bumps comprising a high melting point solder (melting point of about 280° C. or more) are formed at the optical element side, and solder bumps comprising a low melting point solder (melting point of at least about 180° C. and at most about 260° C.) are formed at the side of the package substrate or the like, and then both solder bumps are soldered, (2) a method in which solder bumps comprising a low melting point solder (melting point of at least about 180° C. and at most about 260° C.) are formed at both the optical element side and the side of the package substrate or the like, and then both solder bumps are soldered, (3) a method in which Au stud bumps are formed at the optical element side, and solder bumps comprising a low melting point solder (melting point of at least about 180° C. and at most about 260° C.) are formed at the side of the package substrate or the like, and then Au stud bumps are soldered, (4) a method in which metal bumps comprising Au, Ni and Cu is formed at the optical element side, and solder bumps comprising a low melting point solder (melting point of at least about 180° C. and at most about 260° C.) is formed at the side of the package substrate or the like, and then metal bumps are soldered, and the like. In the case of carrying out the method (4), the shape of the metal bumps may be any shape that fits the shape of the pad of the optical element such as a cylindrical shape and a rectangular pillar-shape, and also the metal bumps may be able to be formed by plating and the like.

Moreover, when solder bumps are formed at the side of the package substrate or the like in the above-described methods, it is possible to form the solder bumps by, for example, solder paste printing, solder ball mounting, plating and the like. Here, the top of the solder bumps may be flattened for better mounting of the optical element.

Examples of a solder used in the soldering include Sn-37Pb, Sn-3.5Ag, Sn—Ag—Cu—In, Sn-2Ag-7.5Bi-0.5Cu, Sn—Zn—Bi and the like.

As mentioned above, in the optical element according to the embodiments of the present invention, an external electrode and a dummy electrode are desirably formed to have the same size and the same shape, and are desirably formed by using the same materials at positions symmetrical to each other with respect to a center line. The reason for this is as described below.

That is, when the external electrode and the dummy electrode of the optical element are formed at positions symmetrical to each other and have the same shape, it becomes easy for the bumps (Au stud bumps, solder bumps, metal bumps) formed on each of the external electrode and the dummy electrode to have the same diameter, height and volume (hereinafter, these may altogether be called "bump amount"), and in addition, (1) when an optical element is mounted by applying a load thereto in a heat tool method, the load are applied evenly to each bump, and thus it becomes more easier for the optical elements to be mounted at the predetermined positions.

In the present specification, "a heat tool method" means a mounting method also known as "a flip chip method using ultrasonic bonding", which is a method to apply pressure at a constant loading with a heating head.

(2) Moreover, when an optical element is mounted by reflow, the optical element is expectedly mounted at the predetermined position by the self-alignment effect. Therefore, from the viewpoint that the maximum level of self-alignment effect may be exerted, the external electrodes and the dummy electrodes of the optical element are desirably formed at the positions symmetrical to each other, and the bumps formed in the external electrodes and the dummy electrodes desirably have the same shape and the same amount, and same bump amount.

(3) Furthermore, when taking into consideration the connection reliability between the optical element and the pad formed on the package substrate and the like, in the case where the formed bump amount is different between the external electrodes and the dummy electrodes of the optical element, stress concentrates on the bumps of either of the electrodes and tends to lead to occurrence of cracks; also in the case where the materials of the bumps differ from one another, cracks tend to occur easily, and thus improper connection tends to occur in either cases. For this reason, the bumps formed on the external electrodes and the dummy electrodes of the optical element desirably comprise the same materials and have almost the same bump amount.

(4) In some cases, the area under the mounted optical element may be filled in with a (transparent) underfill so as to soften the stress caused by the difference in coefficient of thermal expansion between the optical element and the substrate for a motherboard and the like, and/or so as to prevent dust or foreign matter from entering into optical path under the optical element. In this case, upon filling the underfill, when positions where bumps are formed are symmetrically located with respect to the center line and the bump amount is the same, the filling of the underfill can be more easily carried out, whereas when the positions of bumps are not symmetrical or the bump amount is different, the inflow characteristics in filling of the underfill may tend to vary depending on positions, and thus voids may occur beneath the optical elements.

When the void occurs, optical transmission property may be deteriorated, and therefore, the bumps formed on the external electrodes and the dummy electrodes of the optical element are desirably formed at the symmetrical positions while having almost the same bump amount.

In the case where optical transmission is carried out through the optical element, from the viewpoint that transmission loss should be reduced as much as possible, the mounting position accuracy of the optical element and the package substrate and the like as well as the parallelism are important. Here, for the reasons mentioned above, it may become easier to obtain an excellent mounting position accuracy and parallelism when the external electrodes and the dummy electrodes are formed to have the same size and the same shape, and are formed by using the same materials at positions symmetrical to each other with respect to a center line.

In recent years, along with the increase in the amount of information transmission, more and more devices for optical communication have a multi-channel optical element mounted thereon.

Figure 5:
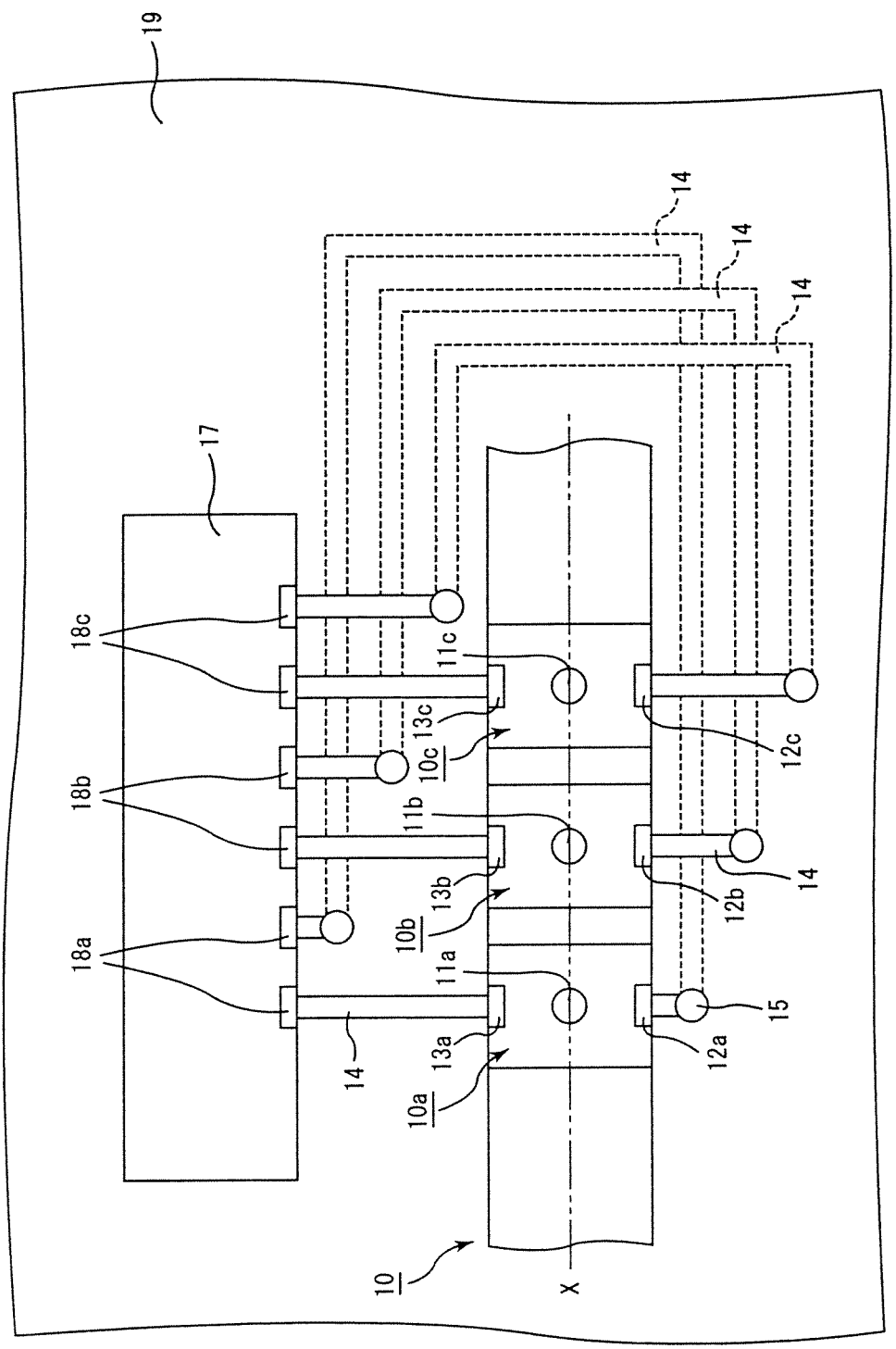
FIG. 5 is a plan view that schematically shows a conventional multi-channel optical element, which is mounted on a circuit board and connected to an IC chip.

FIG. 5 is a plan view that schematically shows a conventional multi-channel optical element, which is mounted on a circuit board and connected to an IC chip.

As shown in FIG. 5, when a multi-channel array optical element 10 is mounted on a circuit board 19 and connected to connection portions 18a to 18c of an IC chip 17, p-side electrodes 12a to 12c formed in each of respective unit elements 10a to 10c of the array optical element 10 and n-side electrodes 13a to 13c are connected to the connection portions 18a to 18c through a conductor circuit.

Here, it is difficult to form the conductor circuits 14, which connect the p-side electrodes 12a to 12c with the connection portions 18a to 18c, on the same layer to avoid contact between the conductor circuits, and therefore the conductor circuits need to be formed on different layers by forming via holes 15.

In the FIG. 5, reference numerals 11a, 11b and 11c show a light receiving portion or a light emitting portion.

On the other hand, when an optical element is mounted on one side face of a circuit board and the other side face is mounted on a substrate for a motherboard and the like, an optical path for transmitting an optical signal needs to be formed on the circuit board, and in this case, the conductor circuits connecting the p-side electrodes and the IC chip or the n-side electrodes and the IC chip needs to be formed in a manner as to keep away from the optical path for transmitting an optical signal.

Moreover, when the connections between the p-side electrodes and the IC chip or n-side electrodes and the IC chip are made only on the same layer, with regard to the positions for mounting the p-side electrodes, n-side electrodes and IC chip, conventionally no consideration has been given to the distance between the p-side electrode and the connection portions of IC chip and the distance between n-side electrode and the connection portions of IC chip.

On the other hand, in accordance with the optical element according to the embodiments of the present invention, upon connecting the optical element to electric parts such as an IC chip and the like, it becomes unnecessary to wire connection circuits (conductor circuits) on different hierarchical layers or in a manner as to keep away from an optical path for transmitting an optical signal, and thus it may become possible to improve a degree of freedom in design.

Particularly, in the case where an optical element is mounted on a circuit board, an optical path needs to be secured separately, and therefore there is a significant restriction on positions for forming conductor circuits. On the other hand, in the optical element according to the embodiments of the present invention, it may become possible to reduce such restriction.

Also, as wiring length of a conductor circuit increases, radiated noise becomes more likely to be generated, however, in the optical element according to embodiments of the present invention, it may become possible to reduce the wiring length, and therefore it may become possible to improve reliability in high frequency signal (high speed signal) transmission.

Furthermore, as shown in FIG. 5, the length of wiring is different between a conductor circuit for connecting a p-side electrode to an IC chip and a conductor circuit for connecting an n-side electrode to an IC chip, and also the length of wiring is different between each channels, and as a result, skew is likely to occur. From this aspect as well, reliability as an optical element is not sufficient.

In addition, in the case where a multi-channel optical element is used, even if respective connection distances between p-side electrodes and an IC chip are the same, and respective connection distances between n-side electrodes and an IC chip are the same, the problem of skew incidence as mentioned above is remained unsolved when the connection distance between a p-side electrode and an IC chip and the connection distance between an n-side electrode and an IC chip is different, and further, if either of the connection distances becomes too long, the optical element sometimes tends not operate in high speed signal transmission.

In contrast, in the case of the optical element according to embodiments of the present invention, the wiring length may be able to be made equal, skew becomes less likely to occur, and the connection distance between the optical element and the IC chip may become able to be shortened, and as a result, a circuit suitable for a high speed signal transmission may be provided.

Next, a package substrate according to the embodiments of the present invention will be described.

The package substrate according to the embodiments of the present invention is a package substrate comprising: a substrate having conductor circuits formed on both sides thereof; and one or a plurality of optical elements and one or a plurality of optical element driving parts, each of which is mounted on the substrate, and in this structure, each of the optical elements and each of the optical element driving parts are connected through a plurality of conductor circuits each having almost the same length.

In the package substrate according to the embodiments of the present invention, optical elements and optical element driving parts are mounted, and both members are connected to each other through a plurality of conductor circuits each having almost the same length. As a result, even in transmission of a high frequency signal (high speed signal), generation and absorption of radiated noise may be able to be reduced, and thus it may become possible to carry out a highly reliable optical communication.

Moreover, since it is not necessary to wire conductor circuits which connect the optical elements and the optical element driving parts in the package substrate according to the embodiments of the present invention, it becomes possible to obtain superior degree of freedom in design of the package substrate, and mounting positions for the optical elements and optical element driving parts are less likely to be limited.

Furthermore, in the package substrate according to the embodiments of the present invention, when an optical path for transmitting an optical signal is formed, the position thereof is not likely to be limited.

In the package substrate according to the embodiments of the present invention, typically a solder resist layer is formed on the outermost layer. Also, typically a conductor circuit and an interlayer resin insulating layer are formed and laminated on both surfaces of the substrate.

In this specification, explanation will be given below on an embodiment of a package substrate, in which a conductor circuit and an interlayer resin insulating layer are laminated on both surfaces of a substrate, and a solder resist layer is further formed as the outermost layer. Here, the solder resist layer is not necessarily formed.

The material for the substrate and the interlayer resin insulating layer is not limited to a resin material, and the substrate and the insulating layer may be a ceramic material and the like.

In the package substrate according to the embodiments of the present invention, conductor circuits are formed on both surfaces of the substrate, as well as one or a plurality of optical elements and one or a plurality of optical element driving parts are mounted thereon.

Also, in the package substrate, an optical path for transmitting an optical signal is formed depending on need, and in this case, optical signals may become able to be transmitted through the optical path for transmitting an optical signal.

Furthermore, since an optical element is mounted on the package substrate, by connecting the package substrate with an external substrate such as a substrate for a motherboard having an optical waveguide and the like mounted thereon, exchange of information between the optical element mounted on the package substrate and an optical component mounted on the external substrate may become able to be performed by optical signals.

In the package substrate according to one embodiments of the present invention, one or a plurality of optical elements and one or a plurality of optical element driving parts are mounted.

There is no particular limitation on the optical element and the optical element driving part, as long as both members are connected to each other through a plurality of conductor circuits each having almost the same length, and concrete examples of the optical element include, for example, the optical elements according to the embodiments of the present invention described above. As is already described, the optical elements according to the embodiments of the present invention are suitable to be connected to optical element driving parts through linear conductor circuits each having the same length.

In addition, taking the structure of the package substrate or the demand characteristics, the optical element may be properly used.

Moreover, in the package substrate, an optical element driving part for driving the optical element is mounted thereon, and the optical elements and the optical element driving parts are connected to each other through a plurality of conductor circuits each having almost the same length.

As a result of this, as described above, even in the transmission of a high frequency signal (high speed signal), generation and absorption of radiated noise may be able to be reduced, and thus an excellent reliability can be achieved.

Examples of the optical element driving parts include a driving IC, an amplifier IC and the like.

Here, the optical element driving parts may be a kind which alone can drive a single-channel optical element, or a kind which can drive a multi-channel optical element.

The optical element driving parts may be a kind which is to be mounted by flip chip or by wire bonding.

In the package substrate according to the embodiments of the present invention, one or a plurality of optical elements and one or a plurality optical element driving parts are mounted.

Here, "one optical element is mounted" means that a single-channel optical element comprising one unit element is mounted, or a multi-channel optical element comprising a plurality of unit elements is mounted.

On the other hand, "a plurality of optical elements are mounted" means that a plurality of single-channel optical elements each comprising one unit element are mounted, or a plurality of multi-channel optical elements each comprising a plurality of unit elements are mounted.

Moreover, "one optical element driving part is mounted" means that one optical element driving part for driving a single-channel optical element is mounted, or one optical element driving part for driving one or a plurality of optical element or for driving a plurality of single-channel optical elements is mounted.

On the other hand, "a plurality of optical element driving parts are mounted" means that a plurality of optical element driving parts for driving one or a plurality of multi-channel optical elements or for driving a plurality of single-channel optical elements are mounted.

Examples of the structure of the optical path for transmitting an optical signal include a collective through hole structure, an individual through hole structure, a recess shape (cavity shape) and the like. The concrete structures of these are described in the following in reference to the drawings.

The optical path for transmitting an optical signal may be formed of only an opening, or a portion or the entirety thereof may be formed of a resin composite. Here, as will be described in the following, the optical path for transmitting an optical signal is not necessarily formed.

In the case where the optical path for transmitting an optical signal is formed of an opening, the formation thereof is easy; while in the case where a portion or the entirety of the optical path for transmitting an optical signal is formed of a resin composite, dust or a foreign matter becomes less likely to enter in the optical path for transmitting an optical signal.

The resin component of the resin composite is not particularly limited as long as it has little absorption in the wavelength band for communication, and a thermosetting resin, a thermoplastic resin, a photosensitive resin and a resin of which a portion of a thermosetting resin is converted to have photosensitivity can be cited as examples.

Specifically, an epoxy resin, an UV (ultraviolet) curing epoxy resin, a polyolefin based resin, an acryl resin such as PMMA (polymethyl methacrylate), deuterated PMMA and deuterated PMMA fluoride, a polyimide resin such as polyimide fluoride, a silicone resin such as a deuterated silicone resin, a polymer manufactured from benzocyclobutene and the like can be cited as examples.

In addition, the resin composite may include particles, for example, resin particles, inorganic particles or metal particles in addition to the resin component. The matching of the coefficient of thermal expansion may be able to be achieved between the optical path for transmitting an optical signal and the substrate, the interlayer resin insulating layer or the solder resist layer and the like by including these particles and, in addition, it may become possible to impart incombustibility depending on the kind of particles.

Examples of the particles include inorganic particles, resin particles, metal particles and the like.

As for the inorganic particles, particles comprising aluminum compounds such as alumina and aluminum hydroxide, calcium compounds such as calcium carbonate and calcium hydroxide, potassium compounds such as potassium carbonate, magnesium compounds such as magnesia, dolomite, basic magnesium carbonate and talc, silicon compounds such as silica and zeolite, titanium compounds such as titania can be cited as examples. In addition, particles having a mixed component where at least two kinds of inorganic materials are mixed and melted together may be used.

Examples of the resin particles include particles made of, for example, a thermosetting resin, a thermoplastic resin, and the like, and concrete examples thereof include particles made of an amino resin (such as a melamine resin, a urea resin and a guanamine resin), an epoxy resin, a phenolic resin, a phenoxy resin, a polyimide resin, a polyphenylene resin, a polyolefin resin, a fluorine resin, a bismaleimide-triazine resin and the like.

Examples of the metal particles include gold, silver, copper, tin, zinc, a stainless steel, aluminum, nickel, iron, lead and the like. It is desirable for the surface layer of the metal particles to be coated with a resin or the like in order to secure insulating properties.

In addition, these particles may be solely used or two or more kinds may be used together.

It is desirable for the particle diameter of the particles to be smaller than the transmission wavelength.

In addition, the lower limit of the particle diameter is desirably set to about 0.01 μm, more desirably set to about 0.1 μm and furthermore desirably set to about 0.2 μm. Meanwhile, the upper limit of the particle diameter is desirably set to about 0.8 μm and more desirably set to about 0.6 μm.

Here, in the present specification, the particle diameter means the length of the longest portion of particles.

The lower limit of the amount of the mixed particles contained in the resin composite is desirably set to about 10% by weight and the upper limit is desirably set to about 50% by weight. This is because, in the case where the amount of the mixed particles is about 10% by weight or more, it becomes easier to exert the effects of mixing particles, while in the case where the amount of the mixed particles is about 50% by weight or less, it may become possible to prevent the optical path for transmitting an optical signal from having difficulty in being filled in with the resin composite. The more desirable lower limit of the amount of the mixed particles is about 20% by weight and the more desirable upper limit of the amount of the mixed particles is about 40% by weight.

In addition, the optical path for transmitting an optical signal desirably has a transmittance for light having a wavelength for communication of about 70%/mm or more. This is because, in the case where the transmittance for light having a wavelength for communication is about 70%/mm or more, it becomes possible to prevent the loss of the optical signal from becoming great, and thus lowering of the transmission property of the optical signal is unlikely to be caused. It is more desirable for the transmittance to be about 90%/mm or more.

Here, in the present specification, the transmittance of light having a wavelength for communication means a transmittance per a distance of 1 mm of light having a wavelength for communication. More specifically, the above-mentioned transmittance is a value obtained by calculation of the following equation (1), when, for example, light with intensity of $I_1$ comes into an optical path for transmitting an optical signal, passes through 1 mm in the optical path for transmitting an optical signal, and comes out with intensity of $I_2$.

$$\text{Transmittance}(\%) = (I_2/I_1) \times 100 \quad (1)$$

The above-mentioned transmittance is the transmittance measured at a temperature of 25° C. to 30° C.

In the package substrate according to one embodiment of the present invention, in the case where at least portions penetrating the substrate and the interlayer resin insulating layer of the optical path for transmitting an optical signal are filled in with a resin composite, the cross-sectional diameter of the portion penetrating the solder resist layer, among the optical path for transmitting an optical signal, may be smaller than the cross-sectional diameter of the portion formed in the substrate and the interlayer resin insulating layer.

This is because, when the cross-sectional diameter of the portion penetrating the solder resist layer is smaller than the cross-sectional diameter of the portion penetrating the substrate and the interlayer resin insulating layer, a boundary portion of the portion penetrating the interlayer resin insulating layer of the optical path for transmitting an optical signal and a resin composite is covered over by the portion of the solder resist layer, and the neighborhood of the boundary portion and an outer border of the resin composite are bonded by solder resist layer. As a result, occurrence of separations or cracks between the resin composite and the substrate and the interlayer resin insulating layer are less likely to occur, further improving the reliability of the package substrate.

A gap adjacent to each of the above-described optical elements on the substrate side may be filled in with an underfill. By filling the optical element with an underfill, it may become possible to prevent dust or a foreign matter from entering into the area where an optical signal passes through, and thus it may become possible to prevent interruption of the optical signal transmission.

The material of the underfill is not particularly limited, and a thermosetting resin, a photosensitive resin, a resin where a photosensitive group is added to a portion of a thermosetting resin, or a resin compound which includes these resins and a thermoplastic resin, for example, can be used. In addition, a commercially available resin for underfill can be used.

In addition, when the underfill is formed at a site where a optical signal passes through, the transmittance for the light having a wavelength for communication is desirably set to about 70%/mm or more. This is because, when the transmittance for the light having a wavelength for communication is about 70%/mm or more, the loss of the optical signal may be prevented from becoming great, and thus lowering of the transmission property of the optical signal is unlikely to be caused. The transmittance is more desirably set to about 90%/mm or more.

Here, a refractive index of the underfill is not particularly limited, but it is normally at least about 1.4 and at most about 1.6. This is because, when the refractive index of the underfill is within the above-described range, it becomes easier to manufacture the material (underfill) whose refractive index is controlled, and in particular, it may become possible to surely carry out the transmission of an optical signal with the optical path for transmitting an optical signal formed of a resin composite.

Examples of the thermosetting resin include an epoxy resin, a phenolic resin, a polyimide resin, a polyester resin, a bismaleimide resin, a polyolefin based resin, a polyphenylene ether resin, a polyphenylene resin, a fluorine resin and the like.

An acryl resin can be cited as an example of the above-described photosensitive resin.

In addition, as for the resin where a photosensitive group is added to a portion of the above-described thermosetting resin, a resin gained by making the thermosetting group of any of the above-described thermosetting resins and methacrylic acid or acrylic acid react with each other in order to bring about acrylic conversion can be cited as an example.

As for the above-described thermoplastic resin, a phenoxy resin, polyether sulfone (PES), polysulfone (PSF), polyphenylene sulfone (PPS), polyphenylene sulfide (PPES), polyphenylene ether (PPE) and polyether imide (PI) and the like can be cited as examples.

In addition, the above-described underfill may include particles. In the case where particles are included, the coefficient of thermal expansion may become able to be adjusted by the amount of mixture, and therefore, matching of the coefficient of thermal expansion may become able to be achieved between the underfill and the package substrate or the optical element.

The same particles as those included in the optical path for transmitting an optical signal can be cited as concrete examples of the above-described particles.

In addition, in the case where the particles are included in the above-described underfill, the lower limit of the amount of the particles to be mixed is desirably set to about 20% by weight, and the upper limit is desirably set to about 70% by weight. This is because the amounts within this range are usually appropriate for matching the coefficients of thermal expansion between the package substrate and the optical element, and the liquidity required at the time of filling is also provided.

A more desirable lower limit is set to about 30% by weight, and a more desirable upper limit is set to about 60% by weight.

In the package substrate according to the embodiments of the present invention, a microlens may be provided at the side opposite to the side on which each of the optical elements is mounted on the optical path for transmitting an optical signal.

When a microlens is provided, a transmission light tends not to be diffused (a transmission light is more easily focused) and thus transmission of an optical signal may be able to be more certainly carried out.

In the above case, for example, an optical path for transmitting an optical signal, which penetrates a substrate, an interlayer resin insulating layer and a solder resist layer of the package substrate, is formed, and when the portion penetrating the substrate and the interlayer resin insulating layer is filled in with a resin composite, a microlens only is to be provided at the end portion of the resin composite where the solder resist layer penetrates.

The microlens is not particularly limited and any microlenses used as an optical lens can be exemplified, and concrete examples of the material thereof include optical glass and resins for an optical lens. Examples of the resins for an optical lens include an acryl resin, an epoxy resin and the like, which are the same materials as the polymer materials described to be used as the resin composite to be filled in the above-described optical path for transmitting an optical signal.

In addition, in the case where a microlens is provided as well as the underfill is formed, it is desirable for the refractive index of the microlens to be greater than the refractive index of the underfill.

This is because, in this case, the optical signal is condensed during transmission, and thus the transmission loss may be reduced.

In addition, as for the form of the above-described microlens, a convex lens having a convex surface only on one side can be cited as an example and in this case the radius of curvature of the convex surface of the lens can be appropriately selected, taking the design of the optical path for transmitting an optical signal into consideration. Specifically, in the case where it is necessary to make the focal distance long, for example, it is desirable to make the radius of curvature long, while in the case where it is necessary to make the focal distance short, it is desirable to make the radius of curvature short.

Here, the form of the above-described microlens is not limited to a convex lens, and any form which can condense an optical signal in a desired direction may be used. As a concrete example thereof, a flat graded index lens may be cited.

It is desirable for the above-described microlens to have a transmittance for light having a wavelength for communication of about 70%/mm or more.

In the case where the transmittance for light having a wavelength for communication is about 70%/mm or more, the loss of the optical signal may be prevented from becoming great, and thus lowering of the transmission property of the optical signal is unlikely to be caused. It is more desirable for the above-described transmittance to be about 90%/mm or more.

In addition, the microlens may include particles such as resin particles, inorganic particles and metal particles.

This is because, by including particles, the strength of the microlens is increased so that it may become possible to maintain the form more certainly, and also it may become possible to match the coefficient of thermal expansion between the microlens and the above-described substrate or interlayer resin insulating layer, and thus, cracks and the like due to the difference in the coefficient of thermal expansion become less likely to occur.

In the case where the above-described microlens includes particles, desirably the refractive index of the resin component of the microlens and the refractive index of the above-described particles are approximately the same. Therefore, it is desirable for the particles included in the microlens to be a mixture of particles of two or more kinds having different indexes of refraction so that the refractive index of the particles becomes approximately the same as the refractive index of the resin component.

Specifically, in the case where the resin component is an epoxy resin having an refractive index of 1.53, for example, it is desirable for the particles included in the microlens to be particles which are obtained by mixing and melting silica particles having an refractive index of 1.46 and titania particles having an refractive index of 2.65.

Here, as for the method for mixing particles, a method of kneading particles and a method for melting and mixing two or more kinds of particles and after that, converting the mixture into particle form, and the like can be cited.

Here, the same kinds of particles as those mixed in the optical path for transmitting an optical signal can be cited as concrete examples of the above-described particles.

Though the particle diameter of the above-described particles is not particularly limited, it is desirable for the upper limit thereof to be about 0.8 μm and the lower limit thereof to be about 0.01 μm.

The above-described microlens is usually provided using an inkjet apparatus or a dispenser, because, among presently used apparatuses, 20 μm is the smallest size for the inner diameter of the application nozzle of inkjet apparatuses and the inner diameter of the nozzle of dispensers, and thus, it may become possible to carry out application without clogging the nozzle in the case where the particle diameter is within the above-described range.

In addition, the lower limit of the particle diameter is more desirably set to about 0.1 μm.

The particle diameter within this range is more desirable from the viewpoint of stability in the viscosity for the application by means of inkjet apparatuses and dispensers and inconsistency in the applied amount.

A desirable lower limit of the amount of mixed particles included in the microlens is about 5% by weight, and a more desirable lower limit is about 10% by weight. Meanwhile, a desirable upper limit of the amount of mixed particles is about 60% by weight and a more desirable upper limit is about 50% by weight. This is because, in the case where the amount of mixed particles is about 5% by weight or more, the effects due to mixing of particles may be more easily obtained, and in the case where the amount of mixed particles is about 60% by weight or less, transmission of an optical signal may become less likely to be obstructed.

In the case where the microlens is provided, as described above, the microlens may be disposed to the end portion and the like of the resin composite directly or by interposing an optical adhesive. With this arrangement, it becomes easier to certainly dispose the microlens, which have been separately manufactured, at predetermined positions, and therefore the microlens is more easily disposed.

Among the above two options, desirably, the microlens is directly disposed. With this arrangement, the microlens may be able to be formed accurately by using an inkjet apparatus or a dispenser, as described above.

The optical adhesive is not particularly limited and optical adhesives such as an epoxy resin based adhesive, an acryl resin based adhesive and a silicone resin based adhesive can be used.

It is desirable for the optical adhesive to have the characteristics of a viscosity of at least about 0.2 Pa·s and at most about 1.0 Pa·s, an refractive index of at least about 1.4 and at most about 1.6, an optical transmittance of about 80%/mm or more, and a coefficient of thermal expansion (CTE) of at least about $4.0 \times 10^{-5}$ (/° C.) and at most about $9.0 \times 10^{-5}$ (/° C.).

In addition, the thickness of the optical adhesive is desirably about 50 μm or less.

In the case where microlenses are provided as described above, a surface treatment may be carried out on the region where they are provided.

When a resin for the formation of microlenses is applied by means of an inkjet apparatus and the like, the form of microlenses, in particular the degree of sagging, easily becomes uneven due to the inconsistent wettability of the portions on which microlenses are provided which is caused by the inconsistent conditions in the process up to the formation of the solder resist layer and due to the difference in time for allowing the resin to stand; however, the unevenness in the degree of sagging may be more easily reduced by carrying out a surface treatment and the like using a water repellent coating agent.

As for the above-described surface treatment, a process using a water repellent coating agent such as a fluorine based polymer coating agent (surface tension: about 10 mN/m to about 12 mN/m), a water repellent treatment using $CF_4$ plasma and a hydrophilic process using $O_2$ plasma can be cited as examples.

Here, in the present specification, the degree of sagging of microlenses means the height in portions which protrude from the surface of the solder resist layer. When the solder resist layer is not formed on the package substrate, the degree of sagging of microlenses means the height in portions which protrude from the surface of the outermost layer.

In the package substrate according to the embodiments of the present invention, when a solder resist layer is formed as the outermost layer, the lower limit of the thickness of the solder resist layer is desirably set to about 10 μm, and more desirably set to about 15 μm. On the other hand, the upper limit thereof is desirably set to about 40 μm, and more desirably set to about 30 μm.

In the package substrate according to the embodiments of the present invention, the conductor circuits having the substrate in between are desirably connected through a through hole, and the conductor circuits having the interlayer resin insulating layer in between are desirably connected through a via hole. This is because, with this arrangement, it may become possible for the package board to achieve a high density wiring, and also to be made smaller.

The following description explains the package substrate according to embodiments of the present invention in reference to the drawings.

Figure 6:
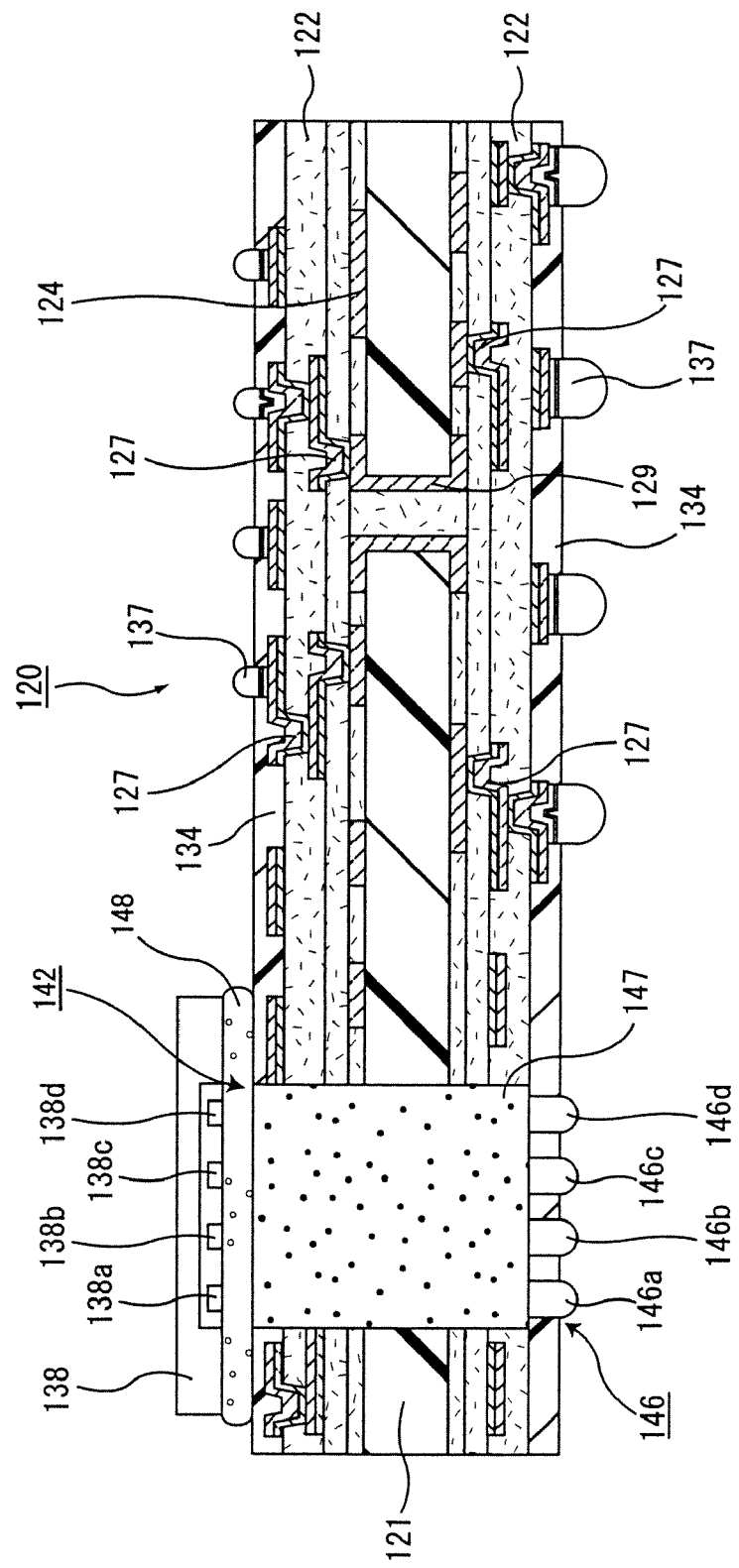
FIG. 6 is a cross-sectional view that schematically shows one example of a package substrate according to one embodiment of the present invention.

FIG. 6 is a cross-sectional view that schematically shows the package substrate according to one embodiment of the present invention.

As shown in FIG. 6, in a package substrate 120, conductor circuits 124 and interlayer resin insulating layers 122 are formed and laminated on both sides of a substrate 121, and conductor circuits having the substrate 121 in between are electrically connected to each other by means of a through hole 129, and conductor circuits having the interlayer resin insulating layer 122 in between are electrically connected to each other by means of via holes 127. In addition, solder resist layers 134 are formed as the outermost layers.

In this package substrate 120, an optical path 142 for transmitting an optical signal is provided so as to penetrate through the substrate 121, the interlayer resin insulating layers 122 and solder resist layers 134. Here, the portions which penetrate through the substrate 121 and the interlayer resin insulating layers are collectively formed with a size that may allow an optical signal to be transmitted from all of the light emitting portions 138a to 138d of the light emitting element 138, and the portions which penetrate through the solder resist layer are individually formed depending on the positions where the light emitting portions 138a to 138d are formed.

In this optical path for transmitting an optical signal 142, the portions which penetrate through the substrate 121 and the interlayer resin insulating layers 122 are filled in with a resin composite 147.

Here, a conductor layer may be formed around the periphery of the above-described optical path for transmitting an optical signal.

A light emitting element 138 having four channels is surface mounted on one surface of the package substrate 120 via solder connection portions (not shown) so that each of the light emitting portions 138a to 138d face the optical path 142 for transmitting an optical signal, and at the same time, an IC chip (not shown) such as a driving IC is surface mounted via solder connection portions (not shown). In addition, on the other surface of the package substrate 120, solder bumps 137 are formed on the solder resist layer 134.

Here, the solder connection portions for mounting an optical element are connected to external electrodes and dummy electrodes formed on the optical element.

Also, the light emitting element 138 and the driving IC and the like are connected through linear conductor circuits each having the same length as shown in FIG. 3.

A gap adjacent to the light emitting element 138 on the side of the substrate 121 (a gap between the light emitting element 138 and the solder resist layer 134, and a gap between the light emitting element 138 and the resin composite 147) is filled in with an underfill 148. Here, the underfill may not necessarily be filled.

Microlenses 146 (146a to 146d) are directly provided at each of the portions of the optical path 142 for transmitting an optical signal penetrating through the solder resist layer of the optical path 142 for transmitting an optical signal, and located at the opposite side of the side where the optical element is mounted.

In the package substrate 120 having such a configuration, an electrical signal from the IC chip 140 is converted into an optical signal in the light emitting element 138, and then transmitted to external optical parts or the like via the underfill 148, the optical path 142 for transmitting an optical signal, and the microlenses 146a to 146d.

As described above, in the package substrate according to the embodiment of the present invention, each of the conductor circuits connecting an optical element and an IC chip (optical element driving part) is linear and has the same length with the others. Consequently, the package substrate is highly reliable in signal transmission, and may be possible to be used for higher speed communications.

In the package substrate 120, the solder bumps 137 are formed on the solder resist layer 134 by interposing a metal plating layer, and therefore, an signal between the IC chip and an external substrate or the like can be also electrically transmitted via the solder bumps 137.

When the solder bumps are formed in the above-described manner, the package substrate can be connected to an external substrate such as a substrate for a motherboard via the solder bumps, and in this case the package substrate may be able to be placed at a predetermined position by the self-alignment function of solders.

Here, the self-alignment function means a function of solders which tends to exist in a more stable form in the vicinity of the center of openings for forming solder bumps due to the liquidity of the solders themselves at the time of reflow processing, and this function occurs presumably because the solders are repelled by the solder resist layer and a strong surface tension works to make the solders in spherical form when the solders adhere to metals.

In the case where this self-alignment function is used, when the package substrate is connected to the external substrate via the solder bumps, the package substrate moves at the time of reflow so that the package substrate may become able to be attached to the external substrate at the precise position, even if a positional error exists between the package substrate and the external substrate before reflow.

Accordingly, in the case where an optical signal is transmitted between the optical element mounted on the package substrate and an external optical part via the optical path for transmitting an optical signal, it becomes easier for the optical signal to be transmitted precisely between the package substrate and the external substrate if the mounting position of the optical element mounted on the substrate is precise.

In addition, in the package substrate on which a multi channel optical element is mounted as described above, the diameter of the microlens that is provided on an end portion of the optical path for transmitting an optical signal may be appropriately determined in accordance with the pitch between respective channels in the array element, and in the case where an array element having a pitch of 250 μm is used, for example, the diameter is desirably set to at least about 100 μm and at most about 240 μm, and more desirably set to at least about 180 μm and at most about 230 μm. This is because, in the case where the diameter is about 100 μm or more, it may be possible to obtain a desired focal distance more easily, and in the case where the diameter is about 240 μm or less, adjacent microlenses may become less likely to make contact with each other and thus it may become possible to place the microlenses at predetermined positions more easily.

In addition, in the case where an array element having a pitch of about 500 μm is used, for example, it is desirable for the diameter to be at least about 100 μm and at most about 490 μm, and it is more desirable for the diameter to be at least about 180 μm and at most about 480 μm. This is because, in the case where the diameter is about 100 μm or more, it becomes possible to obtain a desired focal distance more easily, and in the case where the diameter is about 490 μm or less, adjacent microlenses may become less likely to make contact with each other and thus it becomes possible to place the microlenses at predetermined positions more easily.

With regard to the form of the optical path for transmitting an optical signal in the collective through hole structure, around pillar, a rectangular pillar, an oval pillar, and a form where a number of round pillars are aligned in parallel and portions of side faces of adjacent round pillars are connected to each other, and a pillar form having a bottom face framed by a line and an arc can be cited as examples.

In addition, in the case where the form of the optical path for transmitting an optical signal is a form where a number of round pillars are aligned in parallel and portions of side faces of adjacent round pillars are connected to each other, a dummy round pillar, which does not actually function as an optical path for transmitting an optical signal, may be formed among some of the round pillars thereof.

In addition, it is desirable for the planar shape of the optical path for transmitting an optical signal having a collective through hole structure (planar shape of the portion which penetrates through the substrate and the interlayer resin insulating layers in the structure shown in FIG. 6) to be an almost rectangle or an almost ellipse having a size of at least about 100 μm and at most about 5 mm with respect to each of the length and width thereof. Here, in the case where the planar shape is an almost ellipse, the longer diameter and the shorter diameter are desirably set within the above range.

Moreover, the planar shape of the optical path for transmitting an optical signal may be an almost circle, and in this case, the diameter thereof is desirably set within the above range.

In the case where the size of the planar shape is about 100 μm or more, transmission of an optical signal tends not to be obstructed, while in the case where the diameter exceeds about 5 mm, transmission of an optical signal is not improved in terms of the loss, and miniaturization of the package substrate becomes difficult, and thus from this point of view, the diameter is desirably about 5 mm or less.

Figure 7:
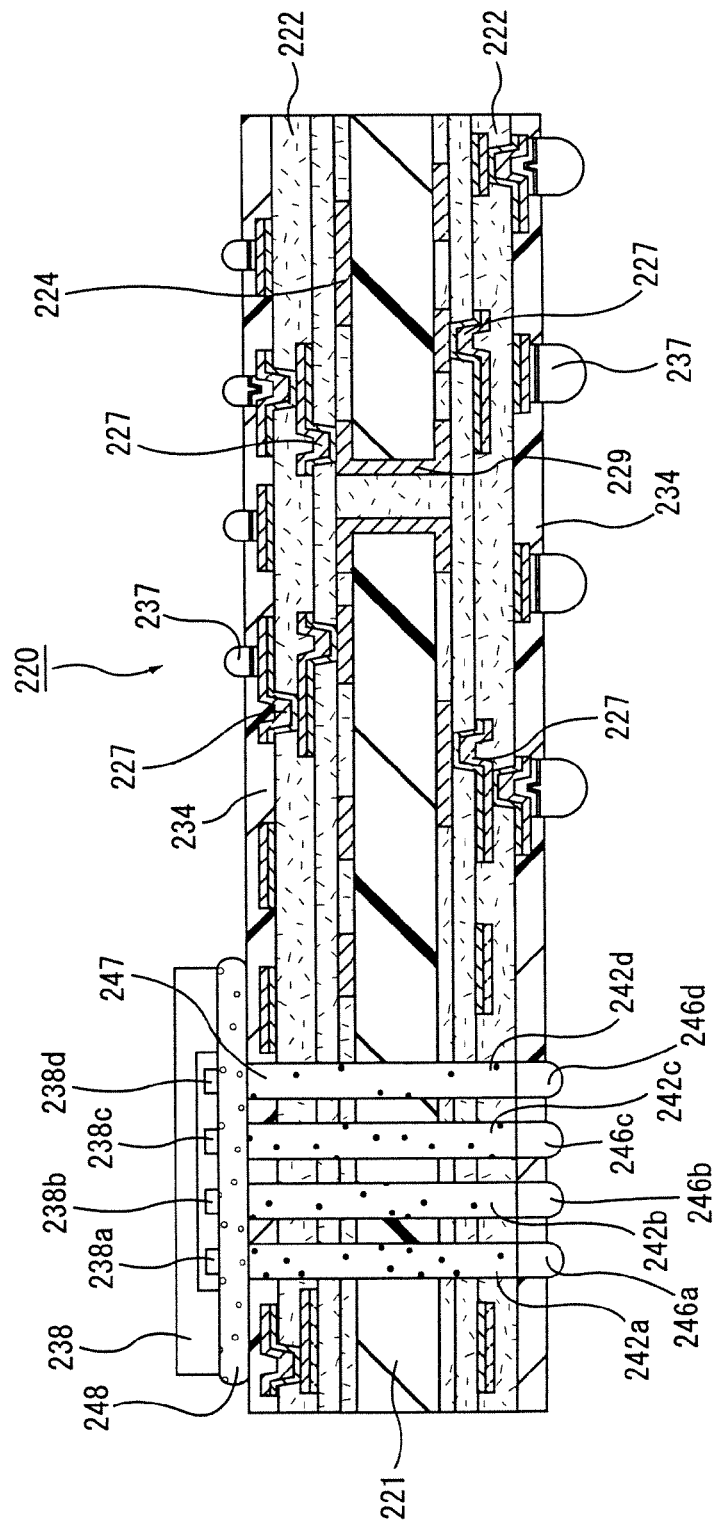
FIG. 7 is a cross-sectional view that schematically shows another example of a package substrate according to one embodiment of the present invention.

FIG. 7 is a cross-sectional view that schematically shows the package substrate according to another embodiment of the present invention.

The structure of a substrate 220 as shown in FIG. 7 is the same with that of the package substrate 120 as shown in FIG. 6, except that the shape of optical path for transmitting an optical signal is different. Therefore, only the shape of optical path for transmitting an optical signal is to be described in detail here.

Four independent optical paths 242a to 242d for transmitting an optical signal are provided in the package substrate 220 shown in FIG. 7 so as to penetrate through a substrate 221, interlayer resin insulating layers 222 and solder resist layers 234.

In these optical paths 242a to 242d for transmitting an optical signal, the portions penetrating through the substrate 221 and interlayer resin insulating layers 222 are filled in with a resin composite 247.

A light emitting element 238 having four channels is surface mounted on one surface of the package substrate 220 via solder connection portions (not shown) so that each of the light emitting portions 238a to 238d corresponds with each of the optical paths 242a to 242d for transmitting an optical signal, respectively.

Accordingly, an optical signal from the light emitting element 238 having four channels may become able to be transmitted via any of the optical paths 242a to 242d for transmitting an optical signal. Here, the individual optical paths for transmitting an optical signal are independently formed, so that each may be able to transmit an optical signal from each of the light emitting portions 238a to 238d of the light emitting element having four channels.

The solder connection portions for mounting an optical element are connected to external electrodes and dummy electrodes formed on the light emitting element. Also, the optical element 238 and the driving IC (not shown) are connected through linear conductor circuits each having the same length as shown in FIG. 3.

In addition, a gap adjacent to the light emitting element 238 on the side of the substrate 221 (a gap between the light emitting element 238 and the solder resist layer 234, and a gap between the light emitting element 238 and the resin composite 247) is filled in with an underfill 248.

In addition, microlenses 246a to 246d are directory provided at each of the portions of the optical paths 242a to 242d for transmitting an optical signal penetrating the solder resist layer on the side opposite to the light emitting element of the optical paths 242a to 242d for transmitting an optical signal. Here, in FIG. 7, the numerical reference 237 shows solder bumps.

In the package substrate 220 having the above mentioned configuration, an electrical signal from the IC chip (driving IC) is converted into an optical signal in the light emitting element 238, and then transmitted to external optical parts or the like via the underfill 248, the optical paths 242a to 242d for transmitting an optical signal, and the microlenses 246a to 246d.

Here, with regard to the diameter of the planar shape (the cross sectional diameter) of each optical path for transmitting an optical signal, the lower limit thereof is desirably set to about 100 μm, and the upper limit thereof is desirably set to about 500 μm. In the case where the diameter is about 100 μm or more, the optical paths may be less likely to be clogged and the difficulty in filling an uncured resin composite in the optical paths for transmitting an optical signal may be unlikely to occur. Meanwhile, in the case of the diameter exceeding about 500 μm, the transmission property for an optical signal is hardly increased, and freedom in design of the conductor circuits and the like that form the package substrate may be hindered, and thus from this point of view, the diameter is desirably about 500 μm or less.

A more desirable lower limit for the diameter is about 250 μm, and a more desirable upper limit for the diameter is about 350 μm.

Here, the cross sectional diameter of the portion of the optical paths for transmitting an optical signal which penetrates through the substrate and the interlayer resin insulating layers means the diameter of the cross section in the case where the optical paths for transmitting an optical signal are in a round pillar shape, the long diameter of the cross section in the case where the optical paths for transmitting an optical signal are in an oval pillar shape, and the length of the longest portion in the cross section in the case where the optical paths for transmitting an optical signal have a rectangular or a polygonal pillar shape. In addition, in the present invention, cross section of the optical paths for transmitting an optical signal means the cross section in parallel with the main surface of the package substrate.

In the package substrate of this embodiment also, an appropriate diameter may be determined for the microlenses which are provided on end portions of the optical paths for transmitting an optical signal in accordance with the pitch between the channels in the array element, and in the case where an array element having a pitch of 250 μm is used, for example, the diameter of the microlenses is desirably set to at least about 100 μm and at most about 190 μm. This is because, in the case where the diameter is about 100 μm or more, a desired focal distance can be more easily obtained, and in the case where the diameter is about 190 μm or less, the diameter tends not to be larger than the diameter of each optical path for transmitting an optical signal, and thus the above diameter is suitable for forming the microlens at an end portion of each optical path for transmitting an optical signal. Here, in this case, the diameter of the optical paths for transmitting an optical signal is desirably set to at least about 150 μm and at most about 200 μm.

In the case where an array element having a pitch of about 500 μm is used, for example, it is desirable for the diameter to be at least about 100 μm and at most about 490 μm, and it is more desirable for the diameter to be in the range of about 180 μm to about 480 μm. This is because, in the case where the diameter is about 100 μm or more, a desired focal distance may be more easily obtained, and in the case where the diameter is about 490 μm or less, the diameter tends not to be larger than the diameter of each optical path for transmitting an optical signal, and thus the above diameter is suitable for forming the microlens at an end portion of each optical path for transmitting an optical signal. In this case, the diameter of the optical path for transmitting an optical signal is desirably set to at least about 150 μm and at most about 450 μm.

The reason why it is desirable for the diameter of the individually formed optical paths for transmitting an optical signal to be about 150 μm or more is as follows.

That is to say, the optical paths for transmitting an optical signal in the above-described embodiment are formed by forming through holes which penetrate through the substrate, the interlayer resin insulating layers and the solder resist layers, and then filling the through holes with a resin composite if necessary; in this process, the through holes are usually formed by using a drill, and when the through holes are formed by a drilling process, it is difficult to form a through hole having a diameter of less than about 150 μm.

Moreover, the desirable upper limit of the diameter of each individually formed optical path for transmitting an optical signal is to be decided depending on the pitch of the optical element as described above, and as long as the diameter is within the above range, there may be almost no risk of contact between adjacent optical paths for transmitting an optical signal. Furthermore, the transmission light does not hit the wall surface of the optical path for transmitting an optical signal, and therefore it becomes easier to carry out optical signal transmission with low optical transmission loss.

Examples of the form of each of the optical paths for transmitting an optical signal having the individual through hole structure include a round pillar, a rectangular pillar, an oval pillar, a pillar having a bottom face framed by a linear line and an arc, and the like.

When a microlens is mounted in the package substrate according to the embodiments of the present invention, in place of the microlenses which are independent to each other, a microlens array in which a plurality of lens are placed in parallel to each other, may be provided by interposing an adhesive agent.

Though the package substrates shown in FIGS. 6 and 7 are examples where a light emitting element is mounted as an optical element according to the embodiments of the present invention, a light receiving element may be mounted on the package substrate according to the embodiments of the present invention instead of the light emitting element, or a light emitting element and a light receiving element may be simultaneously mounted together.

Moreover, the number of channels of the optical element that is mounted on the package substrate is not limited to four channels but may be one channel or two, three, five or more channels.

In addition, the package substrate according to the embodiments of the present invention may be a package substrate where an optical path for transmitting an optical signal in a recess shape (cavity shape) is formed.

Figure 8:
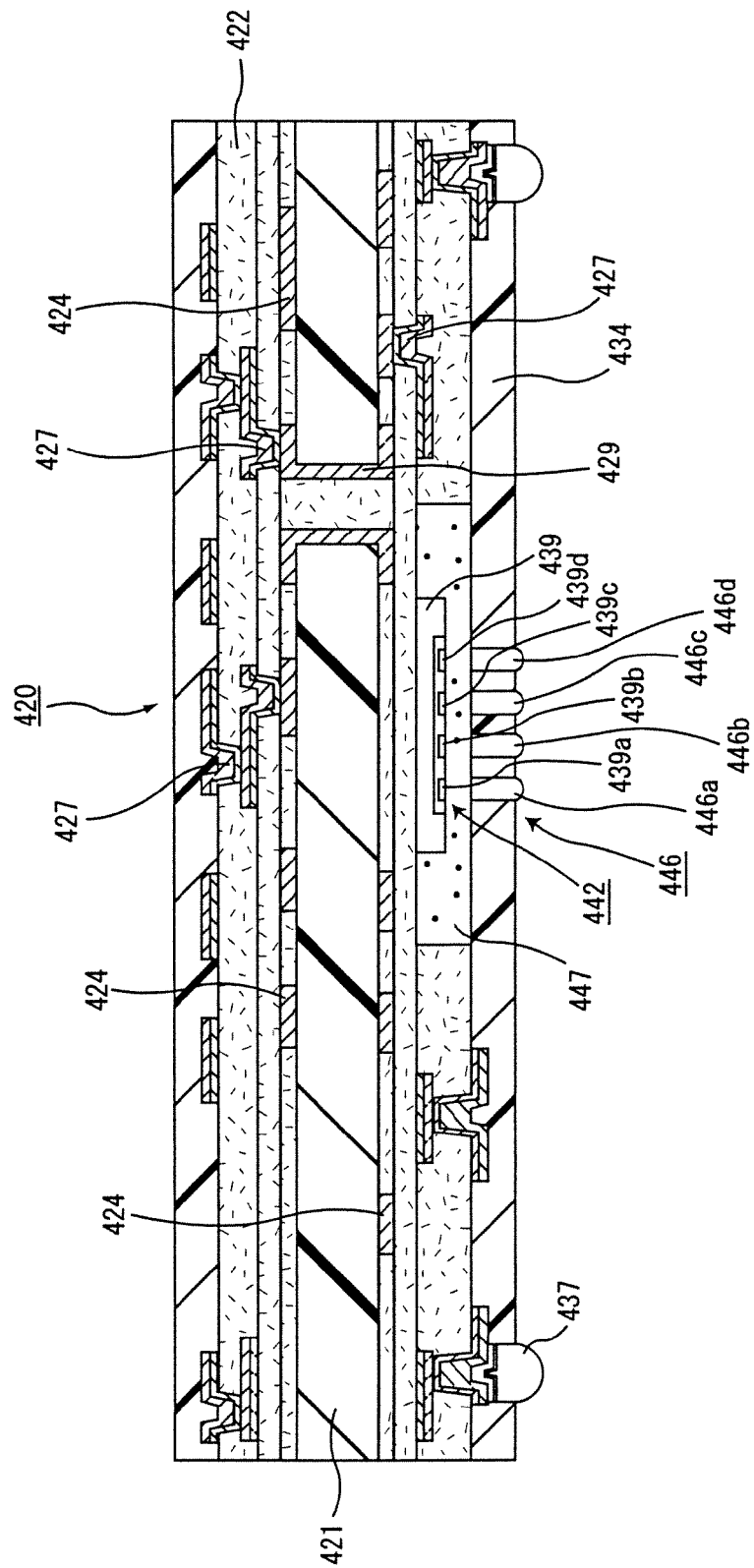
FIG. 8 is a cross-sectional view that schematically shows another example of a package substrate according to one embodiment of the present invention.

The following description briefly explains a package substrate according to the embodiments where an optical path for transmitting an optical signal in a recess shape (cavity shape) is formed. FIG. 8 is a cross sectional view schematically showing another embodiment of a package substrate according to embodiments of the present invention. FIG. 8 shows an example in which a light receiving element is mounted as an optical element.

In a package substrate 420, conductor circuits 424 and interlayer resin insulating layers 422 are formed and laminated on both sides of a substrate 421, and conductor circuits having the substrate 421 in between are electrically connected to each other through a through hole 429, and conductor circuits having an interlayer resin insulating layer 422 in between are electrically connected to each other through via holes 427. In addition, solder resist layers 434 are formed as the outermost layers.

In this package substrate 420, an optical path 442 for transmitting an optical signal in a recess shape (cavity shape) is provided.

Within this optical path 442 for transmitting an optical signal, a light receiving element 439 and an IC chip (not shown) such as a driving IC are mounted by wire bonding (not shown), and further the portions of the optical path 442 for transmitting an optical signal formed in interlayer resin insulating layers 422 are filled in with a resin composite 447.

Here, the light receiving element is an optical element according to the embodiments of the present invention, in which external electrodes for connecting to the predetermined positions by wire bonding are placed.

That is, external electrodes (not shown) are formed at the position in the vicinity of an IC chip of the light receiving element 439, and the external electrodes and the conductor circuit are connected by wire bonding. Further, the light receiving element 439 and the driving IC are connected to one another through linear conductor circuits each having the same length.

Here, a light emitting element to be mounted by flip chip may be mounted on a package substrate according to the embodiment having an optical path for transmitting an optical signal in a recess shape (cavity shape), and in this case, external electrodes may be formed on the surface opposite to the surface where a light emitting portion is formed.

Microlenses 446 (446a to 446d) are provided at portions of the optical path 442 for transmitting an optical signal which penetrate through the solder resist layer 434, at an end portion on the side opposite to the side where the light receiving element 439 of the resin composite 442 is mounted. In FIG. 8, the numerical reference 437 shows solder bumps.

A package substrate with this kind of embodiment is also the package substrate according to the embodiments of the present invention.

Moreover, as each light emitting element or light receiving element, a plurality of light emitting elements or a plurality of light receiving elements may be mounted on the package substrate according to the embodiments of the present invention. Specifically, for example, in an embodiment of the package substrate shown in FIG. 6, four individual single-channel light emitting elements may be mounted in place of a four-channel light emitting element.

In the package substrates in FIGS. 6 to 8 according to the embodiments of the present invention shown, an optical path for transmitting an optical signal is formed; however, the package substrate according to the embodiments of the present invention does not necessarily have an optical path for transmitting an optical signal formed therein. The following description briefly explains one embodiment of a package substrate in which no optical path for transmitting an optical signal is formed.

Figure 9:
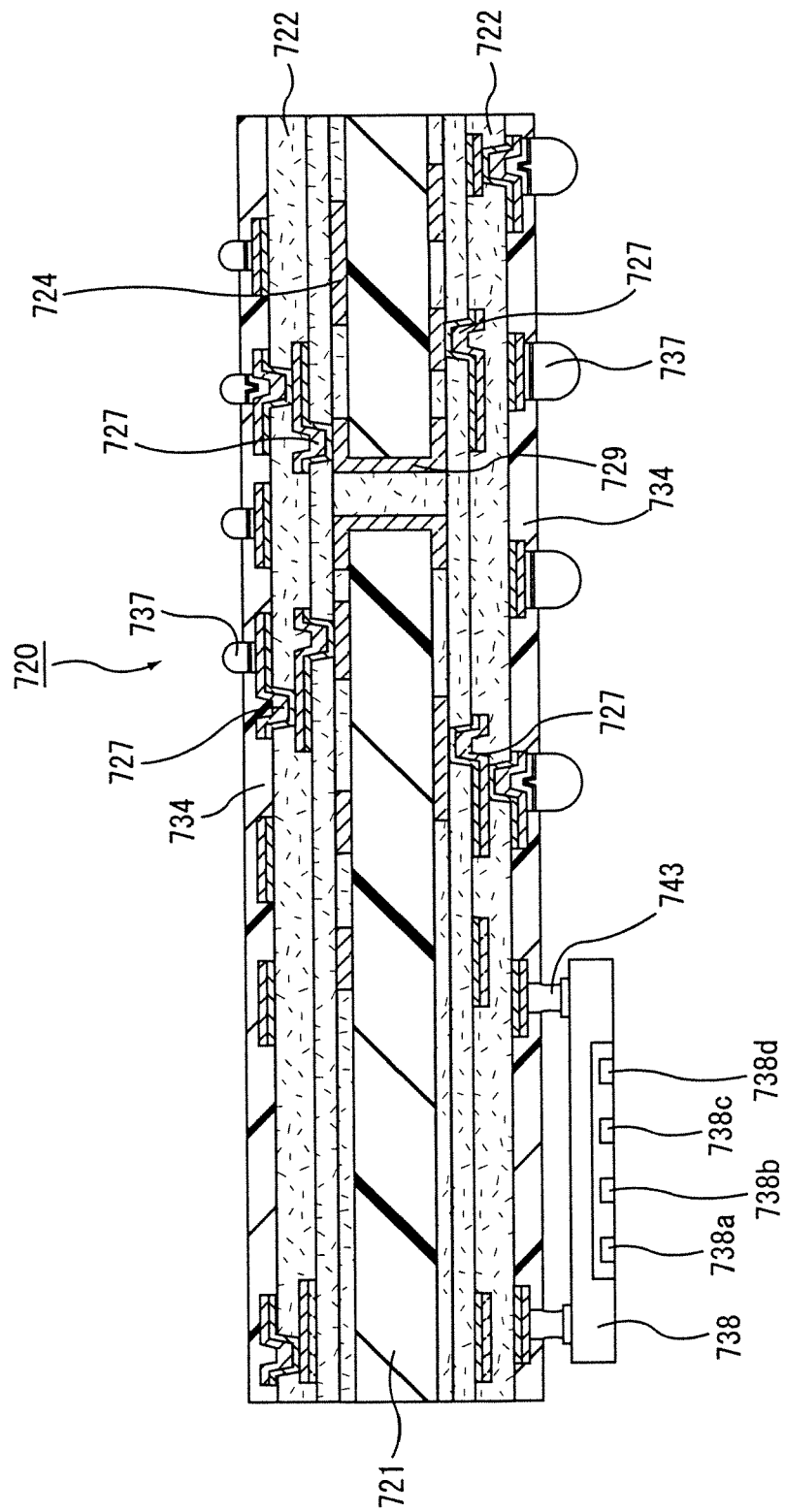
FIG. 9 is a cross-sectional view that schematically shows another example of a package substrate according to one embodiment of the present invention.

FIG. 9 is a cross-sectional view that schematically shows another one embodiment of the package substrate according to the embodiments of the present invention.

In a package substrate 720 shown in FIG. 9, conductor circuits 724 and interlayer resin insulating layers 722 are formed and laminated on both sides of a substrate 721, and conductor circuits having the substrate 721 in between are electrically connected to each other through a through hole 729, and conductor circuits having an interlayer resin insulating layer 722 in between are electrically connected to each other through via holes 727. In addition, solder resist layers 734 are formed as the outermost layers.

On one surface (surface at the lower side in FIG. 9) of the package substrate 720, a four-channel light emitting element 738 is surface mounted through solder connection portions 743 on the side opposite to light emitting portions 738a to 738d, and also an IC chip (not shown) such as an driving IC is surface mounted thereon through solder connection portions (not shown). Here, the light emitting element 738 is mounted in such a manner that each of light emitting portions 738a to 738d faces the opposite side of the solder resist layer 734. The light emitting element 738 and the IC chip (not shown) are mounted on the same surface. By mounting both of them on the same surface, it may become possible to obtain advantageous effects of the present invention.

Here, the solder connection portion for mounting an optical element is connected to external electrodes and dummy electrodes formed on the light emitting element.

Moreover, the light emitting element 738 and the driving IC are connected to each other by linear conductor circuits each having the same length as shown in FIG. 3.

In package substrates 720 having the configuration of this kind, an electrical signal from the IC chip 740 is converted to an optical signal at the light emitting element 738, and then transmitted to external optical parts and the like.

Also, as mentioned above, in the package substrate according to the embodiments of the present invention, each of conductor circuits connecting an optical element and an IC chip (optical element driving part) is linear and has the same length with the other ones. Consequently, the package substrate is highly reliable in signal transmission, and may become able to be used for higher speed communications.

In the package substrate 720, solder bumps 737 are formed on the solder resist layer 734 by interposing a metal plating layer, and thus the signal transmission between the IC chip and external substrates and the like can be also transmitted by an electrical signal via the solder bumps 737.

When solder bumps are formed in the manner as described above, the package substrate can be connected to an external substrate such as a substrate for a motherboard through solder bumps, and in this case, the package substrate may be able to be placed at the predetermined position due to self-alignment function of solders.

A package substrate with this kind of configuration is also one example of the package substrate according to one embodiment of the present invention.

However, considering that an optical element having a configuration that is usually not commercially available (configuration in which the light receiving or emitting surface and the surface on which an external electrodes are formed are different) is mounted in the package substrate according to the embodiment shown in FIG. 9, the package substrates having an optical path for transmitting an optical signal formed therein according to the embodiments as shown in FIGS. 6 to 8 are more desirable.

The package substrates according to the embodiments of the present invention so far described in the above are those in which substrates or interlayer resin insulating layers comprise a resin material.

However, the same effects may be able to be obtained even if the substrates or the interlayer resin insulating layers are comprised of a material other than a resin such as, for example, glass, silicon and ceramic.

In other words, with the package substrates in which an optical element and an optical element driving part are mounted on a circuit board comprising glass, silicon or ceramic, the similar effects as those described above may be able to be obtained.

In the case where a circuit board comprising glass or silicon is used, such a circuit board may be able to transmit a transmission light depending on the wavelength of the transmission light (for example 1310 nm light or 1550 nm light when a silicon is used), and thus an optical path for transmitting an optical signal is not necessarily formed.

Next, one example of a method for manufacturing a package substrate according to one embodiment of the present invention is described in the order of the processes. Here, the description is made on the method for manufacturing a package substrate having a configuration in which a conductor circuit and an interlayer resin insulating layer are formed and laminated on both sides of the substrate, and an optical element and an optical element driving part are mounted thereon.

In the method for manufacturing a package substrate according to the above-mentioned embodiment, first, a multilayer circuit board where conductor circuits and interlayer resin insulating layers are formed and laminated on both sides of a substrate is manufactured. The above-described multilayer circuit board may be able to be manufactured in accordance with a semi-additive method, a full additive method, a subtractive method, a collect layering method, a conformal method and the like. Here, an example of a manufacturing method for a multilayer circuit board using a semi-additive method is described.

(1) An insulating substrate is prepared as a starting material, and first, conductor circuits are formed on this insulating substrate. The insulating substrate is not particularly limited, and a glass epoxy substrate, a bismaleimide-triazine (BT) resin substrate, a copper covered multilayer board, a resin substrate such as an RCC substrate, a ceramic substrate such as an aluminum nitride substrate, a silicon substrate, and the like can be cited as examples.

The above-described conductor circuits can be formed by forming a conductor layer on the surface of the above-described insulating substrate in accordance with, for example, an electroless plating process, and after that, carrying out an etching process.

In addition, through holes for connecting the conductor circuits which sandwich the insulating substrate may be formed. In addition, a coarse surface may be formed on the surface of the conductor circuits in accordance with an etching process or the like, if necessary, after the formation of the conductor circuits.

(2) Next, an interlayer resin insulating layer having openings for via holes is formed on the substrate on which the conductor circuits are formed.

The inter layer resin insulating layer may be formed of a thermosetting resin, a photosensitive resin, a resin where a photosensitive group is added to a portion of a thermosetting resin, or a resin compound including any of these and a thermoplastic resin.

Specifically, first, an uncured resin is applied using a roll coater, a curtain coater and the like, or a resin film is bonded through thermocompression so that a resin layer is formed, and after that a curing process is carried out if necessary, and openings for via holes are formed in accordance with a laser process or a exposure and development process, and accordingly, an interlayer resin insulating layer is formed.

In addition, a resin layer made of the above-described thermoplastic resin can be formed by bonding a resin mold in film form through thermocompression.

Examples of the above-described thermosetting resin include an epoxy resin, a phenolic resin, a polyimide resin, a polyester resin, a bismaleimide resin, a polyolefin based resin, a polyphenylene ether resin, a polyphenylene resin and a fluorine resin and the like.

An acryl resin can be cited as an example of the above-described photosensitive resin.

In addition, examples of the resin where a photosensitive group is added to a portion of the thermosetting resin include a resin obtained by making the thermosetting group of any of the above-described thermosetting resins and methacrylic acid or acrylic acid react with each other in order to bring about acrylic conversion.

As for the above-described thermoplastic resin, a phenoxy resin, polyether sulfone (PES), polysulfone (PSF), polyphenylene sulfone (PPS), polyphenylene sulfide (PPES), polyphenylene ether (PPE) and polyether imide (PI) can be cited as examples.

With regard to concrete combinations in the above-described resin compound, phenolic resin/polyether sulfone, polyimide resin/polysulfone, epoxy resin/polyether sulfone, epoxy resin/phenoxy resin and the like can be cited as examples. In addition, as for combinations of a photosensitive resin and a thermoplastic resin, acryl resin/phenoxy resin, epoxy resin where a portion of the epoxy group has been converted to acryl/polyether sulfone, and the like can be cited as examples.

In addition, the mixture ratio of the thermosetting resin or photosensitive resin in the resin compound to the thermoplastic resin is desirably set as follows: thermosetting resin or photosensitive resin/thermoplastic resin=at least about 95/5 and at most about 50/50. This is because a high degree of toughness may be able to be secured without losing resistance to heat.

Here, the interlayer resin insulating layer may comprise two or more different resin layers.

Moreover, the interlayer resin insulating layer may be formed by using a resin composite for the formation of a coarse surface.

As the resin composite for the formation of a coarse surface, those prepared by dispersing a substance which is soluble in a coarsening liquid comprising at least one member selected from acid, alkali and an oxidant, in an uncured, heat resistant resin matrix which is insoluble in a coarsening liquid comprising at least one member selected from acid, alkali and an oxidant can be cited as an example.

Here, with regard to the words "insoluble" and "soluble," for the sake of convenience, substances having a relatively high dissolution rate is referred to as "soluble," whereas those having a relatively low dissolution rate is referred to a "insoluble" in the case where those substances are immersed in the same coarsening liquid for the same period of time.

As for the heat resistant resin matrix, resins capable of maintaining the form of a coarse surface when the coarse surface is formed on the interlayer resin insulating layer using the coarsening liquid, can be used, and a thermosetting resin, a photosensitive resin, a thermoplastic resin as well as a composite body of those can be cited as examples.

Examples of the thermosetting resin include an epoxy resin, a phenolic resin, a polyimide resin, a polyolefin resin, fluorine resin and the like. In addition, in the case where the above-described thermosetting resin is made photosensitive, methacrylic acid, acrylic acid or the like is used for carrying out (meth)acrylic conversion of the thermosetting group.

Examples of the thermoplastic resin include a phenoxy resin, polyether sulfone, polysulfone, polyphenylene sulfone, polyphenylene sulfide, polyphenyl ether, polyether imide and the like.

It is desirable for the above-described soluble substance to be of at least one kind selected from inorganic particles, resin particles and metal particles.

Examples of the inorganic particles include particles made of an aluminum compound, a calcium compound, a potassium compound, a magnesium compound, a silicon compound and the like.

Examples of the above-described resin particles include particles made of a thermosetting resin, a thermoplastic resin and the like, and the particles are not particularly limited as long as the dissolution rate is higher than the heat resistant resin matrix when immersed in a coarsening liquid made of at least one member selected from acid, alkali and an oxidant.

Here, it is necessary for a curing process to be carried out in advance on the above-described resin particles. This is because the above-described resin particles dissolve in a solvent for dissolving a heat resistant resin matrix, unless the particles are cured in advance.

Examples of the metal particles include particles made of gold, silver, copper, tin, zinc, stainless steel, aluminum, nickel, iron, lead and the like. In addition, the surface of the metal particles may be coated with a resin and the like, in order to secure insulating properties.

Examples of the acid used as the coarsening liquid include phosphoric acid, hydrochloric acid, sulfuric acid, nitric acid, and organic acids such as formic acid, acetic acid and the like; examples of the oxidant include chromic acid, a chromate acid mixture and solutions of alkaline permanganate (potassium permanganate) and the like; and examples of the alkali include sodium hydroxide, potassium hydroxide and the like.

The average particle diameter of the soluble substance is desirably set to about 10 μm or less.

In addition, a coarse particle having a relatively large average particle diameter and a fine particle having a relatively small particle diameter may be used in combination. By using in combination, a shallow and complex coarse surface may be able to be formed.

As the laser that is used in the laser process, a gas carbonate laser, an ultraviolet ray laser, an excimer laser and the like can be cited as examples. After the formation of openings for via holes, a desmear process may be carried out if necessary.

In addition, in this process, holes for through holes may be formed if necessary.

(3) Next, a conductor circuit is formed on the surface of the interlayer resin insulating layer including the inner walls of the openings for via holes.

That is to say, first, a thin film conductor layer is formed on the surface of the interlayer resin insulating layer through electroless plating, sputtering or the like, and then, a plating resist is formed on part of the surface, and after that, an electrolytic plating layer is formed in the portion where the plating resist is not formed. Next, the plating resist and the thin film conductor layer beneath this plating resist are removed, so that a conductor circuit is formed.

As the material for the thin film conductor layer, examples thereof include: copper, nickel, tin, zinc, cobalt, thallium, lead and the like. The desirable material is copper or those comprised of copper and nickel, in order to obtain excellent electrical properties and from an economical point of view.

The thickness of the thin film conductor layer is desirably at least about 0.1 μm and at most about 2.0 μm.

Moreover, a coarse surface may be formed on the surface of the interlayer resin insulating layer before the formation of the thin film conductor layer.

The plating resist can be formed, for example, through exposure to light and development after a photosensitive dry film is pasted.

Here, the thickness of the electrolytic plating layer is desirably at least about 5 μm and at most about 20 μm. Copper plating is desirable as the electrolytic plating for the formation of the electrolytic plating layer.

The plating resist may be removed by using, for example, an alkaline solution, and the thin film conductor layer may be removed using an etchant, such as a mixed liquid of sulfuric acid and hydrogen peroxide, sodium persulfate, ammonium persulfate, ferric chloride or cupric chloride.

In addition, the catalyst on the interlayer resin insulating layer may be removed using acid or an oxidant if necessary after the formation of the conductor circuit. With this arrangement it becomes possible for deterioration of electrical characteristics to be prevented more easily.

(4) Furthermore, processes (2) and (3) may be repeated if necessary, so that an interlayer resin insulating layer and a conductor layer are formed in layers.

A multilayer circuit board in which conductor circuits and interlayer resin insulating layers are formed and laminated on both sides of a substrate can be manufactured by carrying out those processes (1) to (4).

(5) Next, an optical path for transmitting an optical signal is formed in the multilayer circuit board, if necessary. Here, an optical path for transmitting an optical signal which is formed in this process and penetrates through the multilayer circuit board is referred to also as a through hole for an optical path.

First, a through hole for an optical path is formed in the multilayer circuit board that has been manufactured through the above-described process.

The through hole for an optical path is formed in accordance with, for example, a drilling process or a laser process.

As the laser used in the laser process, the same kinds of laser as can be used for the formation of the above-described openings for via holes can be cited.

It is desirable to use an apparatus with a function of recognizing alignment marks which reads alignment marks on a multilayer circuit board, corrects the point to be processed and carries out the drilling in the drilling process.

The position for formation and size of the above-described through hole for an optical path are not particularly limited, and an appropriate position for formation and size may be selected taking configurations such as the design of the conductor circuits, the point where the IC chip and the optical elements are mounted, into consideration.

Desirably, a through hole for an optical path as described above is formed for each optical element, for example a light receiving element or a light emitting element, or may be formed for each signal wavelength.

In addition, in the case where a through hole for an optical path in a form where a plurality of cylindrical pillars are aligned in parallel and certain portions on sides of the cylindrical pillars which are adjacent to each other are connected is created in this process, it is desirable for the plurality of cylindrical pillars formed to be an odd number, and it is desirable to form cylindrical pillars which are not adjacent to each other in advance, and after that, form cylindrical pillars between the cylindrical pillars which are not adjacent to each other, so that certain portions on the sides are connected.

This is because in the case where a cylindrical pillar is attempted to be formed in sequence so as to be adjacent to the previous cylindrical pillar with certain portions on the surface connected, the tip of the drill tends to shift in the direction of the already formed cylindrical pillar, and deviation is caused in the tip of the drill, and thus, the precision at the time of the drilling process may be lowered.

In addition, a desmear process may be carried out on the wall surface of a through hole for an optical path if necessary after the formation of the through hole for an optical path.

A process using a solution of permanganate, a plasma process, a corona process or the like can be used for the above-described desmear process. Here, resin residue, burrs and the like may be able to be removed from the inside of a through hole for an optical path by carrying out a desmear process as described above, so that it becomes easier to prevent loss of transmission of an optical signal due to diffuse reflection of light from the wall surface of the completed optical path for transmitting an optical signal, from increasing.

In addition, if necessary, a process for forming a coarse surface may be carried out in order to convert the wall surface of a through hole for an optical path to a coarse surface after the creation of a through hole for an optical path, and before the formation of a conductor layer in the below described process or before filling the through hole with an uncured resin composite. With this arrangement, it becomes easier to improve the adhesiveness with the conductor layer or the resin composite.

The formation of a coarse surface as described above can be carried out using, for example, an acid such as sulfuric acid, hydrochloric acid and nitric acid, or an oxidant such as chromic acid, a chromate acid mixture and permanganate, and the like. In addition, it can also be carried out in accordance with a plasma process, a corona process or the like.

After the creation of a through hole for an optical path, a conductor layer may be formed on the wall surface of the through hole for an optical path if necessary. The formation of the conductor layer can be carried out in accordance with, for example, a method such as electroless plating, sputtering, vacuum vapor deposition and the like.

In the case where a conductor layer of this kind is formed, in addition to the formation of the conductor layer on the wall surface of the through hole for an optical path, desirably a conductor circuit is also formed as the outermost layer on the outermost layer of the laminated interlayer resin insulating layers of the multilayer circuit board.

Specifically, first, a conductor layer is formed on the entirety of the surface of the interlayer resin insulating layer when the conductor layer is formed on the wall surface of the through hole for an optical path through electroless plating or the like.

Next, a plating resist is formed on top of the conductor layer that has been formed on the surface of this interlayer resin insulating layer.

Furthermore, an electrolytic plating layer is formed in a plating resist non-forming portion, and after that, the plating resist and the conductor layer beneath this plating resist are removed, and thereby, an independent conductor circuit is formed on the outermost layer of the laminated interlayer resin insulating layers.

Of course, even in the case where the conductor layer is not formed, a conductor circuit can be formed on the surface of the interlayer resin insulating layer in accordance with the above-described method.

In addition, after the formation of the conductor layer, a coarse surface may be formed on the wall surface of the conductor layer in accordance with the same method as that for forming a coarse surface on the conductor circuit.

(6) Next, the through hole for an optical path penetrating through the multilayer circuit board, which is formed in the above-described process (5), is filled in with a resin composite if necessary.

The through hole for an optical path is filled in with an uncured resin composite, and after that, a curing process is carried out, and thereby, the portion of the optical path for transmitting an optical signal to be completed in the subsequent process, which penetrates through the substrate and the interlayer resin insulating layers is filled in with a resin composite.

The concrete method for filling the through hole with an uncured resin composite is not particularly limited, and a printing method, a potting method or the like, for example, can be used.

Thorough those processes, part of the optical path for transmitting an optical signal can be formed.

Furthermore, it is desirable in this process to carry out a polishing process on the exposed surface of the resin composite exposed from the through hole for an optical path, so as to flatten the exposed surface. This is because, when the exposed surface is flattened, it may become possible to reduce the risk of interruption of the transmission of an optical signal.

The polishing process can be carried out through, for example, buffing, polishing using sandpaper or the like, mirror polishing, polishing to a clean surface, lapping or the like. In addition, chemical polishing using an acid, an oxidant or other chemicals may be carried out. In addition, a polishing process may be carried out by combining two or more of these methods.

(7) Next, if necessary, a process for forming a solder resist layer is carried out to form a solder resist layer having opening that communicates with the through holes for an optical path (hereinafter, also referred to as an opening for an optical path).

Specifically, for example, the solder resist layer can be formed by carrying out the following steps (a) and (b).

(a) First, a layer of solder resist composition is formed as the outermost layer on the multilayer circuit board in which through holes for optical paths are formed.

The layer of solder resist composition can be formed by using a solder resist composition comprising, for example, a polyphenylene ether resin, a polyolefin resin, a fluorine resin, a thermoplastic elastomer, an epoxy resin, a polyimide resin and the like. A commercially available solder resist composition may be also used.

The layer of the solder resist composition may be formed by pressure bonding a film comprising the solder resist composition.

(b) Next, if necessary, an opening for an optical path is formed in the layer of the solder resist composition.

Specifically, the opening for an optical path can be formed through, for example, an exposing and developing treatment, a laser treatment and the like.

Moreover, upon forming the opening for an optical path, desirably, openings for forming solder bumps (openings for mounting an IC chip) or openings for mounting an optical element are simultaneously formed. Here, formation of the opening for an optical path and formation of the openings for forming solder bumps may be carried out separately.

In addition, when a solder resist layer is formed, a resin film having openings at desired positions is manufactured in advance, and the solder resist layer having the opening for an optical path and openings for forming solder bumps may be formed by pasting this resin film.

Thorough those steps (a) and (b), a solder resist layer having openings that communicate with the through holes for an optical path can be formed on the multilayer circuit board in which the through holes for optical paths are formed.

The opening for an optical path formed in the solder resist layer may be filled in with an uncured resin composite in the same manner as in the through holes for optical paths.

(8) Next, a microlens is provided, if necessary.

In addition, in the case where a microlens is provided, a surface treatment, such as a process using a water repellent coating material, a water repellant process using $CF_4$ plasma, or a hydrophilic process using $O_2$ plasma, may be carried out in advance in the portion where the microlens is provided.

The form of the microlens, in particular the degree of sagging, may easily vary, depending on the wettability in the portion where the above-described microlens is provided, but the varying degree of sagging can be more easily reduced by carrying out a surface treatment.

Concrete methods for the surface treatments described above are briefly described.

In the case where a process using a water repellent coating agent as described above is carried out, first, masking is carried out in such a manner that an opening is provided in a portion which corresponds to the portion of the package substrate where the microlens is to be formed, and then a water repellent coating agent is applied through spraying or using a spin coater, and after that, the water repellent coating agent is naturally dried and the mask is peeled off to complete the surface treatment. The thickness of the water repellent coating agent layer is usually about 1 µm. Here, a mesh plate or a mask where a resist is formed may be used.

When a process using a water repellent coating agent is carried out, the process may be carried out on the entire exposed surfaces including wall surface of the solder resist layer without using a mask. This is because the solder resist layers are to function as a dam when a microlens is formed.

On the other hand, in the case where a water repellent process using $CF_4$ plasma as described above is carried out, first, masking is carried out in such a manner that an opening is provided in a portion which corresponds to the portion of the package substrate where the microlens is to be formed, after which a $CF_4$ plasma process is carried out, and furthermore, the mask is peeled off to complete the surface treatment. Here, a mask where a resist is formed may be used.

In the case where a hydrophilic process using the above-described $O_2$ plasma is carried out, first, masking is carried out in such a manner that an opening is provided in a portion which corresponds to the portion of the package substrate where the microlens is to be formed, after which a $O_2$ plasma process is carried out, and furthermore, the mask is peeled off to complete the surface treatment. Here, a metal plate or a mask where a resist is formed may be used.

Here, it is desirable to carry out the water repellent process (including a process using a water repellent coating agent) and a hydrophilic process in combination.

In the case where the above-described microlens is provided, the microlens may be disposed directly on top of the resin composite that has been filled in the through holes for optical paths (including openings for optical paths), or may be disposed to the predetermined positions by interposing an adhesive layer.

As the method for providing a microlens directly on top of the resin composite, a method for dropping an appropriate amount of uncured resin for an optical lens onto the resin composite and carrying out a curing process on this uncured resin for an optical lens that has been dropped can be cited, for example.

In the above-described method, when dropping appropriate amount of uncured resin for an optical lens onto the resin composite, an apparatus such as a dispenser, an inkjet, a micro pipette or a micro syringe can be used. In addition, the uncured resin for an optical lens that has been dropped onto the resin composite using such an apparatus tends to be spherical, due to its surface tension, and therefore, it becomes of a hemispherical form on top of the resin composite, and after that, a curing process is carried out on the uncured resin for an optical lens in hemispherical form, and thereby, a microlens in hemispherical form can be formed on top of the resin composite.

Here, the form of the microlens that is formed in this manner, including the diameter and the curve, can be controlled by adjusting the viscosity and the like of the uncured resin for an optical lens to an appropriate degree taking the wettability of the resin composite for the uncured resin for an optical lens.

In the case where portions penetrating the substrate and the interlayer resin insulating layer of the optical path for transmitting an optical signal are filled in with a resin composite, while portions penetrating the solder resist layer (openings for optical paths) are not filled in with a resin composite, a microlens is desirably placed at the end portion of the light receiving element provided at the substrate and the interlayer resin insulating layer. This is because, walls of the opening for an optical path function as a dam, which is desirable for placing the microlens having a predetermined form.

(9) Next, pads and solder bumps are formed in accordance with the following method, and furthermore, one or a plurality of optical elements and one or a plurality of optical element driving parts are mounted. Here, the optical elements and the optical element driving parts have been designed in advance so as to be connected with each other through a plurality of conductor circuits each having almost the same length.

That is to say, the portions of the conductor circuit that have been exposed from the openings for forming solder bumps and the openings for mounting the optical elements are coated with an anti-corrosive metal, such as nickel, palladium, gold, silver or platinum, if necessary, so that pads are formed.

The coating layer can be formed through, for example, plating, vapor deposition, electrolytic deposition and the like, and among these, formation through plating is desirable from the viewpoint of a high uniformity in the coating layer. Here, the pads may be formed before the process for providing a microlens.

Furthermore, when necessary, the space for the solder pads is filled in with a solder paste using a mask where openings are formed in portions corresponding to the pads, and after that, the solder bumps are formed through reflow. Here, gold bumps may be formed instead of solder bumps.

Furthermore, an optical element (light receiving element or light emitting element) is mounted on the solder resist layer. The optical element can be mounted by, for example, connecting Au stud bumps, solder bumps, metal bumps and the like formed on the optical element with pads or solder bumps formed on the side of the substrate.

The optical element may be mounted using a conductive adhesive agent or the like depending on the case.

In this process, upon mounting an optical element, it is desirable to maintain parallelism of the optical element by using a level maintaining member, dummy electrodes and the like.

When the level maintaining member is the adhesive agent as described above, a predetermined amount of uncured adhesive agent may be applied to the optical element in advance and then cured upon mounting or after mounting of the optical element, whereas when the level maintaining member is the spacer as described above, a predetermined amount of uncured adhesive agent may be applied in advance to the side for mounting the optical element and/or the substrate, and then cured upon mounting or after mounting of the optical element.

Moreover, upon mounting the optical element, a predetermined amount of uncured adhesive agent may be applied to the predetermined positions of the side of the substrate, and then cured upon mounting or after mounting of the optical element so that the adhesive agent can function in the same manner as the level maintaining member comprised of an adhesive agent. In this case also, it may become possible to maintain parallelism of the optical element.

Moreover, in the case where dummy electrodes are formed on the optical element, by connecting the dummy electrodes in the same manner as when the external electrodes of the optical element are connected as mentioned above, it may become possible to secure the mounting position accuracy and parallelism of the optical element.

(10) Next, if necessary, a gap adjacent to the optical element on the substrate side is filled in with an underfill. Here, as the method for filling the underfill, a conventional method may be used.

Through those processes, the package substrate according to the embodiments of the present invention can be manufactured.

A package substrate where an optical path for transmitting an optical signal in a recess shape (cavity shape) as described above is formed can be manufactured in accordance with the following method.

That is to say, first, a multilayer circuit board is manufactured in accordance with the same method as in the processes (1) to (4), and after that, a spot facing is carried out on the multilayer circuit board so that a recess (cavity) to form an optical path for transmitting an optical signal is formed.

Next, a conductor circuit is exposed from the bottom of the above-described recess, and the coating layer is formed on the exposed portion if necessary, and after that, an optical element and an optical element driving part are mounted at the bottom by flip chip or wire bonding.

Next, the above-described recess (cavity) is filled in with a resin composite in accordance with the same method as in the above process (6), and furthermore, a solder resist layer is formed, a microlens is provided, and solder bumps are formed appropriately in the same manner as in the above processes (7) to (9), and thereby, a package substrate having an optical path for transmitting an optical signal in a recess shape (cavity shape) as described above formed therein can be manufactured.

The following description explains a device for optical communication according to embodiments of the present invention.

The device for optical communication according to the embodiments of the present invention is a device for optical communication comprising: a substrate for a motherboard comprising a substrate having a conductor circuit formed on at least one side thereof; an optical waveguide also formed on the substrate; and one or a plurality of optical elements and one or a plurality of optical element driving parts which are either collectively mounted on a package substrate or directly mounted on the substrate for a motherboard, the package substrate mounted on the substrate for a motherboard, and in this structure, each of the optical elements and each of the optical element driving parts are connected to one another through a plurality of conductor circuits each having almost the same length.

In the device for optical communication according to the embodiments of the present invention, the package substrate according to the embodiments of the present invention is mounted, for example, on a substrate for a motherboard. In such a configuration, the package substrate according to the embodiments of the present invention exerts the above-mentioned advantages, and thus even in transmission of high frequency signals (high speed signals), generation and absorption of radiated noise may be able to be reduced in the device for optical communication according to the embodiments of the present invention, and accordingly it may become possible to carry out a highly reliable optical communication.

Moreover, in the device for optical communication according to the embodiments of the present invention, when an optical element and an optical element driving part are directly mounted on the substrate for a motherboard, and further the optical element and the optical element driving part are connected to each other through a plurality of conductor circuits each having the same length, even in transmission of high frequency signals (high speed signals), also generation and absorption of radiated noise may be able to be reduced, and accordingly it may become possible to carry out a highly reliable optical communication.

Furthermore, when the optical element and the optical element driving part are directly mounted on the substrate for a motherboard, since the conductor circuits connecting both members do not need to be wired in the substrate for a motherboard, the freedom in design is excellent and the mounting positions of the optical elements and the optical element driving parts are rarely limited.

In addition, in the device for optical communication according to the embodiments of the present invention, when an optical path for transmitting an optical signal is formed on the substrate for a motherboard, the position for forming thereof is rarely limited.

In the device for optical communication according to the embodiments of the present invention, a package substrate is mounted on the substrate for a motherboard, or one or a plurality of the optical elements and one or a plurality of the optical element driving parts are directly mounted on the substrate for a motherboard.

As the package substrate, a package substrate according to the embodiments of the present invention and the like can be cited as an example. Moreover, when the package substrate according to the embodiments of the present invention is mounted, this package substrate is the one provided with one or a plurality of optical elements and one or a plurality of optical element driving parts for driving the optical elements, in which the optical elements and the optical element driving parts are connected to each other through a plurality of conductor circuits each having the same length.

Also, in the device for optical communication according to the embodiments of the present invention, when an optical element and an optical element driving part for driving the optical element are directly mounted on the substrate for a motherboard, the optical element and the optical element driving part are connected to each other through a plurality of conductor circuits each having almost the same length.

With this arrangement, as described above, even in transmission of high frequency signals (high speed signals), generation and absorption of radiated noise may be able to be reduced, and thus it becomes possible to obtain a highly reliable device for optical communication.

Examples of the optical element driving part include a driving IC, an amplifier IC and the like.

Here, the optical element driving part may be one that alone can drive single-channel optical elements, or one that can drive a multi-channel optical element.

Moreover, the optical element driving part may be one that is to be mounted by flip chip bonding or that is to be mounted by wire bonding.

In the device for optical communication according to the embodiments of the present invention, one or a plurality of optical elements and one or a plurality of optical element driving parts are mounted.

Here, "one optical element is mounted" means that one single-channel optical element comprising one unit element is mounted, or one multi-channel optical element comprising a plurality of unit elements is mounted.

On the other hand, "a plurality of optical elements are mounted" means that a plurality of single-channel optical elements each comprising one unit element are mounted, or a plurality of multi-channel optical elements each comprising a plurality of unit elements are mounted.

Also, "one optical element driving part is mounted" means that one optical element driving part for driving a single-channel optical element is mounted, or one optical element driving part for driving one or a plurality of multi-channel optical elements or a plurality single-channel optical elements is mounted.

On the other hand, "a plurality of optical element driving parts are mounted" means that a plurality of optical element driving parts for driving one or a plurality of multi-channel optical elements or a plurality of single-channel optical elements are mounted.

If necessary, a gap between the package substrate or the optical element mounted on the substrate for a motherboard and the substrate for a motherboard may be filled in with an underfill. By filling the optical element with an underfill, it may become possible to prevent dust or a foreign matter from entering into the area where an optical signal passes through, and thus it may become possible to prevent interruption of the optical signal transmission.

As a concrete example of the underfill, the same kind of the underfill as those to be filled in the package substrate according to the embodiments of the present invention and the like may cited.

In the substrate for a motherboard, normally a solder resist layer is formed thereon as the outermost layer. Also, on at least one side of the substrate, usually on both sides of the substrate, a conductor circuit and an interlayer resin insulating layer are formed and laminated.

In the present specification, the following description explains an embodiment of a substrate for a motherboard in which a conductor circuit and an interlayer resin insulating layer are formed and laminated on at least one side of the substrate, and further a solder resist layer is formed as the outermost layer. The solder resist layer is not necessarily formed.

The material for the substrate and the interlayer resin insulating layer are not limited to a resin material, and the insulating layer may be comprised of a ceramic and the like.

Furthermore, in the substrate for a motherboard, if necessary, an optical path for transmitting an optical signal is formed. When the optical path for transmitting an optical signal is formed, an optical signal may be able to be transmitted through the optical path for transmitting an optical signal.

Also, an optical waveguide is formed on the substrate for a motherboard, and through this optical waveguide, an optical signal may be able to be transmitted.

Examples of the optical waveguide include an organic-based optical waveguide comprising a polymer material and the like, an inorganic-based optical waveguide comprising silica glass, a compound semiconductor and the like. Among the above examples, an organic-based optical waveguide comprising a polymer material and the like is desirable. This is because, when an optical waveguide is formed on the interlayer resin insulting layer, the optical waveguide of this kind has an excellent adhesion with an interlayer resin insulating layer, and thus processing becomes easy.

The above-described polymer material is not particularly limited, as long as it has little absorption for a wavelength band for communication, and a thermosetting resin, a thermoplastic resin, a photosensitive resin, a resin where a portion of a thermosetting resin is made photosensitive, a resin compound of a thermosetting resin and a thermoplastic resin, and a compound of a photosensitive resin and a thermoplastic resin, and the like can be cited.

Specifically, polymers manufactured from an acryl resin such as PMMA (polymethyl methacrylate), deuterated PMMA and deuterated PMMA fluoride, a polyimide resin such as polyimide fluoride, an epoxy resin, UV (ultraviolet) curing epoxy resin, a polyolefin based resin, a silicone resin such as deuterated silicone resin, a siloxane resin, benzocyclobutene or the like can be cited.

In addition, in the case where the optical waveguide is a multimode optical waveguide, the material thereof is desirably an acryl resin, an epoxy resin or a UV (ultraviolet) curing epoxy resin, since the formation of the waveguide becomes easier. Also, in the case where the optical waveguide is a single mode optical waveguide, the material thereof is desirably a polyimide resin, a silicone resin or a siloxane resin.

In addition, the thickness of the core portion of the above-described optical waveguide is desirably set to at least about 1 μm and at most about 100 μm, and the width thereof is desirably set to at least about 1 μm and at most about 100 μm. In the case where the thickness or width of the core portion is about 1 μm or more, the formation thereof may become easier, while in the case where the thickness or width of the core portion is about 100 μm or less, the freedom in design of the conductor circuit forming the substrate for a motherboard is less likely to be deteriorated.

In addition, the ratio of the thickness to the width in the core portion of the optical waveguide is desirably set close to about 1:1. This is because, the form in the light receiving portion of the above-described light receiving element and the form in the light emitting portion of the above-described light emitting element are circular in a plan view. Here, the ratio of the thickness to the width is not particularly limited, as long as the ratio is at least about 1:2 and at most about 2:1.

Furthermore, in the case where the above-described optical waveguide is a single mode optical waveguide with a wavelength for communication of 1.31 μm or 1.55 μm, the thickness and the width of the core portion is desirably set to at least about 5 μm and at most about 15 μm, and most desirably set to about 10 μm.

In addition, in the case where the optical waveguide is a multimode optical waveguide with a wavelength for communication of 0.85 μm, the thickness and the width of the core portion is desirably set to at least about 20 μm and at most about 80 μm. This is because, in the case where the thickness and the width of the core portion is about 20 μm or more, formation thereof becomes easier, while in the case of about 80 μm or less, miniaturization of the substrate for a motherboard tends not to be obstructed. A most desirable value is set to about 50 μm.

In addition, in the optical waveguide, particles may also be mixed. This is because, when particles are mixed in, it becomes difficult for cracks to occur in the optical waveguide. That is to say, in the case where no particles are mixed in the optical waveguide, cracks may sometimes occur in the optical waveguide due to the difference in the coefficient of thermal expansion between the optical waveguide and the other layer (substrate, interlayer resin insulating layer or the like); thus, in the case where the difference in the coefficient of thermal expansion between the optical waveguide and the above-described other layer is made small by adjusting the coefficient of thermal expansion by mixing particles into the optical waveguide, it becomes difficult for cracks to occur in the optical waveguide.

As the above-described particles, the same particles as those included in the underfill can be cited as examples.

These particles may be used alone, or two or more kinds may be used together.

As the above-described particles, inorganic particles are desirable, and particles comprising silica, titania or alumina are desirable. This is because, manufacturing becomes easier and the coefficient of thermal expansion may be more easily adjusted.

In addition, particles having a mixed composition formed by mixing and fusing at least two kinds among silica, titania and alumina are also desirable.

The form of the particle such as resin particle is not particularly limited, and sphere shape, elliptical sphere shape, crashed shape, polyhedron shape and the like can be cited.

The particle diameter of the above-described particle is desirably shorter than the wavelength for communication. This is because, in the case where the particle diameter is less than the wavelength for communication, transmission of an optical signal may not easily interrupted.

More desirably, the lower limit of the particle diameter is about 0.01 μm and the upper limit thereof is about 0.8 μm. This is because, in the case where particles having a particle diameter within this range are included, distribution in the particle size tends not to be too wide, and inconsistency (deviation) of the viscosity of the resin composite tends not to become great when the particles are mixed into the resin composite, and thus, reproducibility in preparing the resin composite tends not to become worse, and as a result, preparation of a resin composite having a predetermined viscosity tends not to be difficult.

Still more desirably, the lower limit of the particle diameter is about 0.1 μm and the upper limit thereof is about 0.8 μm. This is because, in the case where the particle diameter is within this range, it is appropriate for the resin composite to be applied using a spin coat method, a roll coating or the like, and it becomes easier to prepare a resin composite having a predetermined viscosity when the resin composite is prepared by mixing in particles.

It is particularly desirable for the lower limit of the particle diameter to be about 0.2 μm and the upper limit to be about 0.6 μm. This range is particularly appropriate for the application of the resin composite and formation of the core portion of the optical waveguide. Furthermore, inconsistency (deviation) in the formed optical waveguides becomes very small, in particular, inconsistency (deviation) in the core portion, becomes the smallest, and the properties of the substrate for a motherboard become particularly excellent.

In addition, particles with two or more different particle diameters may be included, as long as the particles have a particle diameter within this range.

A desirable lower limit for the amount of particles mixed therein as described above is about 10% by weight, and a more desirable lower limit is about 20% by weight. Meanwhile, a desirable upper limit for the above-described particles is about 80% by weight, and a more desirable upper limit is about 70% by weight. This is because, in the case where the amount of particles mixed in is about 10% by weight or more, it becomes possible to obtain the effects of mixing particles more easily, and in the case where the amount of particles mixed in is about 80% by weight or less, transmission of an optical signal tends not to be obstructed.

Although the form of the optical waveguide is not particularly limited, sheet form is preferable, because it is easily formed.

In the case where the optical waveguide comprises a core portion and a clad portion, though the particles may be mixed into both the core portion and the clad portion, desirably, the particles are not mixed in the core portion and mixed only in the clad portion that covers the surrounding of this core portion. The reason for this is as follows.

That is to say, in the case where particles are mixed in an optical waveguide, an air layer may generate in the interface between the particles and the resin component, depending on the adhesiveness between these particles and the resin component of the optical waveguide, and in such a case, the direction of refraction of light is changed by this air layer (void), increasing the transmission loss of the optical waveguide. On the other hand, in the case where particles are mixed only in the clad portion, even when particles are mixed in as described above, problems such as increase in transmission loss of the optical waveguide tends not to arise, and also it may become easier to exert the above-described effects such as less occurrence of cracks in the optical waveguide.

In addition, it is desirable for an optical path conversion mirror to be formed on the optical waveguide. By forming an optical path conversion mirror, it becomes possible to change the optical path by a desired angle.

The optical path conversion mirror can be formed by cutting one end of the optical waveguide as described below. In addition, a member having an optical path converting portion may be placed at the end of an end portion of the optical waveguide instead of forming an optical path conversion mirror in the optical waveguide.

Moreover, in the substrate for a motherboard, an optical path for transmitting an optical signal may be formed.

In this case, the optical path for transmitting an optical signal is formed so as to penetrate through, for example, at least the interlayer resin insulating layer and the solder resist layer. Moreover, the optical path for transmitting an optical signal may be formed of an opening, and a portion or the entirety of the optical path for transmitting an optical signal may be filled in with a resin composite.

This is because, in the case where the optical path for transmitting an optical signal is formed of an opening, formation thereof becomes easier, while in the case where a portion or the entirety of the optical path for transmitting an optical signal is filled in with a resin composite, dust or a foreign matter becomes unlikely to enter into the optical path for transmitting an optical signal.

Here, as the resin composite with which the optical path is filled in, the same resin composite as that with which the optical path for transmitting an optical signal is filled in the package substrate according to the embodiments of the present invention may be cited.

When an optical path for transmitting an optical signal of the above-mentioned kind is formed in the device for optical communication according to above-mentioned embodiments, in the optical path for transmitting an optical signal, the cross sectional diameter of the portions penetrating the solder resist layer may be smaller than the cross-sectional diameter of the portions formed in the interlayer resin insulating layer.

In the substrate for a motherboard, a microlens may be provided at the top of the path for transmitting an optical signal on the side where the package substrate or the optical elements are mounted. This is because, when a microlens is provided, a transmission light tends not to be diffused (a transmission light is more easily focused), and thus transmission of an optical signal may be able to be more certainly carried out.

Specifically, for example, an optical path for transmitting an optical signal is formed so as to penetrate a substrate, an interlayer resin insulating layer and a solder resist layer of a substrate for a motherboard, and when the portions penetrating the substrate and the interlayer resin insulating layer are filled in with a resin composite, a microlens may be provided at the portion penetrating the solder resist layer and also corresponding to the end portion of the resin composite.

Here, as the concrete material and properties, for example the transmittance and the like, for the microlens, those the same for the microlens provided in the package substrate according to the embodiments of the present invention can be cited.

Moreover, in the substrate for a motherboard, a surface treatment may be carried out in the region where the microlens is to be provided in the same manner as the package substrate according to the embodiments of the present invention.

Also, in the substrate for a motherboard, when a solder resist layer is formed as the outermost layer, the lower limit of the thickness of the solder resist layer is desirably set to about 10 μm, more desirably to about 15 μm. On the other hand the upper limit thereof is desirably set to about 40 μm, more desirably to about 30 μm.

Furthermore, in the substrate for a motherboard, desirably, the conductor circuits having the substrate in between are connected via a through hole, and the conductor circuits having the interlayer resin insulating layer in between are connected via a via hole. This is because, with this arrangement, the device for optical communication may be provided with a high density wiring, and may be reduced in size.

In the following, a device for optical communication according to embodiments of the present invention is described in reference to the drawings.

Figure 10:
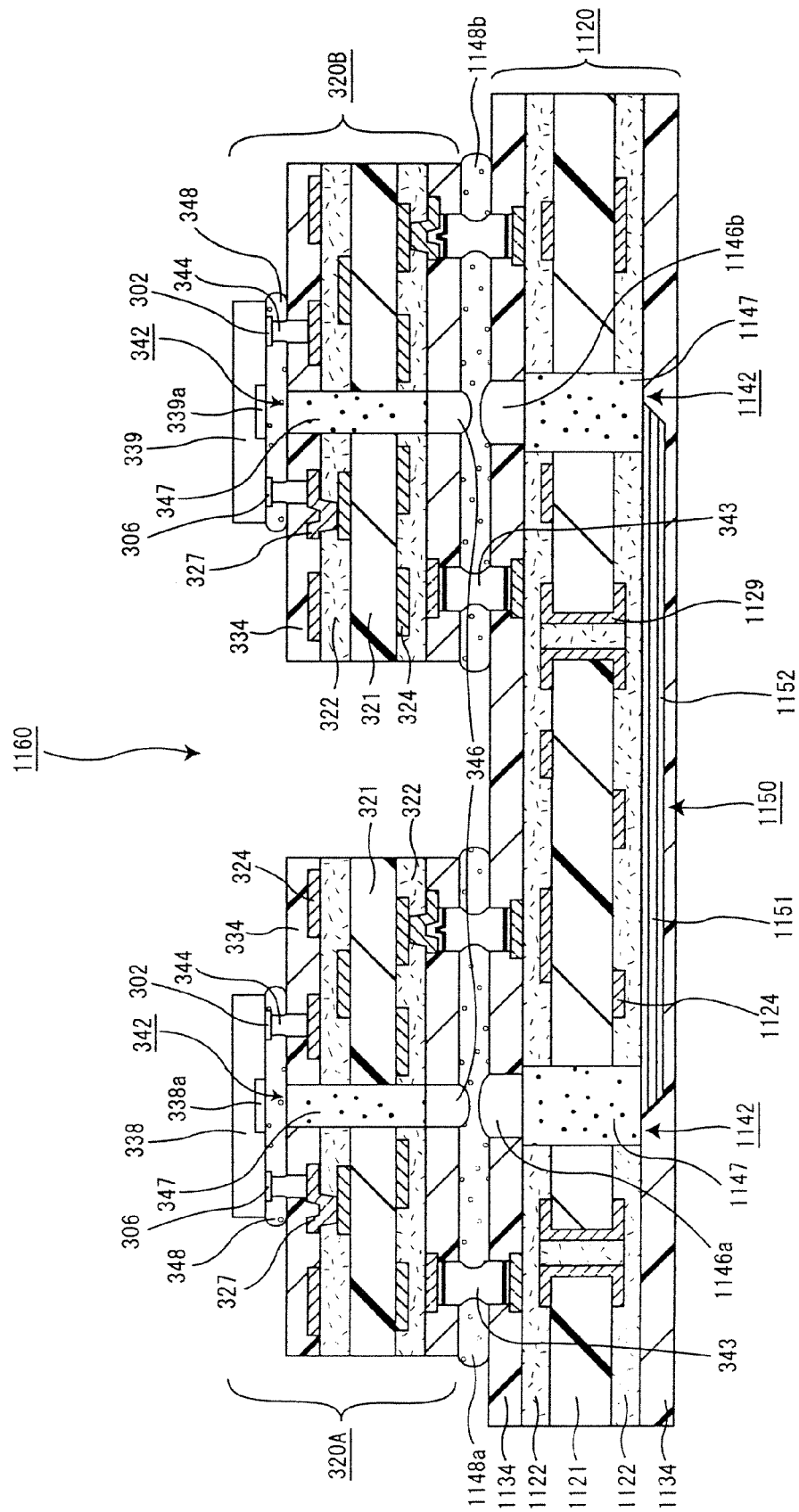
FIG. 10 is a cross-sectional view that schematically shows one example of a device for optical communication according to one embodiment of the present invention.

FIG. 10 is a cross sectional view schematically showing one example of a device for optical communication according to one embodiment of the present invention.

FIG. 10 shows a device for optical communication 1160, where a package substrate 320B, on which a light receiving element 339 according to one embodiment of the present invention is mounted, and a package substrate 320A, on which a light emitting element 338 according to one embodiment of the present invention is mounted, are mounted on a substrate for a motherboard 1120. Here, package substrates 320A and 320B are package substrates according to the embodiments of the present invention with an IC chip mounted thereon.

That is to say, in the package substrate 320A, conductor circuits 324 and interlayer resin insulating layers 322 are formed and laminated on both sides of a substrate 321, and the conductor circuits having the substrate 321 in between are electrically connected via through holes (not shown), and the conductor circuits having the insulating layers 322 in between are electrically connected through via holes 327. In addition, a solder resist layer 334 is formed as the outermost layer.

In this package substrate 320A, an optical path 342 for transmitting an optical signal is provided so as to penetrate through the substrate 321, the interlayer resin insulating layers 322 and the solder resist layer 334.

In this optical path 342 for transmitting an optical signal, portions penetrating the substrate 321 and the interlayer resin insulating layer 322 are filled in with a resin composite 347. Further, a microlens 346 is provided at a portion of the optical path for transmitting an optical signal which penetrates through the solder resist layer, at an end portion of the resin composite 347 on the side opposite to the side of the optical element 338.

The light emitting element 338 is mounted on one surface of the package substrate 320 through a solder connection portion 344 with the light emitting portion 338*a* facing the optical path 342 for transmitting an optical signal. Moreover, a gap adjacent to the light emitting element 338 on the side of the substrate 321 (a gap between the light emitting element 338 and the solder resist layer 334, and a gap between the light emitting element 338 and the resin composite 347) is filled in with an underfill 348. Here, the light emitting element 338 is connected to the solder connection portion 344 by interposing external electrodes 302 and dummy electrodes 306.

In addition, though not shown, an IC chip is mounted with a solder connection portion in between on the surface of the package substrate 320 on which the light emitting element 338 is mounted.

In addition, the package substrate 320B has the same configuration as the package substrate 320A, except that a light receiving element 339 is mounted instead of the light emitting element 338.

In the substrate for a motherboard 1120, conductor circuits 1124 and interlayer resin insulating layers 1122 are formed and laminated on both sides of a substrate 1121, and conductor circuits having the substrate 1121 in between are electrically connected via through holes 1129, and the conductor circuits having the interlayer resin insulating layers 1122 in between are electrically connected through via holes (not shown). Also, solder resist layers 1134 are formed as outermost layers.

Optical paths 1142 for transmitting an optical signal are provided in this substrate for a motherboard 1120 so as to penetrate the substrate 1121, the interlayer resin insulating layers 1122 and the solder resist layers 1134.

The optical paths 1142 for transmitting an optical signal is filled in with a resin composite 1147.

Optical waveguides 1150 constituted by cores 1151 and clads 1152 are formed on top of the outermost layer of the interlayer resin insulating layers 1122 on the side of the substrate for a motherboard 1120 opposite to the side where the package substrates 320A and 320B are mounted.

Also, optical path conversion mirrors are formed on the respective end portions of the optical waveguides 1150 so that an optical signal can be transmitted between the optical waveguides 1150 and the optical paths 1142 for transmitting an optical signal.

Microlenses 1146*a* and 1146*b* are provided at portions penetrating the solder resist layer on the side opposite to the side where the optical waveguides 1150 of the optical paths 1142 for transmitting an optical signal are formed in. Here, the microlenses 1146*a* and 1146*b* are respectively provided in positions corresponding to the respective end portions of the cores 1151 where the optical path conversion mirrors are formed on the end portions.

Moreover, in the device for optical communication 1160, the package substrates 320A and 320B are mounted with solder connection portions 343 in between, on the surface of the substrate for a motherboard 1120 on the side opposite to the side where the optical waveguides 1150 is formed.

Here, the package substrates 320A and 320B are respectively mounted in a predetermined position by the self-alignment function.

Furthermore, gaps adjacent to each of the package substrates 320A and the package substrates 320B on the side of the substrate for a motherboard 1120 are filled in with an underfill 1148*a* and an underfill 1148*b*, respectively.

An embodiment of the device for optical communication of the present invention is not limited to the embodiment shown in FIG. 10. That is, in the device for optical communication of the embodiment shown in FIG. 10, a one-channel optical element (light emitting element or a light receiving element) is mounted on a package substrate, and corresponding to this, an optical path for transmitting an optical signal, through which a one-channel optical signal is transmitted, is formed in each of the package substrate and the substrate for a motherboard.

The device for optical communication according to the embodiments of the present invention is not limited to the embodiment shown in FIG. 10, and a multi-channel optical element may be mounted.

Moreover, an optical path for transmitting an optical signal having a collective through hole structure, an optical path for transmitting an optical signal having an individual through hole structure or the like may be formed in each of the package substrate and the substrate for a motherboard in order to transmit an optical signal of the multi-channel optical element.

Furthermore, the substrate for a motherboard may have directly mounted thereon the optical elements and the optical element driving parts, and in this case, the optical elements are connected to the optical element driving parts such as a driving IC mounted on the substrate for a motherboard through linear conductor circuits each having the same length.

The package substrate to be mounted on the package substrate for a motherboard is not limited to a package substrate having an optical path for transmitting an optical signal of a collective through hole structure, and may be a package substrate having an optical path for transmitting an optical signal with an individual through hole structure or a package substrate with an optical path for transmitting an optical signal having a recess shape (cavity shape) formed therein.

In addition, in the case where a number of package substrates are mounted on the substrate for a motherboard, package substrates having different structures of the optical path for transmitting an optical signal, such as a package substrate where an optical path for transmitting an optical signal having a collective through hole structure is formed and a package substrate where an optical path for transmitting an optical signal in a recess shape (cavity shape) is formed, may be mounted on one substrate for a motherboard.

As described above, by forming the optical path for transmitting an optical signal having the above-described shape in the package substrate, freedom in design of the device for optical communication is to be improved.

Furthermore, in the case where a microlens is provided to a device for optical communication according to an embodiment as shown in FIG. 10, it is desirable to provide microlenses in all of the four portions shown in the embodiment of FIG. 10. This is because the reliability in the transmission performance of an optical signal from a light emitting element to a light receiving element becomes excellent In the device for optical communication according to the embodiment shown in FIG. 10, an optical path for transmitting an optical signal is formed on the substrate for a motherboard; however, in the device for optical communication according to the embodiments of the present invention, an optical path for transmitting an optical signal is not necessarily formed. The following description briefly explains a device for optical communication according to the embodiment, in which an optical path for transmitting an optical element is not formed on the substrate for a motherboard.

Figure 11:
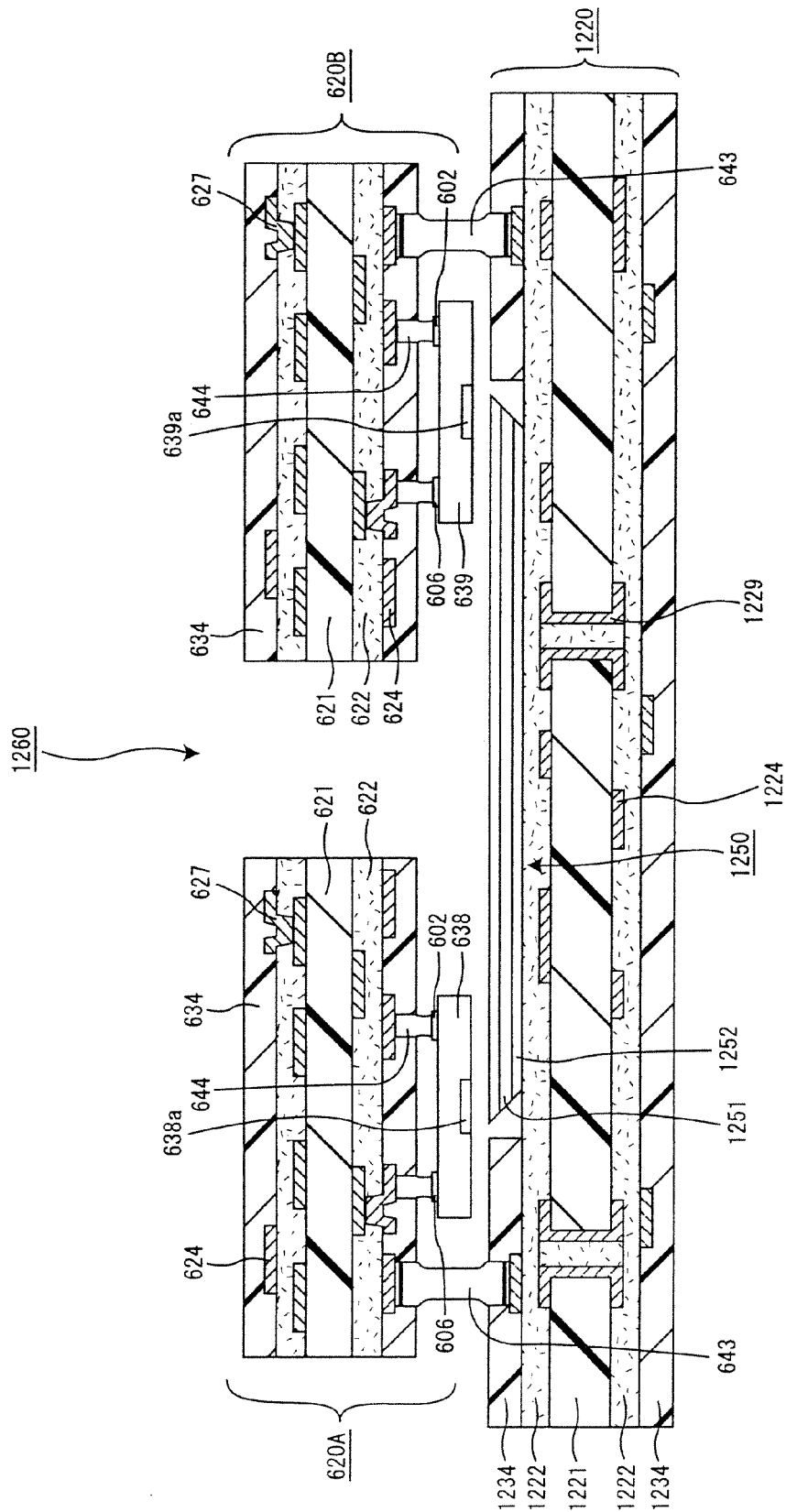
FIG. 11 is a cross-sectional view that schematically shows another example of a device for optical communication according to one embodiment of the present invention.

FIG. 11 is a cross-sectional view schematically showing another embodiment of the device for optical communication according to one embodiment of the present invention.

FIG. 11 shows a device for optical communication 1260 in which a package substrate 620B having a light receiving element 639 according to one embodiment of the present invention mounted thereon and a package substrate 620A having a light emitting element 638 according to one embodiment of the present invention mounted thereon are mounted on a substrate for a motherboard 1220. Here, the package substrates 620A and 620B are one form of the package substrate according to the embodiments of the present invention in which an IC chip (not shown) is mounted thereon, and an optical path for transmitting an optical signal is not formed in those package substrates.

In the package substrate 620A, a conductor circuit 624 and an interlayer resin insulating layer 622 are formed and laminated on both sides of a substrate 621 are electrically connected via through holes (not shown), and the conductor circuits having the substrate 621 in between and the conductor circuits having the interlayer resin insulating layer 622 in between are electrically connected through via holes 627. Also, a solder resist layer 634 is formed as the outermost layer.

In the package substrate 620A, a light emitting element 638 is mounted on the surface of the side facing the substrate for a motherboard 1220 through a solder connection portion 644. Here, the light emitting element 638 is connected to the solder connection portion 644 by interposing external electrodes 602 and dummy electrodes 606 formed on the opposite side of the surface where the light emitting portion is formed.

Also, although not shown in the figure, an IC chip is mounted through the solder connection portion on the surface where the optical element 638 of the package substrate 620 is mounted. Also, the light emitting element 638 and the IC chip are connected to each other through a plurality of conductor circuits each having almost the same length.

Moreover, a package substrate 620B has the same structure with the package substrate 620A, except that a light receiving element 639 is mounted instead of the light emitting element 638.

In the substrate for a motherboard 1220, conductor circuits 1224 and an interlayer resin insulating layer 1222 are formed and laminated on both sides of a substrate 1221, and the conductor circuits having the substrate 1221 in between are electrically connected via through holes 1229 and the conductor circuits having the interlayer resin insulating layer 1222 in between are electrically connected through via holes (not shown). Moreover, a solder resist layer 1234 is formed as the outermost layer.

A solder resist layer non-forming area is provided at part of the outermost layer of the substrate for a motherboard 1220 on the side where the package substrates 620A and 620B are mounted, and optical waveguides 1250 comprising cores 1251 and clads 1252 are formed in the solder resist layer non-forming area.

Also, an optical path conversion mirror is formed at each end portion of the optical waveguides 1250 so that an optical signal can be transmitted between the optical waveguides 1250 and the light emitting element 638 as well as between the optical waveguide 1250 and the light receiving element 639. Therefore, each of the optical path conversion mirrors formed at the end portions of the optical waveguides 1250 is placed directly beneath the optical elements (light emitting element 638 and light receiving element 639).

In the device for optical communication 1260, the package substrates 620A and 620B are mounted through solder connection portions 643 on the surface of the substrate for a motherboard 1220 on the side where the optical waveguides 1250 are formed.

Here, in FIG. 11, each of the package substrates 620A and 620B is provided with only one solder connection portion 643; however, it goes without saying that the number of the solder connection portion is not limited to one.

Moreover, an underfill is not particularly formed in the light emitting element 638, the light receiving element 639 and the package substrates 620A and 620B; however, an underfill may be formed if necessary.

A device for optical communication having this kind of embodiment is also one example of the device for optical communication according to the embodiments of the present invention.

Meanwhile, in the device for optical communication according to the embodiment shown in FIG. 11, an optical element having a form that is usually not commercially available (form in which the light receiving or emitting surface and the surface on which external electrodes are formed are different) is mounted; the alignment between the optical waveguide and the optical element is performed by active alignment; and the optical element is mounted or the optical waveguide is formed between the package substrate and the substrate for a motherboard, requiring some space between the package substrate and the substrate for a motherboard, and as a result, freedom in design tends to be deteriorated and dust or a foreign matter may easily get in. Taking the above into consideration, the substrate for a motherboard according to the embodiment shown in FIG. 10, in which an optical path for transmitting an optical signal is formed is more desirable.

In the device for optical communication according to the embodiments of the present invention so far described in the above, a substrate or a interlayer resin insulating layer comprises a resin material.

However, even if the substrate, the interlayer resin insulating layer or the like comprises a material other than resin such as, for example, glass, silicon and ceramics, the same effects may be able to be obtained.

In other words, it may be possible to obtain the same effects as described above in the case of a device for optical communication having such structure that a package substrate in which an optical element and an optical element driving part are mounted on a circuit board comprising glass, silicon or ceramics, is mounted on a substrate for a motherboard in which an optical waveguide is formed on a circuit board comprising glass, silicon or ceramics. Furthermore, the same effects may also be obtained in the case where only either of the package substrate or the substrate for a motherboard comprises glass, silicon, ceramics or the like.

Here, when a circuit board comprising glass or silicon is used, such a circuit board can transmit a transmission light depending on the wavelength of the transmission light (for example 1310 nm light or 1550 nm light when a silicon is used), and thus an optical path for transmitting an optical signal is not necessarily formed.

Next, one example of a method for manufacturing a device for optical communication according to the embodiments of the present invention is described.

The device for optical communication according to the embodiments of the present invention can be manufactured by separately manufacturing a package substrate in which an optical element and an optical element driving part are mounted, and a substrate for a motherboard, and after that, connecting the two by means of soldering.

The method for manufacturing a package substrate is as described above.

The substrate for a motherboard can be manufactured in accordance with the below described manufacturing method.

Here, description is made on a method for manufacturing a substrate for a motherboard having a configuration in which a conductor circuit and an interlayer resin insulating layer are formed and laminated on both sides of the substrate.

(1) First, a conductor circuit is formed on both sides of a substrate in the same manner as process (1) in the method for manufacturing a package substrate according to the embodiments of the present invention, and if necessary, through holes for connecting conductor circuits having a substrate interposed therebetween may be formed. If necessary, in this process as well, a coarse surface may be formed on the surface of the conductor circuit or on the wall surface of the through holes.

(2) Next, if necessary, an interlayer resin insulating layer and a conductor layer are formed and laminated on top of the substrate on which the conductor circuits are formed.

Specifically, the interlayer resin insulating layer and the conductor layer may be formed and laminated in accordance with the same processes as the processes (2) and (3) in the manufacturing method for a package substrate according to the embodiments the present invention.

Here, the process of laminating an interlayer resin insulating layer and a conductor circuit may be carried out only once or may be repeated a plurality of times.

As the method for forming the conductor circuit on the interlayer resin insulating layer in this process, a method other than semi-additive method, such as subtractive method, may be used in the same manner as in the case where a package substrate according to the embodiments of the present invention is manufactured.

Moreover, upon forming an optical waveguide as described below, in the case where the optical waveguide is formed on top of the interlayer resin insulating layer on the side opposite to the side facing the package substrate and the like across the substrate, the optical waveguide is filled in with a resin composite in this process, or a through hole for an optical path in which a conductor layer is formed on the wall surface thereof is formed, if necessary. This through hole for an optical path is allowed to function as an optical path for transmitting an optical signal.

Here, the through hole for an optical path (optical path for transmitting an optical signal) which penetrates through the substrate may be formed after an optical waveguide is formed in the below-described process (3).

A through hole for an optical path can be formed, for example, according to a drilling process, a laser process and the like. As the laser used in the laser process, the same lasers as those used at the time of forming the openings for via holes can be cited as examples.

In addition, the through hole for an optical path may have a form where an optical path for transmitting an optical signal having a collective through hole structure or an individual through hole structure can be formed.

(3) Next, an optical waveguide is formed on top of the substrate and/or the interlayer resin insulating layer in a predetermined location according to the design.

In the case where the optical waveguide is formed using an inorganic material such as silica glass as the material thereof, an optical waveguide that has been formed in a predetermined form is attached via an optical adhesive.

In addition, the optical waveguide made of an inorganic material can be formed through film formation of an inorganic material such as $LiNbO_3$ and $LiTaO_3$ in accordance with a liquid phase epitaxial method, a chemical vapor deposition method (CVD), a molecular beam epitaxial method, and the like.

As the method for forming an optical waveguide of a polymer material, (1) a method for pasting a film for forming an optical waveguide, which has been previously formed in film form on a mold release film, to the top of an interlayer resin insulating layer, and (2) a method for forming an optical waveguide directly on top of an interlayer resin insulating layer and the like by sequentially forming and laminating a lower clad, a core and an upper clad on top of the interlayer resin insulating layer, and the like can be cited.

Here, the same method can be used as the method for forming an optical waveguide in the case where an optical waveguide is formed on a mold release film and in the case where an optical waveguide is formed on the interlayer resin insulating layer.

Specifically, a method using reactive ion etching, a process including exposure to light and development, a die forming method, a resist forming method or a method combining these methods can be used.

In the method using the reactive ion etching, (i) first, a lower clad is formed on top of a mold release film or an interlayer resin insulating layer (hereinafter, simply referred to as a mold release film or the like), and (ii) next, a resin composite for a core is applied to the top of this lower clad, and furthermore, a curing process is carried out, if necessary, to provide a resin layer for forming a core. After that, (iii) a resin layer for forming a mask is formed on the resin layer for forming a core, and then a process including exposure to light and development is carried out on the resin layer for forming a mask, and thereby, a mask (etching resist) is formed on top of the resin layer for forming a core.

Next, (iv) reactive ion etching is carried out on the resin layer for forming a core to remove the resin layer for forming a core on the mask non-forming portion so that a core is formed on top of the lower clad. Finally, (v) an upper clad is formed on top of the lower clad so as to cover the core, and thus, an optical waveguide is provided.

According to this method using reactive ion etching, an optical waveguide having excellent dimensional reliability can be formed. In addition, this method is also excellent in reproducibility.

In addition, in the process including exposure to light and development, (i) first, a lower clad is formed on top of a mold release film or the like, and (ii) next, a resin composite for a core is applied to the top of this lower clad, and furthermore, a semi-curing process is carried out, if necessary, so that a layer of a resin composite for forming a core is formed.

Next, (iii) a mask where a pattern corresponding to the portion for forming the core is drawn is placed on top of the layer of the resin composite for forming a core, and after that, a process including exposure to light and development is carried out so that a core is formed on the lower clad. Lastly, (iv) an upper clad is formed on the lower clad so as to cover the core, and thus, an optical waveguide is provided.

This method, including exposure to light and development, may be appropriately used when an optical waveguide is mass produced, since its number of processes is small, and in addition, because this method has a small number of heating processes, stress hardly occurs in the optical waveguide.

In the die forming method, (i) first, a lower clad is formed on top of a mold release film, and (ii) next, a trench for forming a core is formed in the lower clad through die formation. Furthermore, (iii) the above-described trench is filled in with a resin composite for a core through printing, and after that, a core is formed by carrying out a curing process. Finally, (iv), an upper clad is formed on top of the lower clad so as to cover the core, and thus, an optical waveguide is provided.

This die forming method may be appropriately used when an optical waveguide is mass produced, and an optical waveguide having excellent dimensional reliability may be able to be formed. In addition, this method is excellent in reproducibility.

In the resist forming method, (i) first, a lower clad is formed on a mold release film or the like, and then, (ii) a resin composite for a resist is applied to the top of this lower clad, and after that, a process including exposure to light and development is carried out, and thereby, a resist for forming a core is formed in the core non-forming portion on top of the above-described lower clad.

(iii) Next, a resin composite for a core is applied to the resist non-forming portion on the lower clad, and (iv) furthermore, the resin composite for a core is cured, and after that, the resist for forming a core is peeled off, and thereby, a core is formed on top of the lower clad. Lastly, (v) an upper clad is formed on top of the lower clad so as to cover the core, and thus, an optical waveguide is provided.

This resist forming method may be appropriately used when an optical waveguide is mass produced, and an optical waveguide having excellent dimensional reliability may be able to be formed. In addition, this method is also excellent in reproducibility.

In the case where an optical waveguide made of a polymer material is formed using these methods, and an optical waveguide where particles are mixed into the core is formed, a mold forming method is desirable in comparison with a process including exposure to light and development. The reason for this is as follows.

That is to say, in the case where a trench for forming a core is formed in the lower clad through die formation, and then a core is formed within this trench in accordance with a die forming method for forming a core, it becomes possible for all of the particles mixed into the core to be contained in the core more easily, and as a result, the surface of the core becomes flat, providing excellent transmissivity of an optical signal. On the other hand, when the core is formed in a process including exposure to light and development, in the core after the development process, part of the particles may extrude from the surface of the core, or a recess may be formed in the surface of the core due to coming off of the particles, making the surface of the core uneven, and this unevenness may make it difficult for light to be reflected in a desired direction, and as a result of this, the transmission property of an optical signal of the optical waveguide may be lowered.

In addition, an optical path conversion mirror is formed in the optical waveguide.

Though the optical path conversion mirror may be formed before the optical waveguide is attached to the interlayer resin insulating layer or may be formed after the optical waveguide has been attached to the interlayer resin insulating layer, it is desirable to form the optical path conversion mirror in advance, except for the case where the optical waveguide is directly formed on top of the interlayer resin insulating layer. With this arrangement, it becomes possible for the process to be carried out more easily, and also during this process, there may be no risk of scratching or damaging of other members which form the substrate for a motherboard, the substrate, the conductor circuits, the interlayer resin insulating layers and the like.

The method for forming an optical path conversion mirror is not particularly limited, and conventionally well-known forming methods can be used. Specifically, a machining using a diamond saw or a blade each having the edge in a V shape at 90°, a process using reactive ion etching, laser ablation, and the like can be used. In addition, instead of forming an optical path conversion mirror, an optical path conversion member may be embedded.

In the case where a 90 degrees optical path conversion mirror is formed in the optical waveguide, the angle formed by the surface where the lower clad makes contact with the substrate or the interlayer resin insulating layer, and the optical path conversion surface may be 45 degrees or 135 degrees.

Formation of the optical waveguide may be performed after a solder resist layer is formed in the process (4) mentioned below.

Here, though a method for forming an optical waveguide on the substrate or on the outermost interlayer resin insulating layer is described, in the manufacture of the multilayer printed circuit board, the optical waveguide as described above may sometimes be formed between the substrate and the interlayer resin insulating layer or between the interlayer resin insulating layers. In the substrate for a motherboard, freedom in design is to be improved by forming an optical waveguide at any of those locations.

In the case where an optical waveguide is formed between the substrate and the interlayer resin insulating layer, a substrate where conductor circuits are formed on both sides thereof is manufactured in the above-described process (1), and after that, an optical waveguide is formed in a portion where a conductor circuit is not formed on the substrate in accordance with the same method as in the above-described process (3), and subsequently, an interlayer resin insulating layer is formed in accordance with the same method as in the above-described process (2), and thereby, an optical waveguide can be formed in the above-described location.

In addition, in the case where an optical waveguide is formed between the interlayer resin insulating layers, at least one layer of an interlayer resin insulating layer is formed and laminated on top of a substrate where conductor circuits are formed in the same manner as in the above-described processes (1) and (2), and after that, an optical waveguide is formed on top of the interlayer resin insulating layer in the same manner as in the above-described process (3), and subsequently, the same process as the above-described process (2) is additionally repeated, and thereby, an optical waveguide can be formed between the interlayer resin insulating layers.

(4) Next, a solder resist layer is formed, if necessary. Formation of the solder resist layer can be carried out by, for example, the processes (a) and (b) mentioned below (a) First, a layer of solder resist composition is formed as an outermost layer of a multilayer circuit board where a through hole for an optical path, which is filled in with a resin composite, is created.

The layer of a solder resist composition can be formed in accordance with the same method as the method that is used in the method for manufacturing of a package substrate according to the embodiments of the present invention.

(b) Next, an opening that communicates with the through hole for an optical path (hereinafter, referred to also as opening for an optical path) may be formed in the layer of a solder resist composition, if necessary.

Formation of the opening for an optical path may be carried out in the same manner as the method used in the method for manufacturing a package substrate according to the embodiments of the present invention.

Here, upon forming the opening for an optical path, desirably, openings for forming solder bumps (openings for mounting a package substrate or an optical element) are simultaneously formed. Here, formation of the opening for an optical path and formation of the openings for forming solder bumps may be carried out separately.

A solder resist layer having openings for optical paths and openings for forming solder bumps may be formed by manufacturing a resin film having openings at desired positions in advance and pasting the resin film upon forming a solder resist layer.

Thorough those steps (a) and (b), openings for optical paths that communicate with an optical path for transmitting an optical signal can be formed on the multilayer circuit board in which the optical paths for transmitting an optical signal (through holes for optical paths) are formed.

The opening for an optical path formed in the solder resist layer may be filled in with an uncured resin composite in the same manner as in the through holes for an optical path.

(5) Next, if necessary, a microlens is provided at the side of the underfill formed in the subsequent processes for the through holes for optical paths.

The microlens can be provided in accordance with the same method as the method used in the process (8) of the method for manufacturing a package substrate according to the embodiments of the present invention.

In addition, a surface treatment such as a water repellant process (including a process using a water repellant coating agent) and a hydrophilic process may be carried out before mounting the microlens.

(6) After that, solder pads or solder bumps are formed if necessary, and thereby, a substrate for a motherboard can be manufactured.

Here, the solder pads or the solder bumps can be formed in accordance with the same method as the method used in the manufacturing method for a package substrate according to the embodiments of the present invention.

In addition, in some cases, an optical waveguide may be formed on the entirety of the outermost layer of the substrate in the above-described process (3) so that the optical waveguide may function as a solder resist layer.

The device for optical communication according to the embodiments of the present invention can be manufactured by manufacturing a package substrate and a substrate for a motherboard using the methods as described above, and connecting the two by means of soldering and the like, and then filling an underfill in a gap between the package substrate and the substrate for a motherboard.

Specifically, first, a package substrate on which solder bumps are formed and a substrate for a motherboard on which solder bumps are formed are placed in predetermined locations respectively so as to face each other in a predetermined direction, and after that, the two are connected to each other through reflow. Here, solder bumps may be formed only on one surface between the surfaces of the above-described package substrate and the substrate for a motherboard which face each other. This is because in this case also, the two can be electrically connected to each other.

In addition, in the case where an optical element and an optical element driving part are directly mounted on the substrate for a motherboard, the optical element and the optical element driving part may be mounted in accordance with the same method as the method for mounting an optical element and the optical element driving part on a package substrate in the manufacturing method for a package substrate according to the embodiments of the present invention.

Next, a gap between the mounted package substrate or the mounted optical element and the substrate for a motherboard is filled in with the underfill, if necessary.

Here, filling of an underfill may be carried out by conventionally known methods.

EXAMPLES

In the following, the present invention is described in further detail.

Example 1

A. Manufacture of Resin Film for Interlayer Resin Insulating Layer

A bisphenol A type epoxy resin (equivalent of epoxy 469, Epikote 101, made by Yuka Shell Epoxy K.K.) (30 parts by weight), cresol novolac type epoxy resin (equivalent of epoxy 215, Epiclon N-673, made by Dainippon Ink & Chemicals, Inc.) (40 parts by weight) and phenol novolac resin containing triazine structure (equivalent of phenolic hydroxy group 120, Phenolite KA-7052, made by Dainippon Ink & Chemicals, Inc.) (30 parts by weight) were heated and melted in 20 parts by weight of ethyl diglycol acetate and 20 parts by weight of a naphtha solvent while stirring, and 15 parts by weight of polybutadiene rubber with a terminal converted to epoxy (DENAREX R-45EPT, made by Nagase Chemicals Ltd.), 1.5 parts by weight of pulverized 2-phenyl-4,5-bis(hydroxymethyl)imidazole, 2 parts by weight of finely pulverized silica and 0.5 part by weight of a silicone based antifoaming agent were added thereto to prepare an epoxy resin composite.

The obtained epoxy resin composite was applied to the top of a PET film having a thickness of 38 µm using a roll coater, so that the thickness after drying became 50 µm, and then dried for ten minutes at 80° C. to 120° C. and thereby, a resin film for an interlayer resin insulating layer was manufactured.

B. Preparation of Resin Composite for Filling Through Holes

A bisphenol F type epoxy monomer (molecular weight: 310, YL983U, made by Yuka Shell Epoxy K.K.) (100 parts by weight), $SiO_2$ particles in spherical form (CRS 1101-CE, made by ADTEC Corp.) (170 parts by weight) of which the surface is coated with a silane coupling agent, the average particle diameter is 1.6 µm and the diameter of the largest particles is 15 µm or less, and a leveling agent (Perenol S4, made by San Nopco Co., Ltd.) (1.5 parts by weight) were put in a container and mixed through stirring, and thereby, a resin filling of which the viscosity is 45 Pa·s to 49 Pa·s at 23±1° C. was prepared. Here, 6.5 parts by weight of an imidazole curing agent (2E4MZ-CN, made by Shikoku Corp.) was used as a curing agent.

Figure 12A:
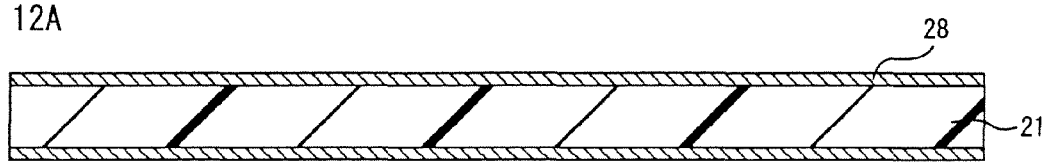
FIG. 12 is a cross-sectional view that schematically shows another example of a device for optical communication according to one embodiment of the present invention.

C. Manufacture of Package Substrate (1) A copper pasted multilayer plate where copper foil 28 having a thickness of 18 μm is laminated on both sides of an insulating substrate 21 made of a glass epoxy resin or a BT (bismaleimide triazine) resin having a thickness of 0.8 mm was used as a starting material (see FIG. 12A). First, holes were drilled in this copper pasted multilayer plate, an electroless plating process was carried out, and etching was carried out so as to form a pattern, and thus, conductor circuits 24 and a through hole 29 were formed on both sides of the substrate 21.

Figure 12B:
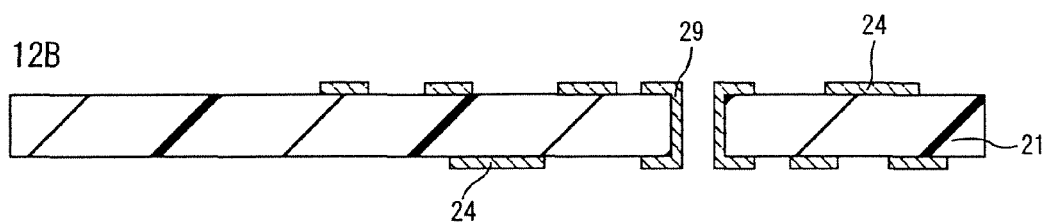

(2) The substrate where the through hole 29 and the conductor circuits 24 were formed was washed with water and dried, and thereafter, a blackening process using a solution including NaOH (10 g/L), NaClO$_2$ (40 g/L) and Na$_3$PO$_4$ (6 g/L) for a blackening bath (oxidation bath) and a reduction process using a solution including NaOH (10 g/L) and NaBH$_4$ (6 g/L) for a reduction bath were carried out, and a coarse surface (not shown) was formed on the surface of the conductor circuits 24 including the through hole 29 (see FIG. 12B).

(3) After the preparation of the resin filling described in the above B, and within 24 hours after preparation thereof, a layer of a resin filling 30' was formed in a conductor circuits non-forming portion within the through hole 29 and on one side of the substrate 21, and also formed on the outer periphery portion of the conductor circuits 24, using the method described below.

Figure 12C:
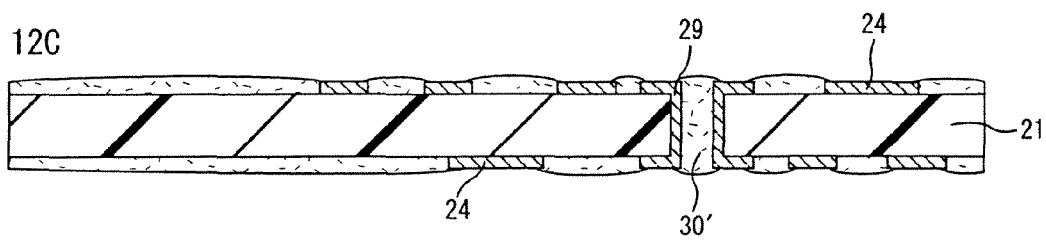

That is to say, first, a squeegee was used to push the resin filling into the through hole, and after that, the resin filling was dried under conditions of 100° C. for 20 minutes. Next, a mask having openings in portions corresponding to the conductor circuits non-forming portion was placed on the substrate and the conductor circuits non-forming portions in a recess shape were filled in with a resin filling using a squeegee, and the resin filling was dried under conditions of 100° C. for 20 minutes, and thereby, a layer of resin filling 30' was formed (see FIG. 12C).

(4) One side of the substrate after the above-described process (3) was polished through belt sander polishing using belt polishing paper #600 (made by Sankyo Rikagaku Co., Ltd.), so that no resin filling 30' was left on the surface of the conductor circuits 24 nor the land surface of the through hole 29, and then, buff polishing was carried out in order to remove scratches created as a result of the above-described belt sander polishing. This polishing sequence was carried out in the same manner on the opposite side of the substrate.

Next, heat treatment was carried out for one hour at 100° C., three hours at 120° C., one hour at 150° C. and seven hours at 180° C., and thereby, a resin filling layer 30 was formed.

Figure 12D:
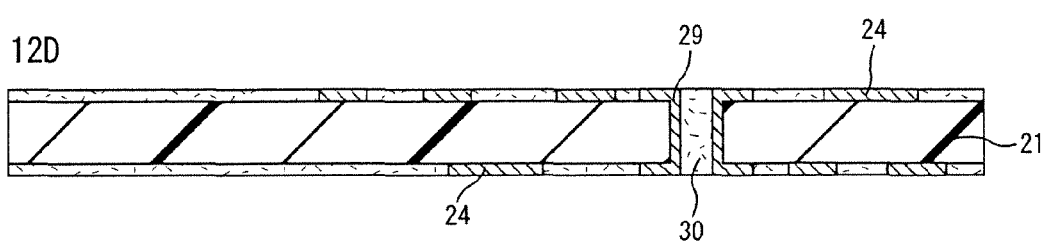

In this manner, an insulating substrate was gained, where the surface layer portion of the resin filling layer 30 formed in the through hole 29 and in the conductor circuits non-forming portions, and the surface of the conductor circuits 24 were flattened, the resin filling layer 30 and the side faces of the conductor circuits 24 adhered firmly to each other via the coarse surface (not shown), and the inner wall surface of the through hole 29 and the resin filling layer 30 adhered firmly to each other via the coarse surface (not shown) (see FIG. 12D).

In this process, the surface of the resin filling layer 30 and the surface of the conductor circuits 24 were made in the same plane.

(5) The above-described substrate was washed with water, and after acid degreasing, soft etching was carried out, and then, an etchant was sprayed onto both sides of the substrate so that the surface of the conductor circuit 24, and the land surface and inner wall of the through hole 29 were etched, and thereby, a coarse surface (not shown) was formed on the entirety of the surface of the conductor circuit 24. As the etchant, an etchant (MECetchBOND, made by MEC Co., Ltd.) including 10 parts by weight of a imidazole copper (II) complex, 7 parts by weight of glycolic acid and 5 parts by weight of potassium chloride was used.

Figure 12E:
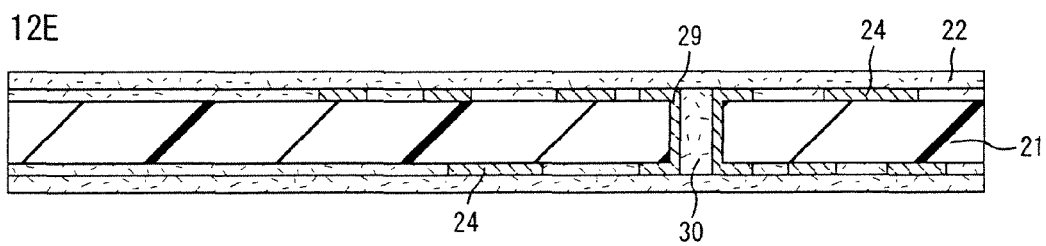

(6) Next, a resin film for an interlayer resin insulating layer which is a little larger than the substrate manufactured in the above-described A was placed on the substrate, temporarily pressure-bonded thereto under such conditions that the pressure was 0.4 MPa, the temperature was 80° C. and the press-bonding time was 10 seconds, and the edges were trimmed, and after that, the film was pasted using a vacuum laminating apparatus in accordance with the following method, and thereby, an interlayer resin insulating layer 22 was formed (see FIG. 12E).

That is to say, the resin film for an interlayer resin insulating layer was permanently pressure-bonded to the substrate under such conditions that the degree of vacuum was 65 Pa, the pressure was 0.4 MPa, the temperature was 80° C. and the press-bonding time was 60 seconds, and after that, thermosetting was carried out at 170° C. for 30 minutes.

Figure 12F:
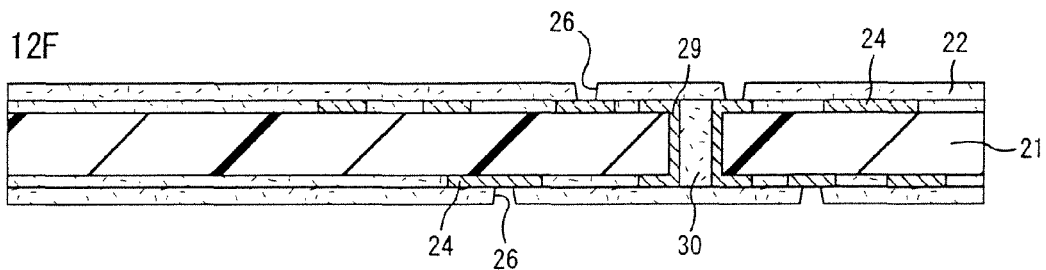

(7) Next, openings 26 for via holes having a diameter of 80 μm were formed in the interlayer resin insulating layer 22 through a mask having a thickness of 1.2 mm with through holes corresponding to the openings placed on the interlayer resin insulating layers 22, and using a CO$_2$ gas laser having a wavelength of 10.4 μm, under such conditions that the beam diameter was 4.0 mm, the laser was in a top hat mode, a pulse width was 8.0 μs, the diameter of through holes in the mask was 1.0 mm, and the laser was shot once for each opening (see FIG. 12F).

(8) The substrate where the openings 26 for via holes were formed was immersed in a solution including 60 g/L of permanganic acid at 80° C. for 10 minutes, so that the epoxy resin particles on the surface of the interlayer resin insulating layers 22 were dissolved and removed, and thereby, a coarse surface (not shown) was formed on the surface of the substrate, including the inner wall surface of the openings 26 for via holes.

(9) Next, the substrate after the above-described process was immersed in a neutral solution (made by Shipley Co., Ltd.) and then washed with water.

Furthermore, a palladium catalyst was provided on the surface of this substrate on which a surface roughening treatment (depth of coarseness: 3 μm) was carried out, and thus, catalyst nuclei were attached to the surface of the interlayer resin insulating layers 22 (including the inner wall surface of the openings 26 for via holes) (not shown). That is to say, the substrate was immersed in a catalyst solution including palladium chloride (PdCl$_2$) and stannous chloride (SnCl$_2$) so that a palladium metal was deposited, and thus, a catalyst was provided.

Figure 13A:
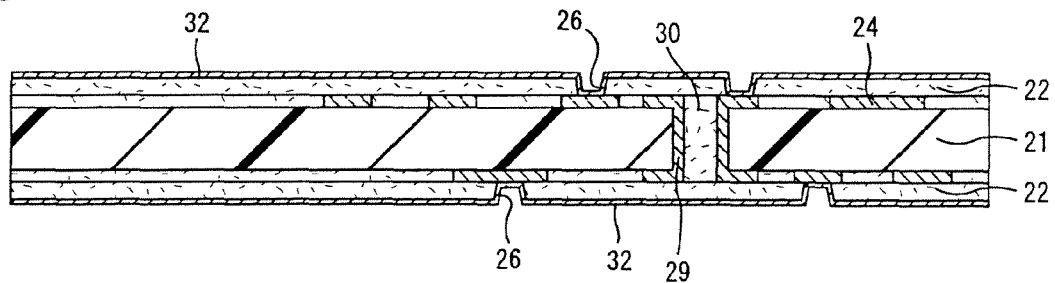
FIG. 13 is a cross-sectional view that schematically shows a part of a method for manufacturing a package substrate according to one embodiment of the present invention.

(10) Next, the substrate was immersed in an electroless copper plating solution having the following composition, and thin film conductor layers (electroless copper plating films) 32 having a thickness of 0.6 μm to 3.0 μm were formed on the surface of the interlayer resin insulating layers 22 (including the inner wall surface of the openings 26 for via holes) (see FIG. 13A).

[Electroless Plating Solution]

| | |
|---|---|
| NiSO$_4$ | 0.003 mol/L |
| Tartaric acid | 0.200 mol/L |
| Copper sulfate | 0.030 mol/L |
| HCHO | 0.050 mol/L |
| NaOH | 0.100 mol/L |
| α,α'-bipyridyl | 100 mg/L |
| Polyethylene glycol (PEG) | 0.10 g/L |

[Conditions for Electroless Plating]

Solution temperature of 30° C. for 40 minutes

Figure 13B:
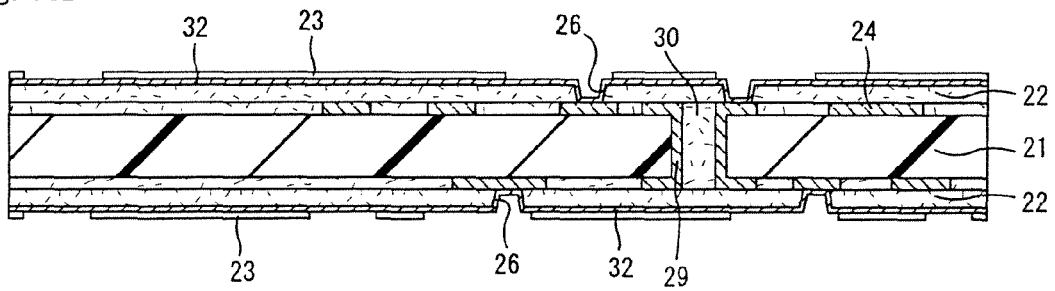

(11) Next, commercially available photosensitive dry films were pasted to the substrate on which thin film conductor layers (electroless copper plating films) 32 were formed, and the substrate was exposed to light of 100 mJ/cm$^2$ with a mask placed thereon, and then, a development process was carried out in a solution of 0.8% sodium carbonate, and thereby, plating resists 23 having a thickness of 20 µm were provided (see FIG. 13B).

Figure 13C:
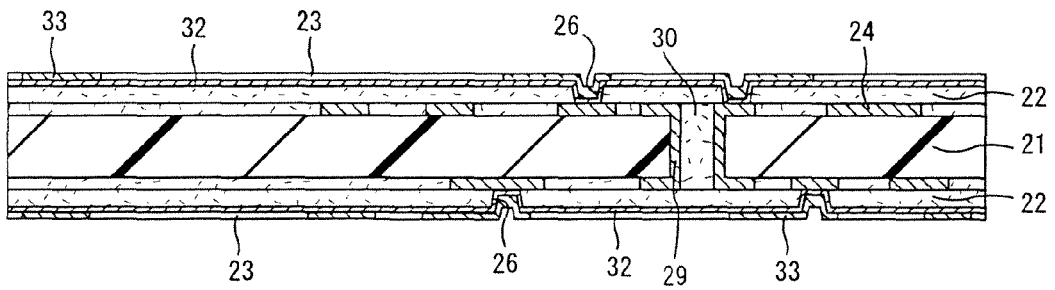

(12) Subsequently, the substrate was washed with water at 50° C. to carry out degreasing thereon, and then washed with water at 25° C., further washed with sulfuric acid, followed by electrolytic plating under the following conditions, and thereby electrolytic copper plating films 33 having a thickness of 20 µm were formed in the plating resists 23 non-forming portions (see FIG. 13C).

[Electrolytic Plating Solution]

| | |
|---|---|
| Sulfuric acid | 2.24 mol/L |
| Copper sulfate | 0.26 mol/L |
| Additive (Copperacid HL, made by Atotech Japan K.K.) | 19.5 ml/L |

[Conditions for Electrolytic Plating]

| | |
|---|---|
| Current density | 1 A/dm$^2$ |
| Time | 65 minutes |
| Temperature | 22 ± 2° C. |

Figure 13D:
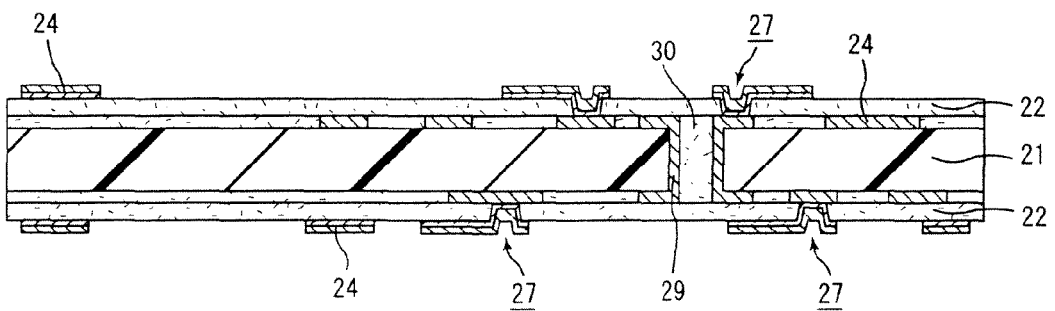

(13) Furthermore, the plating resists 23 were removed through peeling with 5% NaOH, and after that, the thin film conductor layers beneath these plating resists 23 were dissolved and removed through an etching process using a mixed solution of sulfuric acid and hydrogen peroxide, and thus, conductor circuits 24 (including via holes 27) having a thickness of 18 µm, formed of thin film conductor layers (electroless copper plating films) 32 and electrolytic copper plating films 33 were formed (see FIG. 13D).

Figure 14A:
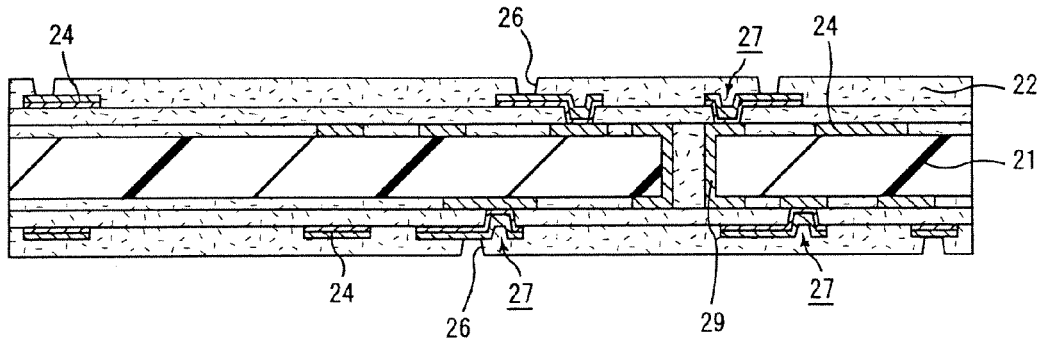
FIG. 14 is a cross-sectional view that schematically shows a part of the method for manufacturing a package substrate according to one embodiment of the present invention.

(14) Furthermore, the same kind of etchant as the etchant used in the above-described process (5) was used to form a coarse surface (not shown) on the surface of the conductor circuits 24, and then, interlayer resin insulating layers 22 having openings for via holes 26 where a coarse surface (not shown) was formed on the surface were formed and laminated in the same manner as in the processes (6) to (8) (see FIG. 14A).

Figure 14B:
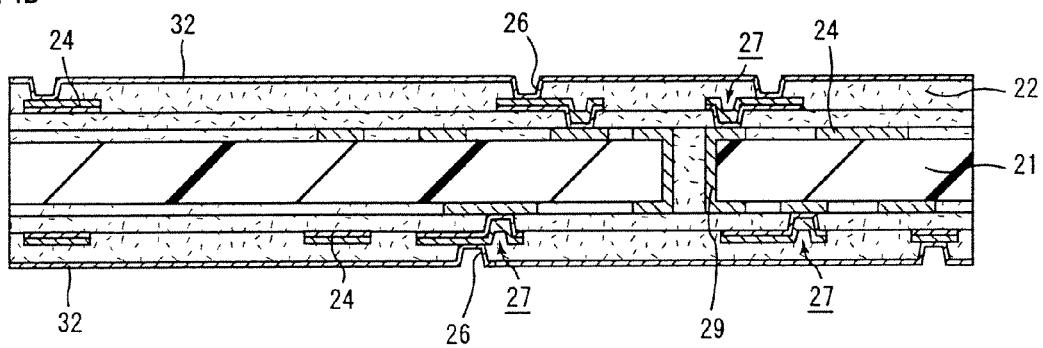

(15) Next, a catalyst was added to the surface of the interlayer resin insulating layers 22 (including the inner wall surface of the openings 26 for via holes) in accordance with the same method as the method used in the above-described process (9), and furthermore, the substrate was immersed in the same electroless copper plating solution as the electroless plating liquid used in the process (10), so that thin film conductor layers (electroless copper plating films) 32 were formed on the surface of the interlayer resin insulating layers 22 (including the inner wall surface of the openings 26 for via holes) (see FIG. 14B).

Figure 14C:
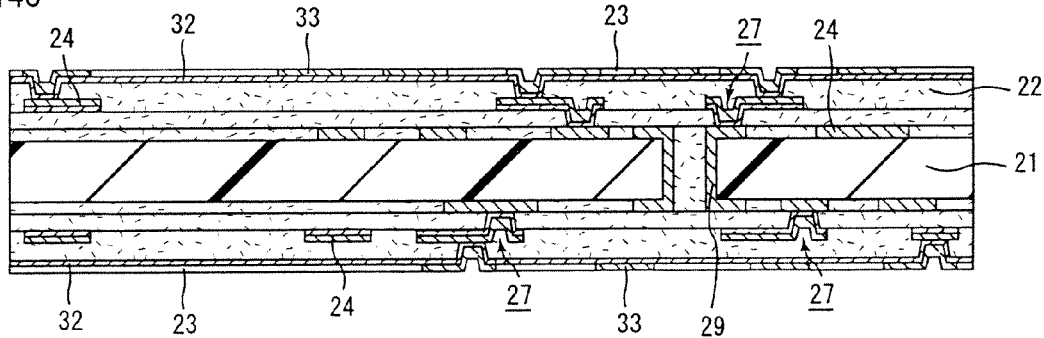

(16) Next, plating resists 23 were provided in accordance with the same method as the method used in the above-described process (11), and furthermore, electrolytic copper plating films 33 having a thickness of 20 µm were formed in the plating resists 23 non-forming portions in accordance with the same method as the method used in the above-described process (12) (see FIG. 14C).

(17) Next, the plating resists 23 were peeled off and the thin film conductor layers beneath the plating resists 23 were removed in accordance with the same method as the method used in the above-described process (13), so that conductor circuits 24 (including via holes 27) were formed.

Furthermore, an oxidation-reduction process was carried out in accordance with the same method as the method used in the above-described process (2), so that the surface of the conductor circuits 24 was converted to a coarse surface (not shown). The conductor circuits as the outermost layer of the optical element mounting-side is formed so that the optical element and the IC chip mounted on the final product of the package substrate are connected by linear conductor circuits each having the same length.

Figure 14D:
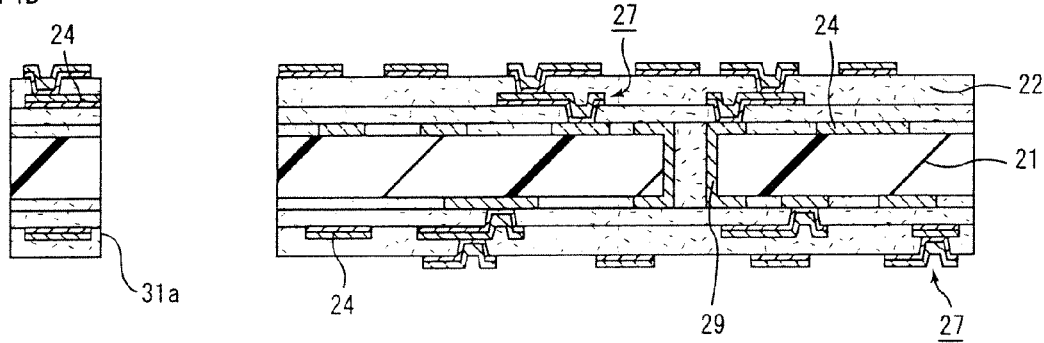

After that, a through hole for an optical path 31 which penetrates through the substrate 21 and the interlayer resin insulating layers 22 (the form in a plan view was a rectangle with rounded corners (240 µm in length×1000 µm in width)) was formed through a drilling process, and furthermore, a desmear process was carried out on the wall surface of the through hole for an optical path 31 (see FIG. 14D). In this case, a through hole for an optical path 31a having a collective through hole structure was formed.

(18) Next, a resin was placed on a plugging mask of a printing apparatus, and screen printing was carried out, and thereby, the through holes for an optical path 31 were filled in with the resin, and after that, a curing process was carried out under conditions of 120° C. for one hour and 150° C. for one hour, and subsequently, the resin that protruded from the through holes for an optical path 31 was polished using polishing paper #3000, and furthermore, the surface was polished to be flattened, using alumina particles having a diameter of 0.05 µm, and thus, a resin composite layer 47 was formed.

As the resin in this process, an epoxy resin (transmittance: 91%/mm, CTE: 82 ppm) to which 40% by weight of pulverized silica having a particle size distribution from 0.1 µm to 0.8 µm was added so that the transmittance became 82%/mm, the CTE became 42 ppm and the viscosity became 200000 cps, was used.

Figure 15A:
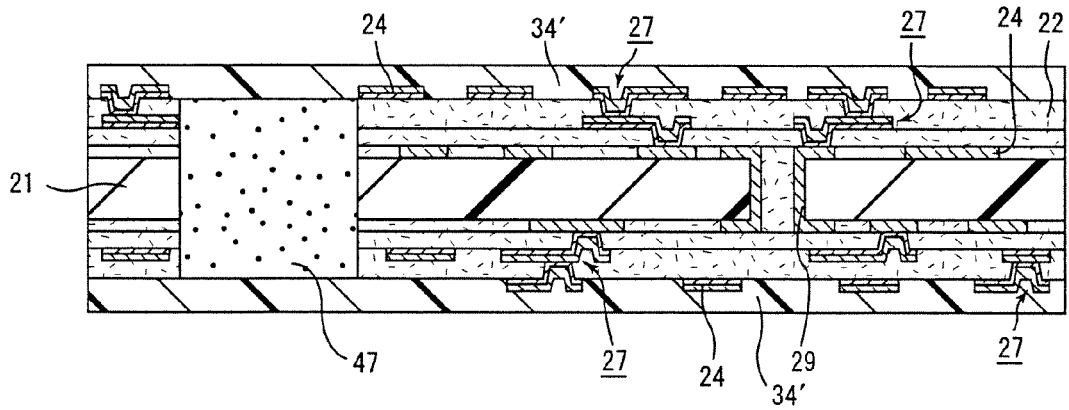
FIG. 15 is a cross-sectional view that schematically shows a part of the method for manufacturing a package substrate according to one embodiment of the present invention.

(19) Next, a solder resist composition (RPZ-1, manufactured by Hitachi Chemical Co., Ltd.) was applied on both sides of the substrate on which the resin composite layers 42a were formed so as to have a thickness of 30 µm, and a drying process was carried out under conditions of 70° C. for 20 minutes and 70° C. for 30 minutes, and thus, layers 34' of a solder resist composition were formed (see FIG. 15A).

(20) Next, a photo mask having a thickness of 5 mm where patterns of openings for forming solder bumps, openings for mounting optical elements and openings for optical paths were drawn was made to make contact with the layer of a solder resist composition 34' on the IC chip mounting-side, and then exposed to ultraviolet rays of 1000 mJ/cm$^2$, and a development process was carried out using a DMTG solution, and thus, the openings were created. Here, the cross-sectional diameter of the openings for optical paths formed here is the same as the cross-sectional diameter of the through holes for an optical path formed in the above process (14).

Figure 15B:
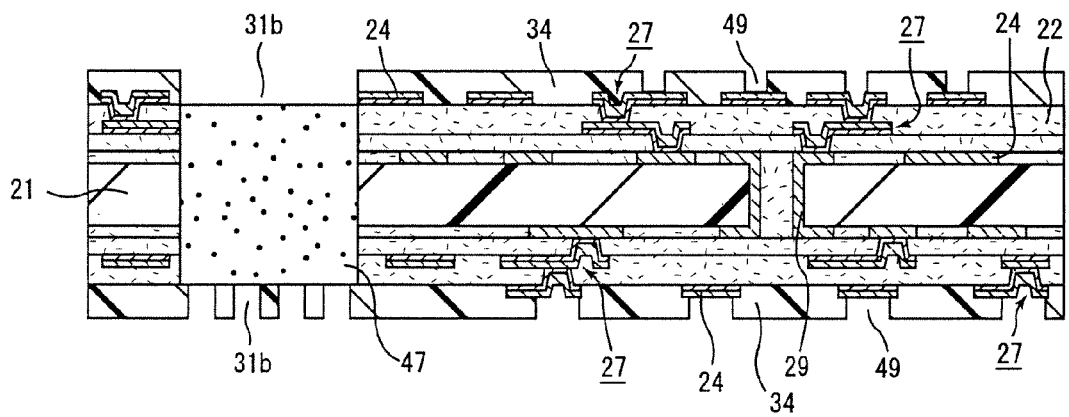

Furthermore, heat treatment was carried out under conditions of 80° C. for one hour, 100° C. for one hour, 120° C. for one hour and 150° C. for three hours, respectively, so that the layers of a solder resist composition cured, and thus, solder resist layers 34 each having a thickness of 20 μm and having openings for forming solder bumps 49, openings for mounting an optical element (not shown) and openings 31b for optical paths in a predetermined form were formed (see FIG. 15B).

Figure 15C:
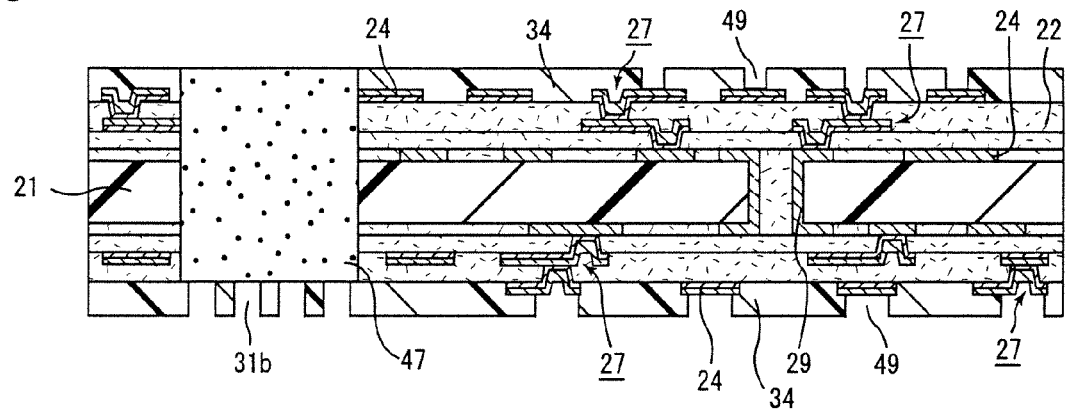

(21) Next, the openings 31a for an optical path formed in the process (20) were filled in with the same resin as the epoxy resin filled in the above process (18) by screen printing on the side where optical elements are to be mounted in the subsequent process, and after a curing treatment, a polishing treatment was carried out thereon to flatten the surface so that a resin composition layer 47 was formed (see, FIG. 15C)

(22) After that, the substrate on which the solder resist layers 34 were formed was immersed in an electroless nickel plating solution having a pH of 4.5 and including nickel chloride (2.3×10$^{-1}$ mol/L), sodium hypophosphite (2.8×10$^{-1}$ mol/L) and sodium citrate (1.6×10$^{-1}$ mol/L) for 20 minutes, and thus, nickel plating layers having a thickness of 5 μm were formed in the openings for forming solder bumps 49 and the openings for mounting an optical element (not shown). Furthermore, this substrate was immersed in an electroless gold plating solution including gold potassium cyanide (7.6×10$^{-3}$ mol/L), ammonium chloride (1.9×10$^{-1}$ mol/L), sodium citrate (1.2×10$^{-1}$ mol/L) and sodium hypophosphite (1.7×10$^{-1}$ mol/L) under conditions of 80° C. for 7.5 minutes, and thus, gold plating layers having a thickness of 0.03 μm were formed on top of the nickel plating layers for the formation of solder pads 36.

Figure 16A:
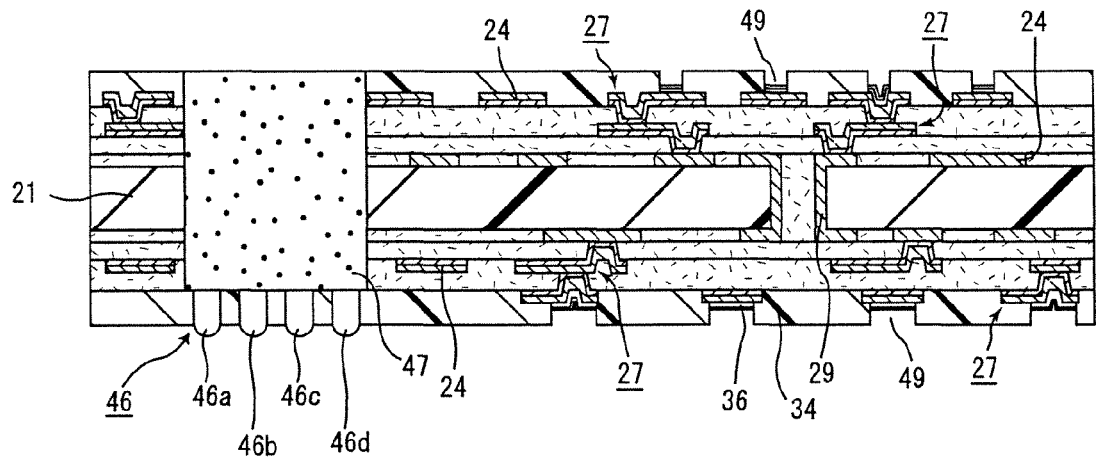
FIG. 16 is a cross-sectional view that schematically shows a part of the method for manufacturing a package substrate according to one embodiment of the present invention.

(23) Next, an inkjet apparatus was used to provide microlenses 46a to 46d at the end portions of the resin composition layer 47 formed at the optical signal passing region 42 on the side opposite to the underfill which was to be formed in the subsequent process in accordance with the following method (see FIG. 16A).

That is to say, a UV (ultraviolet) curing epoxy based resin (transmittance: 94%/mm, refractive index after curing: 1.53) was prepared so as to have a viscosity of 20 cps at room temperature (25° C.), and after that, this resin was adjusted so as to have a viscosity of 8 cps at a temperature of 40° C. within the resin container of the inkjet apparatus, and subsequently, the resin was applied in predetermined places on the end portions of the resin composition layer 47 in hemispherical form with a diameter of 220 μm and a degree of sagging of 9 μm, and furthermore, irradiated with UV light (500 mW/min) so that the resin was cured, and thus, microlenses 46a to 46d were provided.

(24) Next, a solder paste was printed on the openings 49 for forming solder bumps which were formed in the solder resist layers 34, and solder bumps 37 (Sn-3.5 Ag) were formed in the openings 49 for forming solder bumps. A light emitting element 38 was then mounted thereon according to the following method.

In mounting of an optical element 38, a light emitting element in which the unit element had the embodiment as shown in FIG. 2A was first prepared, and Au stud bumps were formed on external electrodes of this light emitting element. The Au stud bumps were formed by Au-bonding an Au wire onto an external electrode (pad) by using a stud bumping apparatus, and then cutting the Au wire.

Next, an uncured thermosetting epoxy resin was applied to the predetermined position (position to be symmetrical to the external electrodes with respect to the center line upon mounting the light emitting element 38) on the solder resist layer 34 by using a dispenser apparatus.

After that, a light emitting element 38 was mounted by a high accuracy flip chip bonder of a heat tool type and by using ultrasonic. Here, the light emitting element 38 was mounted so as to have a distance of the interspace of 30 μm with the surface of the solder resist layer by adjusting the height of the heat tool head, and then performing bump bonding.

Next, the thermosetting epoxy resin was thermally cured at 150° C. for 3 minutes by the heat generated at a stage for fixing the substrate and the heat tool head so that the light emitting element 38 was mounted.

Subsequently, a resin for an underfill adjusted to have the transmittance of 80%/mm, the CTE of 30 ppm and the viscosity of 50 cps was prepared by adding 60% by weight of pulverized silica having a particle size distribution from 0.1 μm to 0.8 μm to an epoxy based resin (transmittance: 90%/mm, CTE: 73 ppm), and after that, this resin for an underfill was applied around the surroundings of the light emitting element and left to penetrate into the gap (50 μm) between the light emitting element and the solder resist layer, and this resin for an underfill was cured under conditions of 120° C. for one hour and 150° C. for two hours to form an underfill 48. The refractive index of the underfill thus obtained here was 1.5.

Figure 16B:
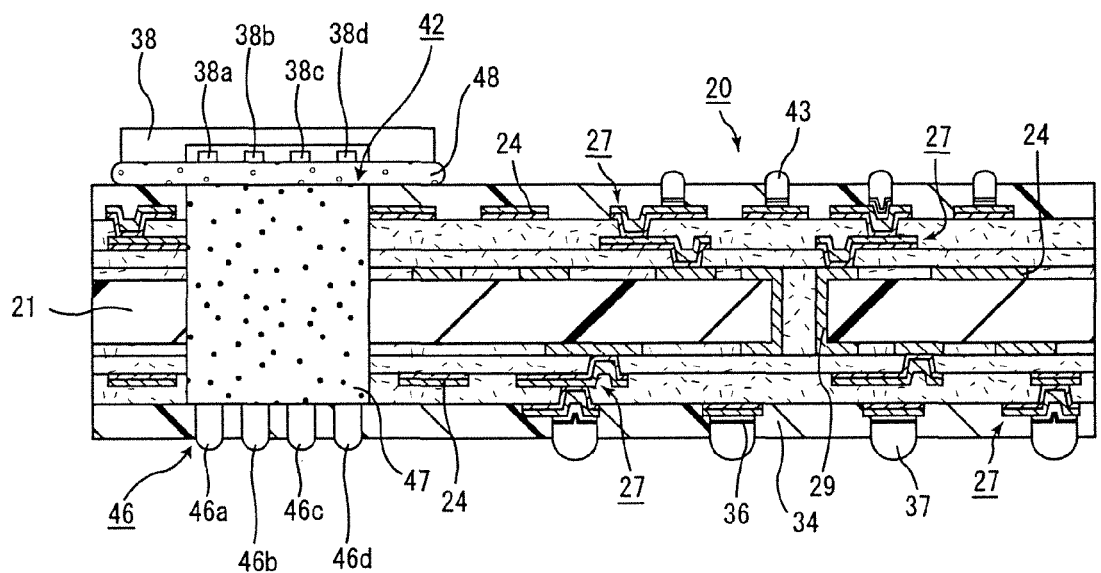

Through these processes, the package substrate was obtained (see FIG. 16B).

Example 2

A package substrate was manufactured in the same manner as in Example 1, except that, upon forming the solder bumps 37 (Sn-3.5Ag) in the openings 49 for forming solder bumps in the process (24) in Example 1, also a solder bump (Sn-3.5Ag) was simultaneously formed in the openings for mounting an optical element, and then a light emitting element was mounted thereon, using the method described below.

In mounting of a light emitting element, a light emitting element in which the unit element had the embodiment as shown in FIG. 2A was first prepared, and solder bumps (Sn-3.5Ag) were formed at external electrodes (pad) of this light emitting element.

Next, an uncured thermosetting epoxy resin was applied to the predetermined positions (positions symmetrical to the external electrodes with respect to the center line when the light emitting element was mounted) on the solder resist layer 34 by using a dispenser apparatus.

After that, the light emitting element was mounted by using heat tool method. Here, the light emitting element was mounted by adjusting the height of the heat tool head so that a gap between the light emitting element and the solder resist layer has a distance of 30 μm, and performing bump bonding.

Next, the thermosetting epoxy resin was thermally cured at 150° C. for 3 minutes by the heat generated at a stage for fixing the substrate and the heat tool head so that the light emitting element was mounted.

Example 3

A package substrate was manufactured in the same manner as in Example 1, except that a light emitting element was mounted by the following method in the process (24) in Example 1.

In mounting of the light emitting element, a light emitting element in which the unit element had the embodiment as shown in FIG. 2A was first prepared, and Au stud bumps were formed at external electrodes of this optical element.

Next, an epoxy resin film (level maintaining member) having a thickness of 30 μm was fixed at the predetermined position (position in the region on the opposite side of the external electrodes with respect to the center line when the light emitting element was mounted) on the solder resist layer by interposing an epoxy resin adhesive. Next, a resin adhesive was applied on the surface of this epoxy resin film. Here, the arrangement was made for the adhesive applied on the upper and the lower surfaces of the epoxy resin film to have an after-cure thickness of the upper and lower surfaces in total of 3 μm.

After that, a light emitting element 38 was mounted by a high accuracy flip chip bonder of a heat tool type and by using ultrasonic. Here, the light emitting element was mounted by adjusting the height of the heat tool head so that a gap between the light emitting element and the solder resist layer had a distance of 33 μm, and performing bump bonding.

Next, the epoxy resin adhesive applied onto the epoxy resin film was thermally cured with heat generated at a stage for fixing the substrate and the heat tool head at 15° C. for 3 minutes so that the light emitting element was mounted.

Example 4

A package substrate was manufactured in the same manner as in Example 1, except that, upon forming the solder bumps 37 (Sn-3.5Ag) in the openings 49 for forming solder bumps in the process (24) in Example 1, solder bumps (Sn-3.5Ag) were simultaneously formed in the openings for mounting an optical element, and then a light emitting element was mounted thereon, using the method described below.

In mounting of the light emitting element, the light emitting element in which the unit element had the embodiment as shown in FIG. 2A was first prepared, and solder bumps (Sn-3.5Ag) were formed at external electrodes (pad) of this optical element. Furthermore, an epoxy resin film (level maintaining member) having a thickness of 50 μm was fixed in the region on the opposite side of the external electrodes with respect to the center line by interposing an epoxy resin adhesive so that an unit element as shown in FIG. 2D was obtained.

Next, an uncured thermosetting epoxy resin was applied to the predetermined positions (positions corresponding to the epoxy resin film) on the solder resist layer 34 by using a dispenser apparatus, and then the light emitting element was mounted by using heat tool method. Here, the light emitting element was mounted by adjusting the height of the heat tool head so that a gap between the light emitting element and the solder resist layer had a distance of 55 μm, and performing bump bonding.

Next, the thermosetting epoxy resin was thermally cured with heat generated at a stage for fixing the substrate and the heat tool head at 150° C. for 3 minutes so that the light emitting element was mounted.

Here, the arrangement was made for the adhesive applied on the upper and the lower surfaces of the epoxy resin film to have an after-cure thickness of the upper and lower surfaces in total of 5 μm.

Example 5

A package substrate was manufactured in the same manner as in Example 1, except that a light emitting element was mounted by the following method in the process (24) in Example 1.

In mounting of a light emitting element, a light emitting element in which the unit element has an embodiment as shown in FIG. 2E was prepared, and Au stud bumps were formed on each of the external electrodes and the dummy electrodes of this light emitting element.

Next, the light emitting element was mounted by a high accuracy flip chip bonder of a heat tool type and by using ultrasonic. Here, the light emitting element was mounted by adjusting the height of the heat tool head so that a gap between the light emitting element and the solder resist layer had a distance of 30 μm, and performing bump bonding on each of the external electrodes and the dummy electrodes.

Example 6

A package substrate was manufactured in the same manner as in Example 1, except that, upon forming the solder bumps 37 in the openings 49 for forming solder bumps in the process (24) in Example 1, solder bumps were simultaneously formed in the openings for mounting an optical element, and then a light emitting element was mounted by the following method. Here, in this example, Sn-37Pb solder bumps with a flattened top were formed at the openings for forming solder bumps and the openings for mounting an optical element.

In mounting of a light emitting element, a light emitting element in which the unit element had the embodiment as shown in FIG. 2E was first prepared, and solder bumps (Sn-37Pb) were formed at each of the external electrodes and the dummy electrodes of this light emitting element.

Next, flux application was performed and then a light emitting element was mounted thereon by the heat tool method using a flip chip bonder, followed by flux washing. Here, the light emitting element was mounted in such a manner that a gap between the light emitting element and the solder resist layer had a distance of 50 μm.

Example 7

A package substrate was manufactured in the same manner as in Example 1, except that, upon forming the solder bumps 37 in the openings 49 for forming solder bumps in the process (24) in Example 1, solder bumps were simultaneously formed in the openings for mounting an optical element, and then a light emitting element was mounted thereon by the following method. Here, in this example, Sn-37Pb solder bumps with a flattened top were formed at the openings for forming solder bumps and the openings for mounting an optical element.

In mounting of a light emitting element, a light emitting element in which the unit element had the embodiment as shown in FIG. 2E was first prepared, and solder bumps (Sn-10Pb) were formed at each of the external electrodes and the dummy electrodes of this light emitting element.

Next, flux application was performed and the light emitting element was mounted using a flip chip bonder, and then the solder was melted in a reflow furnace so that the light emitting element was mounted by using the self-alignment effect, and lastly flux washing was performed. Here, the light emitting element was mounted in such a manner that a gap between the light emitting element and the solder resist layer had a distance of 50 μm.

In this example, since a high temperature solder of Sn-10Pb was used for solder bumps at the side of the light emitting element, the solder bumps did not melt in the reflow process, and only the Sn-37Pb solder at the substrate side melts to be soldered.

Examples 8 to 14

A package substrate was manufactured in the same manner as in Examples 1 to 7, except that a light emitting element was replaced with a light receiving element having the same kind of embodiment in each of the Examples 1 to 7.

Comparative Example 1

A package substrate was manufactured in the same manner as in Example 5, except that a light emitting element as described below was mounted.

As for the light emitting element, a light emitting element in which two external electrodes (n-side electrode and p-side electrode) were formed at symmetrical positions with respect to a center line, and also two dummy electrodes were formed at symmetrical positions with respect to a center line, that is, a light emitting element having an unit element with an embodiment of FIG. 2E in which 542 and 546*a* correspond to external electrodes and 543 and 546*b* correspond to dummy electrodes, was used.

Comparative Example 2

A package substrate was manufactured in the same manner as in Example 6, except that a light emitting element as described below was mounted.

As for the light emitting element, a light emitting element in which two external electrodes (n-side electrode and p-side electrode) were formed at symmetrical positions with respect to a center line, and also two dummy electrodes were formed at symmetrical positions with respect to a center line, that is, a light emitting element having an unit element with an embodiment of FIG. 2E in which 542 and 546*a* correspond to external electrodes and 543 and 546*b* correspond to dummy electrodes, was used.

Comparative Example 3

A package substrate was manufactured in the same manner as in Example 7, except that a light emitting element as described below was mounted.

As for the light emitting element, a light emitting element in which two external electrodes (n-side electrode and p-side electrode) were formed at symmetrical positions with respect to a center line, and also two dummy electrodes were formed at symmetrical positions with respect to a center line, that is, a light emitting element having an unit element with an embodiment of FIG. 2E in which 542 and 546*a* correspond to external electrodes and 543 and 546*b* correspond to dummy electrodes, was used.

Comparative Examples 4 to 6

A package substrate was manufactured in the same manner as in Comparative Examples 1 to 3, except that, instead of a light emitting element, a light receiving element having the same kind of embodiment as in each of the Comparative Examples 1 to 3 was mounted.

In the above-described Examples and Comparative Examples, a four-channel VCSEL was used as a light emitting element, and a four-channel PD was used as a light receiving element. Here, the size of the unit element was a rectangular of 490 μm×124 μm in a plan view, and the external electrodes were made of gold/nickel.

In the Examples and Comparative Examples, 5 pieces each of the package substrate were manufactured.

With regard to the package substrates of Examples and Comparative Examples, a mounting position accuracy of each optical element, and a parallelism between the surface of a solder resist layer and an optical element were evaluated. The results showed that there was no significant difference in the mounting position accuracy and the parallelism between Examples and Comparative Examples.

More specifically, in the case where an optical element was mounted through Au stud bumps or solder bumps by the heat tool method, using a high accuracy flip chip bonder as in Examples 1 to 6 and 8 to 13 as well as Comparative Examples 1, 2, 4 and 5, the mounting position accuracy was 3 μm or less, and the parallelism was 2 μm or less.

On the other hand, in the case where an optical element was mounted by self-alignment during reflow using solder bumps as in Examples 7 and 14 as well as Comparative Examples 3 and 6, the mounting position accuracy was 10 μm or less, and the parallelism was 4 μm or less.

The mounting position accuracy and the parallelism were evaluated according to the following methods.

That is, the evaluation of the mounting position accuracy was carried out according to the methods described in the above Examples and Comparative Examples, by mounting an optical element on a glass substrate, calculating the center position of the substrate from the alignment marks on the substrate, and further measuring the deviation between the position of the light receiving portion or the light emitting portion of the optical element and the center position of the substrate.

Evaluation of the parallelism was carried out by cross-cutting the package substrate after completion of evaluation of optical transmission as mentioned below, measuring the length of the voids from the surface of the solder resist layer to the optical element at the five sites, i.e. four corners and the center in a plan view, and calculating the average value based on the values obtained by measurement.

Also, evaluation of optical transmission was carried out on the package substrates obtained in Examples and Comparative examples.

More specifically, a substrate for a motherboard having a 5 cm of optical waveguide formed therein was prepared, and a package substrate mounted with VCSEL and a package substrate mounted with PD were mounted on the substrate for a motherboard, and then an electrical signal was transmitted into a test connector by a pulse generator of the package substrate mounted with VCSEL, through a driver IC, converted into an optical signal in VCSEL, and the optical signal was transmitted to the optical waveguide. After that, an optical signal transmitted through the optical waveguide was received at PD, converted into an electrical signal, and through an amplifier IC, the electrical signal was transmitted out from the test connector, and evaluation was made whether or not the optical transmission was completed based on the eye-pattern opening by using an oscilloscope.

Here, evaluation of optical transmission was made on 1.25 Gbps and 2.5 Gbps, respectively.

Combination of the package substrate mounted with VCSEL and the package substrate mounted with PD for the evaluation of optical transmission were combinations of Examples 1 and 8, Examples 2 and 9, Examples 3 and 10, Examples 4 and 11, Examples 5 and 12, Examples 6 and 13, Examples 7 and 14, Comparative Examples 1 and 4, Comparative Examples 2 and 5, and Comparative Examples 3 and 6. In other words, a combination for the evaluation was selected so as to include package substrates having the same kind of structures, except for the option of VCSEL or PD mounted as the optical element.

Five pcs of samples were manufactured for each combination for the evaluation.

The results of the evaluation of optical transmission are as shown in Table 1. Here, the results of the evaluation were shown by the quality product rate (rate of samples judged to have been normally carried out optical transmission, based on the eye-patterns).

TABLE 1

|  | 1.25 Gbps (%) | 2.5 Gbps (%) |
|---|---|---|
| Example 1 + Example 8 | 100 | 100 |
| Example 2 + Example 9 | 100 | 100 |
| Example 3 + Example 10 | 100 | 100 |
| Example 4 + Example 11 | 100 | 100 |
| Example 5 + Example 12 | 100 | 100 |
| Example 6 + Example 13 | 100 | 100 |
| Example 7 + Example 14 | 100 | 100 |
| Comparative Example 1 + Comparative Example 4 | 80 | 80 |
| Comparative Example 2 + Comparative Example 5 | 100 | 60 |
| Comparative Example 3 + Comparative Example 6 | 80 | 40 |

As is clear from the results shown in Table 1, when the package substrate according to Examples were used, an optical signal could be accurately transmitted at both 1.25 Gbps and 2.5 Gbps, whereas when the package substrate according to Comparative examples were used, sometimes an optical transmission at 1.25 Gbps could not be achieved, and the failure rate of optical transmission was increased at 2.5 Gbps.

Those results show that package substrates and the like using the optical element according to the embodiments of the present invention are suitable for a high speed optical transmission.

In the present situation, 5 Gbps and 10 Gbps optical transmissions have been developed, and conventional optical elements and package substrates have difficulty in handling such high speed optical transmissions, while presumably the optical elements and the package substrate according to the embodiments of the present invention are suitable.

Here, evaluation of the mounting position accuracy of an optical element was performed by clairvoyant observation of the optical element, and therefore the optical element was mounted on a glass substrate which was suitable for the clairvoyant observation of the optical element, however, in the case where the optical element was mounted on a substrate or an inter layer resin insulating layer made of a resin material, and then the evaluation was performed, the same results were obtained.

Example 15

A. Manufacturing of Resin Film for Interlayer Resin Insulating Layer

A resin film for interlayer resin insulating layer was manufactured in the same manner as in the process A of Example 1.

B. Preparation of Resin Composite for Filling Through Holes

A resin composite for filling through holes was prepared in the same manner as in the process B of Example 1.

Figure 17A:
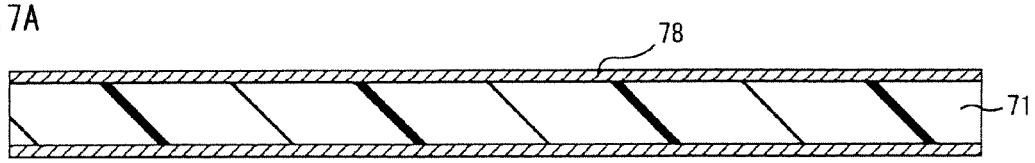
FIG. 17 is a cross sectional view that schematically shows a part of a method for manufacturing a substrate for motherboard which constitutes a device for optical communication according to one embodiment of the present invention.

C. Manufacturing of Substrate for a Motherboard (1) A copper-clad laminated board, prepared by laminating a 18 μm-thick copper foil 78 on both surfaces of an insulating substrate 71 made of a glass epoxy resin or a BT (bismaleimide-triazine) resin having a thickness of 0.8 mm, was used as a starting material (see FIG. 17A). First, this copper-clad laminated board was drilled and electroless-plated, and a pattern-wise etching was carried thereon to form a conductor circuit 74 and a through hole 79 on both surfaces of the substrate 71.

Figure 17B:
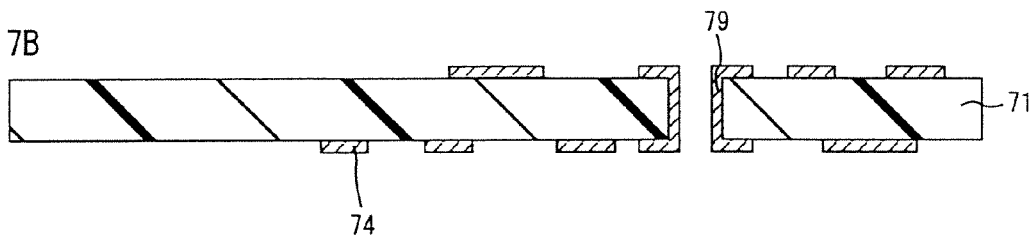

(2) The substrate formed with the through hole 79 and the conductor circuit 74 was rinsed with water and dried. Then, blackening treatment using an aqueous solution containing NaOH (10 g/L), NaClO$_2$ (40 g/L) and Na$_3$PO$_4$ (6 g/L) as a blackening bath (oxidation bath) and reduction treatment using an aqueous solution containing NaOH (10 g/L) and NaBH$_4$ (6 g/L) as a reduction bath were carried out to form a roughened surface (not shown) on the conductor circuit 74 including the through hole 79 (see FIG. 17B).

(3) Within 24 hours after preparing the resin filling described in the above-mentioned B, layers 80' of the resin filling were formed through the following method, inside the through hole 79, and on the conductor circuit non-forming portion and on the outer peripheral portion of the conductor circuit 74, both of which the position is on either of the surfaces of the substrate 71.

Figure 17C:
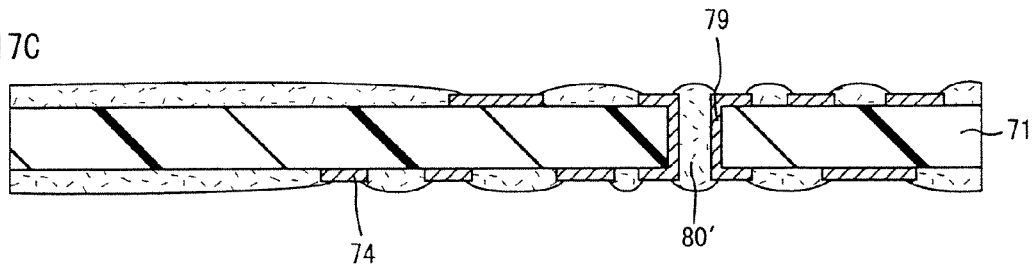

That is, first, after the resin filling had been pressed into the through hole by using a squeegee, the filled-in resin was dried at 100° C. for 20 minutes. Then, a mask having an opening at a portion corresponding to the conductor circuit non-forming portion was placed on the substrate, and by using a squeegee, the resin filling was also filled into the conductor circuit non-forming portion in a recess shape (cavity shape), and dried at 100° C. for 20 minutes, thereby the layers 80' of the resin filling were formed (see FIG. 17C).

(4) The one side face of the substrate treated as in the above (3) was polished with a belt sander polishing using a belt polishing paper #600 (made by Sankyo Rikagaku Co., Ltd.) so as to leave no resin filling 80' on the surface of the conductor circuit 74 and the land surface of the through hole 79, and buffing polishing was carried out to remove scratches caused by the belt sander polishing. A series of this polishing process was carried out on the opposite side of the substrate as well.

Then, heat treatment was carried out for 1 hour at 100° C., for 3 hours at 120° C., for 1 hour at 150° C. and for 7 hours at 180° C., such that a resin filling layer 80 was formed.

Figure 17D:
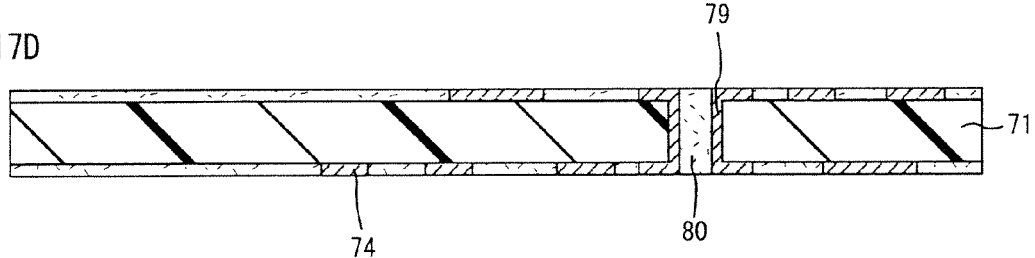

In this manner, an insulating substrate (see FIG. 17D), in which the surface layer portion of the resin filling layer 80 formed in the through hole 79 and the conductor circuit non-forming portion as well as the surface of the conductor circuit 74 were flattened; the resin filling layer 80 and the side surfaces of the conductor circuit 74 were firmly joined together via the roughened surface (not shown); and the inner wall face of the through hole 79 and the resin filling layer 80 were firmly joined together via the roughened surface (not shown), was obtained (see FIG. 17D).

Through these processes, the surface of the resin filling layer 80 became coplanar with the surface of the conductor circuit 74.

(5) Then, the substrate was washed with water and acid-degreased, and then soft-etched, and after spraying an etchant over both surfaces of the substrate, the surface of the conductor circuit 74 and the land surface and inner wall of the through hole 79 were etched, such that a roughened surface (not shown) was formed over the entire surface of the conductor circuit 74. As the etchant, an etchant (MECetchBOND made by Mec Co., Ltd.) containing 10 parts by weight of imidazole copper (II) complex, 7 parts by weight of glycolic acid and 5 parts by weight of potassium chloride was used.

Figure 17E:
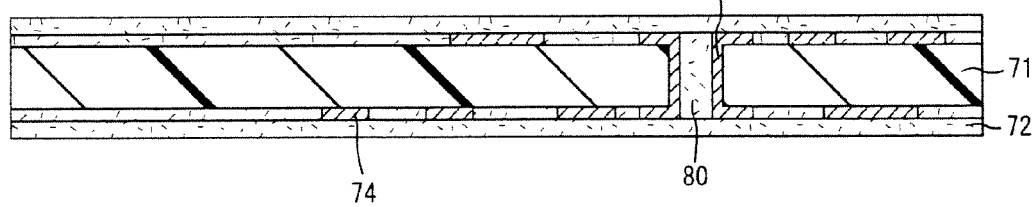

(6) Then, a resin film for an interlayer resin insulating layer, which was slightly larger than the substrate manufactured in the above-mentioned process A, was placed on the substrate, and temporarily pressure-bonded thereto under conditions of a pressure of 0.4 MPa, a temperature of 80° C. and a press-bonding time of 10 seconds, and then a cutting process was carried out thereon, and the resulting film was affixed by using a vacuum laminator apparatus through the following method, such that an interlayer resin insulating layer 72 was formed (see FIG. 17E).

That is, the resin film for an interlayer resin insulating layer was actually pressure-bonded onto the substrate under conditions of a degree of vacuum of 65 Pa, a pressure of 0.4 MPa, a temperature of 80° C. and a press-bonding time of 60 seconds, and then heated for curing at 170° C. for 30 minutes.

Figure 17F:
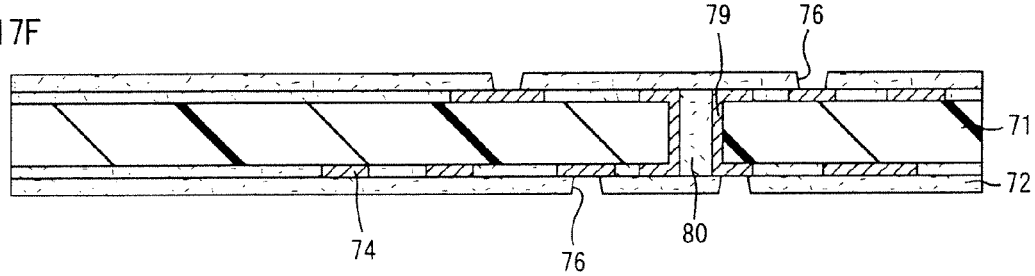

(7) Next, an opening 76 for a via hole of 80 μm in diameter was formed on the interlayer resin insulating layer 72 (see FIG. 17F) by applying a $CO_2$ gas laser having a wavelength of 10.4 μm onto the interlayer resin insulating layer 72 via a mask of 1.2 mm in thickness in which a through hole was formed, under conditions of one shot of a beam diameter of 4.0 mm, in a top-hat mode, a pulse width of 8.0 μs, and the through hole of the mask having 1.0 mm in diameter.

(8) The substrate in which the opening 76 for a via hole had been formed was immersed in a solution containing permanganate of 60 g/L at 80° C. for 10 minutes, and epoxy resin particles remaining on the surface of the interlayer resin insulating layer 72 were dissolved and removed, such that a roughened surface (not shown) was formed on the surface including the inner wall faces of the opening 76 for a via hole.

(9) Next, the substrate that had been through the above-mentioned processes was immersed in a neutral solution (made by Shipley Co., Ltd.), and then washed with water.

On the surface of the surface-roughened substrate (roughened depth: 3 μm), a palladium catalyst was applied to deposit the catalyst nucleus on the surface of the interlayer resin insulating layer 72 (including the inner wall faces of the opening 76 for a via hole) (not shown). In other words, the substrate was immersed in a catalyst solution containing palladium chloride ($PdCl_2$) and stannous chloride ($SnCl_2$), such that, by deposition of palladium metal, the catalyst was applied thereto.

Figure 18A:
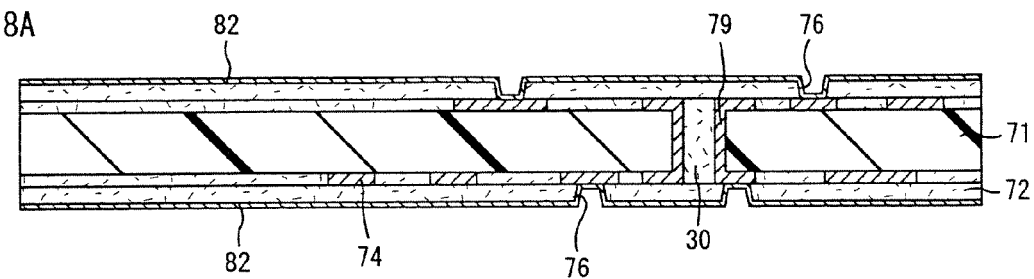
FIG. 18 is a cross-sectional view that schematically shows a part of a method for manufacturing a substrate for motherboard which constitutes a device for optical communication according to one embodiment of the present invention.

(10) Next, the substrate was immersed in an electroless copper plating solution of the following composition, to form a thin-film conductor layer (electroless copper plating film) 82, 0.6 to 3.0 μm in thickness, on the surface of the interlayer resin insulating layer 72 (including the inner wall faces of the opening 76 for a via hole) (see FIG. 18A).

[Electroless Plating Solution]

| | |
|---|---|
| $NiSO_4$ | 0.003 mol/L |
| Tartaric acid | 0.200 mol/L |
| Copper sulfate | 0.030 mol/L |
| HCHO | 0.050 mol/L |
| NaOH | 0.100 mol/L |
| α,α'-bipyridyl | 100 mg/L |
| polyethylene glycol (PEG) | 0.10 g/L |

[Conditions for Electroless Plating]
Solution Temperature of 30° C. for 40 Minutes

Figure 18B:
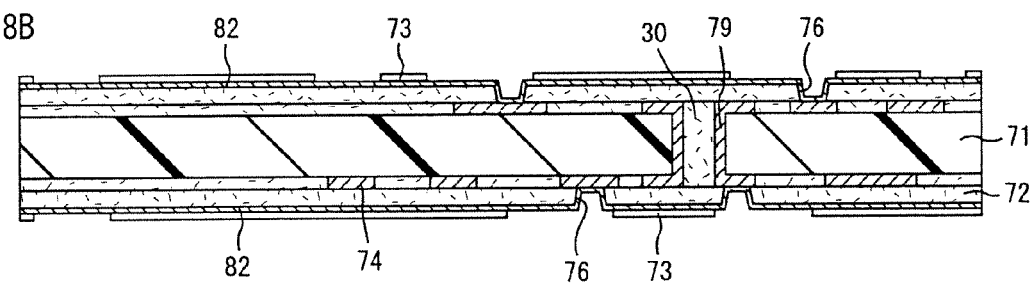

(11) A commercially available photosensitive dry film was affixed to the substrate on which the thin-film conductor layer (electroless copper plating film) 82 was formed, and with a mask set in position, an exposure at 100 mJ/$cm^2$ and a development with a 0.8% sodium carbonate solution were carried out to provide a 20 μm-thick plating resist 73 (see FIG. 18B).

Figure 18C:
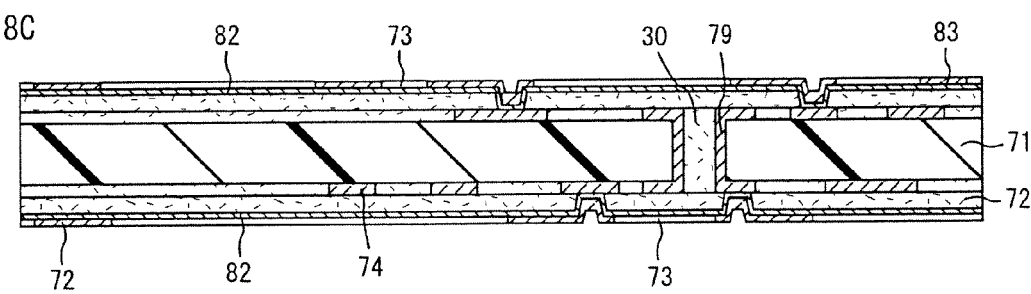

(12) Then, the substrate was washed with water at 50° C. to be degreased, and after having been washed with water at 25° C., the resulting substrate was further washed with sulfuric acid, and then electrolytic plating was carried out thereon under the following conditions, such that a 20 μm-thick electrolytic copper plating film 83 was formed on the plating resist 73 non-forming portion (see FIG. 18C).

[Electrolytic Plating Solution]

| | |
|---|---|
| Sulfuric acid | 2.24 mol/l |
| Copper Sulfate | 0.26 mol/l |
| Additive (Copperacid HL, made by Atotech Japan K.K.) | 19.5 ml/l |

[Conditions for Electrolytic Plating]

| | |
|---|---|
| Current density | 1 A/$dm^2$ |
| Time | 65 min |
| Temperature | 22 ± 2° C. |

Figure 18D:
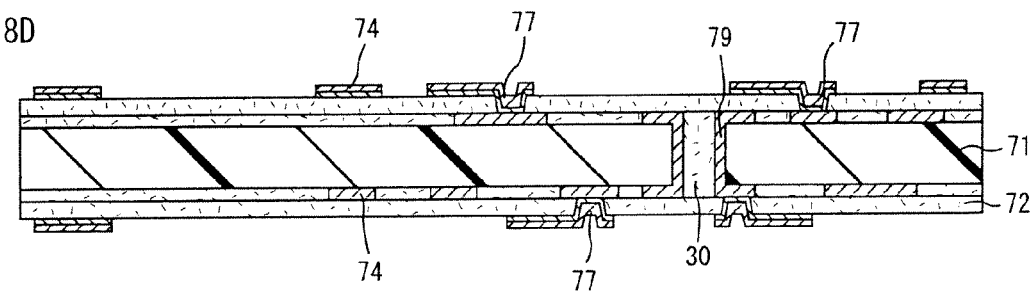

(13) Then, after the plating resist 73 was separated with 5% NaOH, the thin-film conductor layer beneath the plating resist 73 was etched and dissolved with a mixed solution of sulfuric acid and hydrogen peroxide to form a 18 μm-thick conductor circuit 74 (including via hole 77), constituted by the thin-film conductor layer (electroless copper plating film) 82 and the electrolytic copper plating film 83, was formed (see FIG. 18D).

(14) By using the same etchant as the etchant used in the above process (5), a roughened surface (not shown) was formed on the surface of the conductor circuit 74, and the same processes as those in the processes (6) to (8) were carried out, so that an interlayer resin insulating layer 72, which had an opening 76 for a via hole and was provided with the roughened surface (not shown) formed on its surface, was formed and laminated.

Figure 19A:
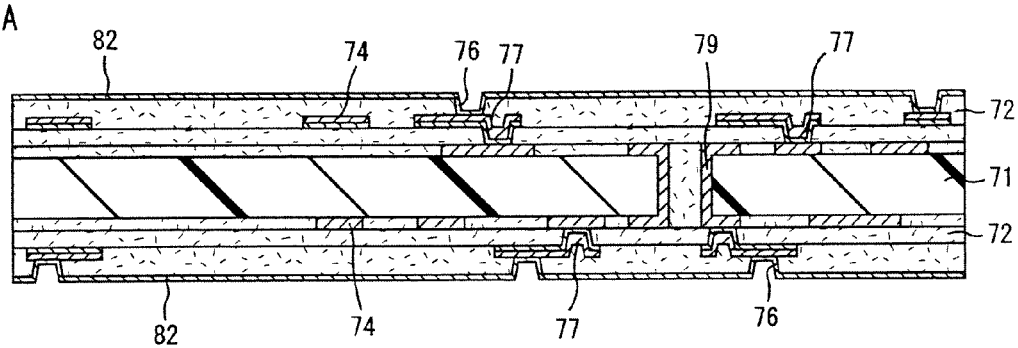
FIG. 19 is a cross-sectional view that schematically shows a part of the method for manufacturing a substrate for motherboard which constitutes a device for optical communication according to one embodiment of the present invention.

(15) Next, by using the same method as the method used in the process (9), a catalyst was applied to the surface of the interlayer resin insulating layer 72 (including inner wall faces of the opening 76 for a via hole), and the substrate was immersed in the same electroless copper plating aqueous solution as the electroless plating solution used in the process (10), such that a thin-film conductor layer (electroless copper plating film) 82 was formed on the surface of the interlayer resin insulating layer 72 (including inner wall faces of the opening 76 for a via hole) (see FIG. 19A).

Figure 19B:
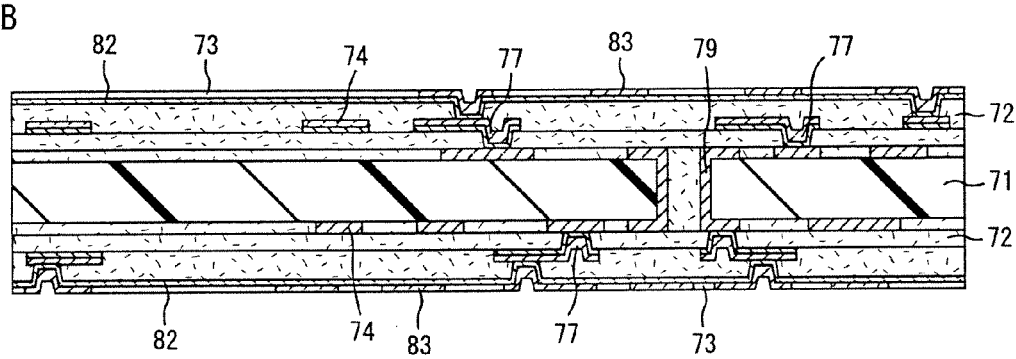

(16) By using the same method as the method used in the process (11), a plating resist 73 was provided, and by using the same method as the method used in the process (12), a 20 μm-thick electrolytic copper plating film 83 was formed on the plating resist 73 non-forming portion (see FIG. 19B).

Figure 19C:
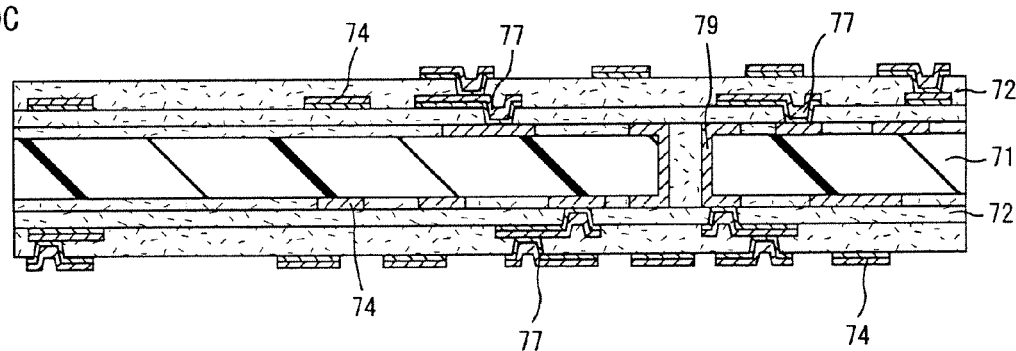

(17) By using the same method as the method used in the process (13), the plating resist 73 was separated and the thin-film conductor layer beneath the plating resist 73 was removed to form a conductor circuit 74 (including via hole 77) (see FIG. 19C).

Furthermore, by using the same method as the method used in the process (2), oxidation-reduction treatment was carried out to form a roughened surface (not shown) on the surface of the conductor circuit 74.

Figure 19D:
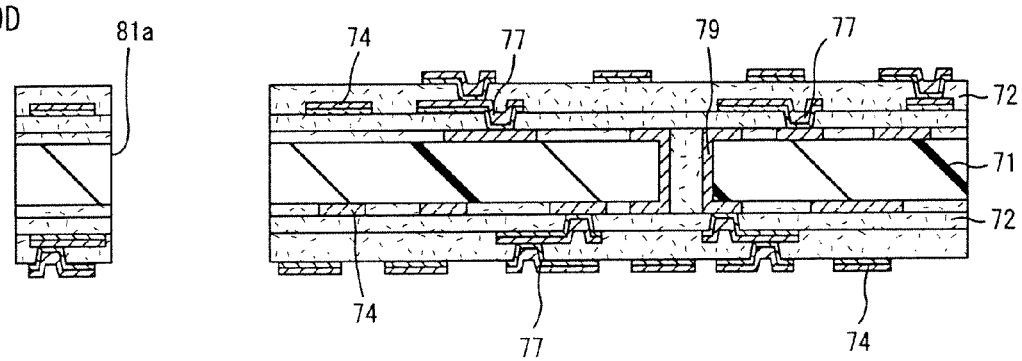

Thereafter, a through hole 81*a* for an optical path (having a rectangle shape with rounded corners (240 μm in length× 1000 μm in width) in a plan view), which penetrates through the substrate 71 and the interlayer resin insulating layer 72, was formed by drilling, and desmear treatment was carried out on the wall faces of the through hole 81*a* for an optical path (see FIG. 19D). In this case, the through hole 81*a* for an optical path of the collective through hole structure was formed.

Figure 20A:
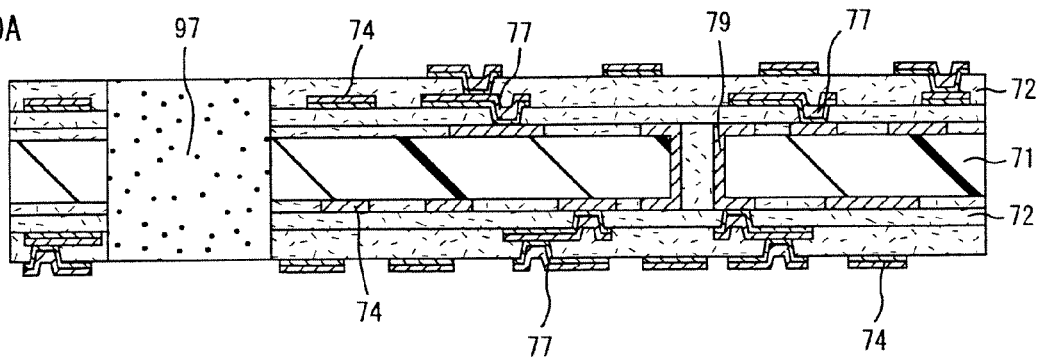
FIG. 20 is a cross-sectional view that schematically shows a part of the method for manufacturing a substrate for motherboard which constitutes a device for optical communication according to one embodiment of the present invention.

(18) Next, resin was placed on a plugging mask of a printing apparatus and a screen printing was carried out, so that the through hole 81*a* for an optical path was filled in with the resin, and this was then cured at 120° C. for one hour and at 150° C. for one hour. Thereafter, the resin protruding from the through hole 81*a* for an optical path was polished with a polishing paper #3000, and further polished with alumina particles of 0.05 μm to flatten the surface so that a resin composite layer 97 was formed (see FIG. 20A).

In this process, the resin was prepared by adding 40% by weight of pulverized silica having a grain-size distribution of 0.1 to 0.8 μm to epoxy resin (transmittance 91%/mm, CTE 82 ppm) so as to set the transmittance to 82%/mm, the CTE to 42 ppm, and the viscosity to 200000 cps, and the resulting resin was used.

(19) Next, by using the following method, an optical waveguide 50 with four cores 51*a* to 51*d* arranged therein in parallel with one another was formed at an end portion of the through hole 96 for an optical path in which the resin composite layer 97 was formed.

First, an acrylic-based resin (refractive index: 1.52, transmittance: 94%/mm, CTE: 72 ppm) as a resin for forming a core, and a resin for forming a clad made by adding 25% by weight of pulverized silica having a grain-size distribution of 0.1 to 0.8 μm to an acrylic-based resin (refractive index: 1.51, transmittance: 93%/mm, CTE: 70 ppm) so as to set the transmittance, to 81%/mm the CTE to 53 ppm and the viscosity to 1000 cps, were prepared.

Figure 20B:
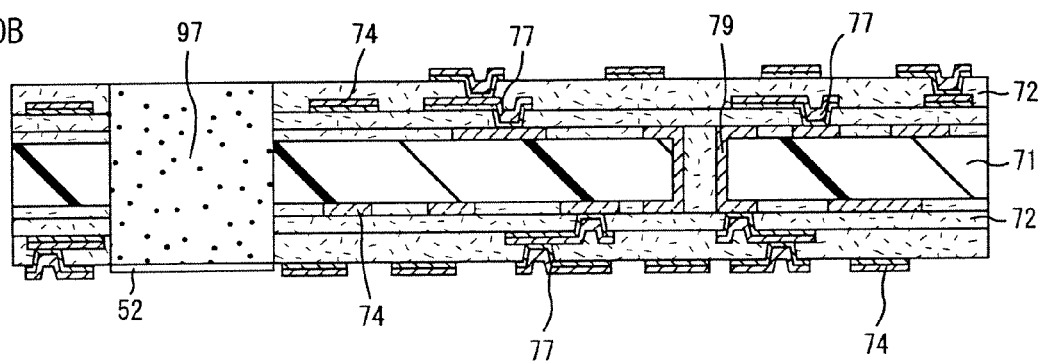

The resin for forming a clad was applied to an end portion of the through hole for an optical path by using a spin coater (1000 μm/10 sec), and then pre-baking at 80° C. for 10 minutes, exposure treatment at 2000 mJ and post-baking at 150° C. for 1 hour were carried out to form a lower clad of 50 μm in thickness (see FIG. 20B).

Figure 20C:
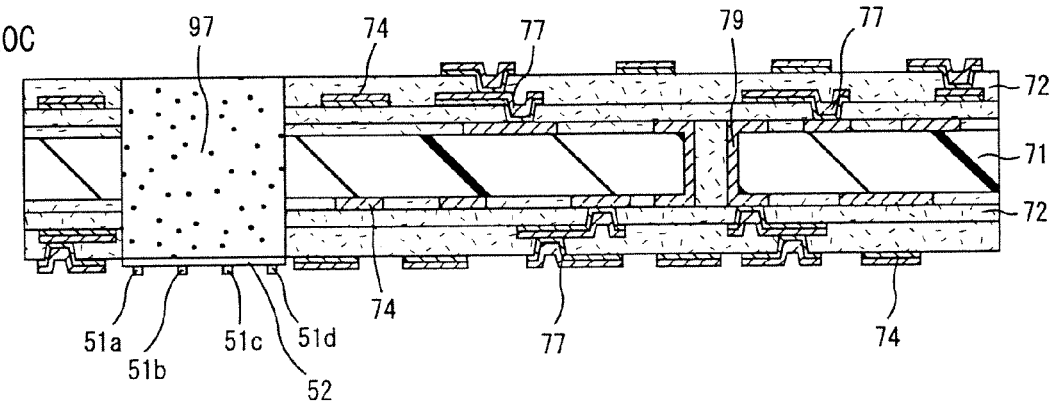

Next, the resin for forming a core was applied onto the lower clad 52 by using a spin coater (1200 μm/10 sec), and then pre-baking at 80° C. for 10 minutes, exposure treatment at 1000 mJ and development treatment through a dipping process using 1% TMH for 2 minutes, and post-baking at 150° C. for 1 hour were carried out to form cores 51*a* to 51*d*, each having a size of 50 μm in width×50 μm in thickness (see FIG. 20C).

Next, the resin for forming a clad was applied thereto by using a spin coater (1000 μm/10 sec), and then pre-baking at 80° C. for 10 minutes, exposure treatment at 2000 mJ, and post-baking at 150° C. for 1 hour were carried out to form an upper clad with a thickness of 50 μm from the core, and thus, an optical waveguide 50 constituted by the cores 51*a* to 51*d* and the clad 52 were prepared.

Thereafter, a dicing process was carried out on both ends of the optical waveguide 50 by using #3000 blade with 90 degrees to form an optical path conversion mirror which converts an optical path to 90 degrees. Here, the transmission loss in the optical path conversion mirror thus formed was 1.2 dB.

Figure 20D:
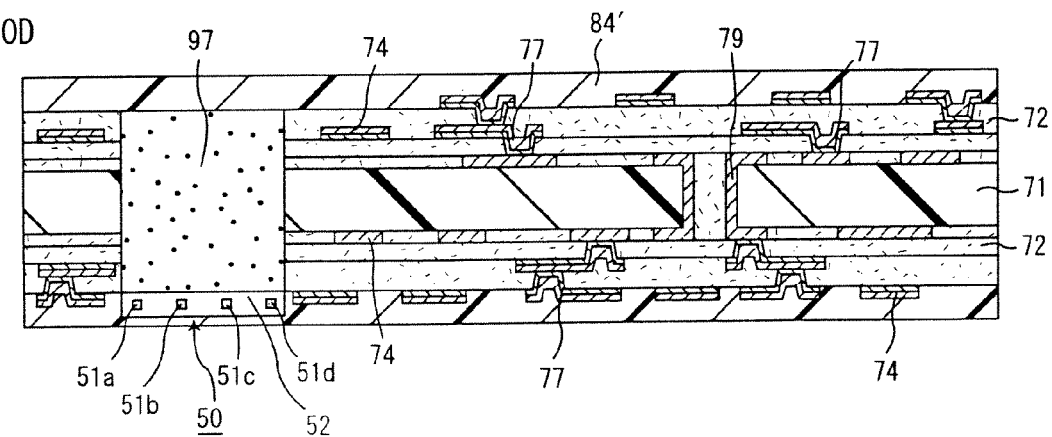

(20) Next, a solder resist composition was prepared in the same manner as the process (19) of Example 1, and the solder resist composition was then applied with a thickness of 30 μm to each of both surfaces of the substrate, and then drying treatment at 70° C. for 20 minutes and at 70° C. for 30 minutes was carried out, such that a layer 84' of the solder resist composition was formed (see FIG. 20D)

(21) After that, a 5 mm-thick photomask having patterns of openings for forming solder bumps and openings for optical paths drawn thereon, was made in close contact with the layer 84' of the solder resist composition on the opposite side from the side on which the optical waveguide 50 was formed, an exposure with ultraviolet rays at 1000 mJ/cm$^2$ and a development with DMTG solution were carried out to form openings 99 for forming solder bumps and openings 81*b* for optical paths.

Figure 21A:
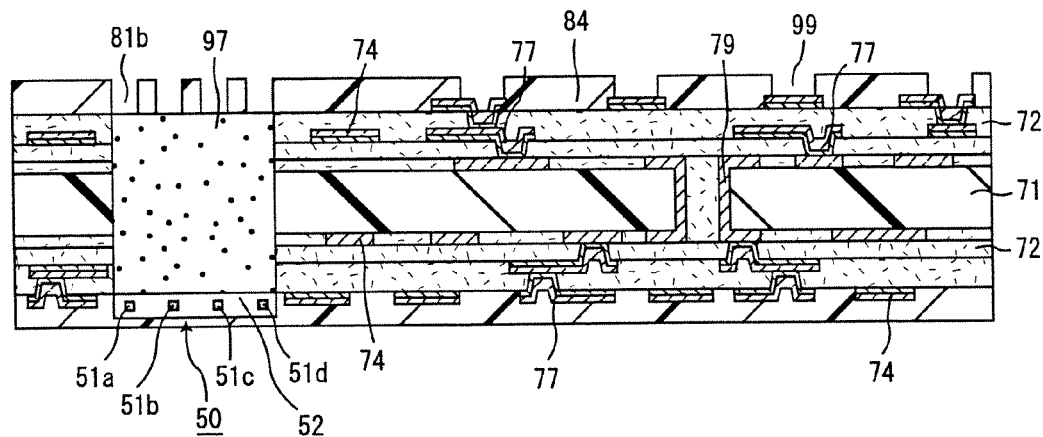
FIG. 21 is a cross-sectional view that schematically shows a part of the method for manufacturing a substrate for motherboard which constitutes a device for optical communication according to one embodiment of the present invention.

Further, the layer of the solder resist composition was cured by heating treatment under conditions at 80° C. for one hour, at 100° C. for one hour, at 120° C. for one hour and at 150° C. for 3 hours so that a solder resist layer 84 with a thickness of 20 μm having openings 99 for forming solder bumps and opening 81*b* for optical paths was formed (see FIG. 21A).

(22) Next, on the substrate with the solder resist layer 34 formed thereon, solder pads 86 were formed by using the same processes as those in the process (22) of Example 1.

(23) Next, by using an inkjet apparatus through the following method, microlenses 96*a* to 96*d* were arranged on an end portion of the resin composite layer 97, on the opposite side from the side on which the optical waveguide is to be formed, in the optical signal passing region 92.

In other words, after adjusting an UV (ultraviolet) curing epoxy-based resin (transmittance: 94%/mm, refractive index after setting: 1.53) to have a viscosity of 20 cps at room temperature (25° C.), this resin was adjusted to have a viscosity of 8 cps at a temperature of 40° C. in the resin container of the inkjet apparatus, and the resin was applied to predetermined positions on the end portion of the resin composition layer 47 so as to have a hemisphere shape with a diameter of 220 μm and a sag height of 10 μm, and this was irradiated with UV light (500 mW/min), such that the resin was cured to provide the microlenses 96*a* to 96*d*.

Figure 21B:
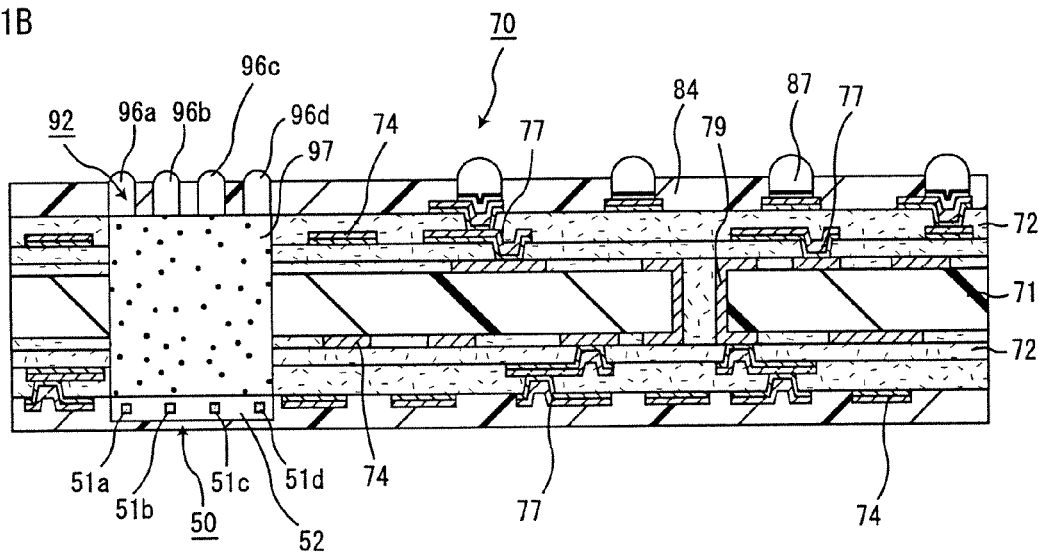

(24) Next, solder paste was printed on the openings 99 for forming solder bumps formed in the solder resist layer 84, such that solder bumps 87 were formed; thus, a substrate for a motherboard was obtained (see FIG. 21B).

D. Manufacture of Device for Optical Communication

An IC chip was mounted on each of the package substrates which were manufactured in Examples 1 and 8, and furthermore, the IC chip was sealed with a resin and after that, this package substrate was placed in a predetermined location so as to face the substrate for a motherboard manufactured in the above-described process C, and then, reflow was carried out at 200° C., and thereby, the solder bumps on the two substrates were connected to each other so that solder connection portions were formed.

Subsequently, 60% by weight of pulverized silica having a particle size distribution from 0.1 μm to 0.8 μm was added to an epoxy based resin (transmittance: 90%/mm, CTE: 73 ppm) so that a resin for an underfill having a transmittance of 80%/mm, a CTE of 30 ppm and a viscosity of 50 cps was prepared, and after that, this resin for an underfill was applied to the surroundings around the package substrate and left to penetrate into the gap (300 μm) between the package substrate and the solder resist layer, and furthermore, this resin for an underfill was hardened under the conditions of 120° C. for one hour and 150° C. for two hours, and thereby, an underfill was formed.

The refractive index of the underfill thus formed was 1.5.

A device for optical communication was obtained through the above-described processes.

Comparative Example 7

A device for optical communication was manufactured in the same manner as Example 15, except that a package substrate manufactured in Comparative Examples 1 and 4 was mounted in the process corresponding to the process D of Example 15.

The evaluation of whether or not the devices for optical communication according to Example 15 and Comparative Example 7 could normally transmit an optical signal was performed in the same manner as in the above-mentioned evaluation of the optical transmission.

The results showed that the device for optical communication according to Example 15 could transmit 2.5 Gbps, whereas the device for optical communication according to Comparative Example 7 sometimes could not detect an optical signal, and the detected noise was larger than that of the device for optical communication of Example 15.

The same results was obtained in the case of transmission of 1.25 Gbps.

What is claimed as new and desired to be secured by Letters Patent of the United States is:

1. A package substrate comprising:
    a substrate;
    a plurality of interlayer resin insulating layers formed over said substrate;
    a plurality of conductor circuits formed over said substrate, the plurality of conductor circuits being interposed between said substrate and one of the plurality of interlayer resin insulating layers or interposed between two of the plurality of interlayer resin insulating layers;
    an optical path configured to transmit an optical signal, the optical path being formed so as to penetrate through the substrate, through the interlayer resin insulting layers and through layers having the conductor circuits thereon;
    an optical element having p-side external power electrode and an n-side external power electrode, which couple power to the optical element to cause the optical element to operate, the optical element being coupled to the substrate and said optical path of said substrate, the optical element being coupled to the substrate via an underfill filling a gap under said optical element, said underfill having a transmittance for light having a wavelength for communication, of about 70%/mm or more;
    a microlens coupled to said optical path and configured to transmit an optical signal at a side of the package substrate opposite to the side on which the optical element is mounted; and
    an optical element driving device coupled to the substrate and configured to drive said optical element for transmission of the optical signal through said optical path,
    wherein said optical element and said optical element driving device are mounted on a same side of the package substrate and said p-side external power electrode and said n-side external power electrode are each connected to the optical driving element through respective linear conductor circuits each formed of a linear line on a same planar surface of the package substrate and having substantially a same length.

2. The package substrate according to claim 1, wherein said optical element is a multi-channel optical element comprising a plurality of unit elements each comprising a p-side electrode and an n-side electrode.

3. The package substrate according to claim 1, wherein said optical path has a collective through hole structure or an individual through hole structure.

4. The package substrate according to claim 1, wherein said optical path is formed of an opening formed in said substrate.

5. The package substrate according to claim 1, wherein at least a portion of said optical path is formed of a resin composite.

6. The package substrate according to claim 1, wherein said optical path has a transmittance for light having a wavelength for communication of about 70%/mm or more.

7. The package substrate according to claim 3, wherein said optical path has a collective through hole structure, and a planar shape of the optical path is an almost rectangle or an almost ellipse, and the planar shape having a size of at least about 100 μm and at most about 5 mm with respect to each of the length and width thereof.

8. The package substrate according to claim 3, wherein said optical path has the individual through hole structure, and a planar shape of the optical path is an almost circle with a diameter of at least about 100 μm and at most about 500 μm.

9. The package substrate according to claim 3, wherein said optical element is a multi-channel optical element having a plurality of unit elements at a pitch between respective channels of 250 μm, said optical path has the individual through hole structure, and a diameter of the optical path is at least about 150 μm and at most about 200 μm.

10. The package substrate according to claim 3, wherein said optical element is a multi-channel optical element having a plurality of unit elements at a pitch between respective channels of 500 μm, said optical path has the individual through hole structure, and a diameter of the optical path is at least about 150 μm and at most about 450 μm.

11. The package substrate according to claim 1, further comprising a plurality of solder bumps positioned to be connected to a motherboard.

12. The package substrate according to claim 1, wherein said underfill has an refractive index of at least about 1.4 and at most about 1.6.

13. The package substrate according to claim 1, wherein said microlens has a transmittance for light having a wavelength for communication of about 70%/mm or more.

14. The package substrate according to claim 1, wherein said optical element is mounted to said substrate via an underfill filling a gap between said optical element and said substrate, and said microlens has an refractive index higher than a refractive index of said underfill.

15. The package substrate according to claim 1, wherein said microlens is provided to said optical path directly or by interposing an optical adhesive layer.

16. A device for optical communication comprising:
a motherboard substrate comprising:
   a substrate having a mother board conductor circuit formed on at least one side thereof, and
   an optical waveguide formed on the substrate, said motherboard substrate having an optical path configured to transmit an optical signal; and
a package substrate comprising:
   another substrate,
   a plurality of interlayer resin insulating layers formed over said another substrate,
   a plurality of conductor circuits formed over said another substrate, the plurality of conductor circuits being interposed between said another substrate and one of the plurality of interlayer resin insulating layers or interposed between two of the plurality of interlayer resin insulating layers,
   another optical path provided on the another substrate and configured to transmit an optical signal the another optical path being formed so as to penetrate through the another substrate, through the interlayer resin insulting layers and through layers having the conductor circuits thereon;
an optical element having p-side external power electrode and an n-side external power electrode, which couple power to the optical element to cause the optical element to operate, the optical element being coupled to the package substrate and to said another optical path, the optical element being coupled to the another substrate via an underfill filling a gap under said optical element, and said package substrate being coupled to the motherboard substrate via another underfill filling a gap under the package substrate, said underfills each having a transmittance for light having a wavelength for communication, of about 70%/mm or more;
a microlens coupled to said another optical path and configured to transmit an optical signal at the side of the package substrate opposite to the side on which the optical element is mounted; and
an optical element driving device coupled to said package substrate and configured to drive said optical element for transmission of the optical signal through said another optical path,
wherein, said optical element and said optical element driving device are mounted on a same side of the package substrate and said p-side external power electrode and said n-side external power electrode are each connected to the optical driving element through respective linear conductor circuits each formed of a linear line on a same planar surface of the package substrate and having substantially a same length.

17. The device for optical communication according to claim 16, wherein said optical path has a collective through hole structure or an individual through hole structure.

18. The device for optical communication according to claim 16, wherein said optical path is formed of an opening.

19. The device for optical communication according to claim 16, wherein at least a portion of said optical path is formed of a resin composite.

20. The device for optical communication according to claim 16, wherein said optical path has a transmittance for light having a wavelength for communication of about 70%/mm or more.

21. The device for optical communication according to claim 16, wherein said optical element is a multi-channel optical element.

22. The device for optical communication according to claim 16, wherein said underfill has an refractive index of at least about 1.4 and at most about 1.6.

23. The device for optical communication according to claim 16, wherein said microlens has a transmittance for light having a wavelength for communication of about 70%/mm or more.

24. The device for optical communication according to claim 16, wherein said microlens is provided to said optical path directly or by interposing an optical adhesive layer.

25. The device for optical communication according to claim 16, wherein said optical waveguide is a multimode optical waveguide comprising an acryl resin, an epoxy resin or an ultraviolet curing resin.

26. The device for optical communication according to claim 16, wherein said optical waveguide is a multimode optical waveguide having a core portion and a clad portion, and a thickness and a width of said core portion are set to at least about 20 µm and at most about 80 µm.

27. The device for optical communication according to claim 16, wherein said optical waveguide comprises particles mixed therein.

28. The device for optical communication according to claim 27, wherein said particles comprise silica, titania, or alumina.

29. The device for optical communication according to claim 27, wherein a particle diameter of said particles is at least about 0.01 µm and at most about 0.8 µm.

30. The device for optical communication according to claim 27, wherein an amount of the particles is at least about 10% by weight and at most about 80% by weight.

31. The device for optical communication according to claim 16, wherein said optical waveguide has a core portion and a clad portion, and particles are mixed only in said clad portion.

32. The device for optical communication according to claim 16, wherein said optical waveguide has an optical path conversion mirror formed therein.

33. The device for optical communication according to claim 16, wherein said motherboard substrate has a plurality of interlayer resin insulating layers laminated on said substrate of said motherboard substrate, and said optical waveguide is formed on said substrate, between said interlayer resin insulating layers, or on an outermost layer of said interlayer resin insulating layers.

* * * * *